United States Patent
Nagata

(10) Patent No.: US 10,199,484 B2
(45) Date of Patent: *Feb. 5, 2019

(54) SEMICONDUCTOR DEVICE AND MANUFACTURING METHOD THEREOF

(71) Applicant: Renesas Electronics Corporation, Koutou-ku, Tokyo (JP)

(72) Inventor: Nao Nagata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/411,268

(22) Filed: Jan. 20, 2017

(65) Prior Publication Data

US 2017/0133483 A1 May 11, 2017

Related U.S. Application Data

(62) Division of application No. 15/005,195, filed on Jan. 25, 2016, now Pat. No. 9,818,851.

(30) Foreign Application Priority Data

Mar. 25, 2015 (JP) .................................. 2015-063339

(51) Int. Cl.
   *H01L 29/06* (2006.01)
   *H01L 21/768* (2006.01)
   (Continued)

(52) U.S. Cl.
   CPC .... *H01L 29/7397* (2013.01); *H01L 21/76895* (2013.01); *H01L 23/535* (2013.01);
   (Continued)

(58) Field of Classification Search
   None
   See application file for complete search history.

(56) References Cited

U.S. PATENT DOCUMENTS 7,633,122 B2   12/2009 Otsuki
8,633,510 B2    1/2014 Matsuura et al.
(Continued)

FOREIGN PATENT DOCUMENTS

EP    2613356 A2    7/2013
JP   2003-142689 A  5/2003
(Continued)

OTHER PUBLICATIONS

Extended European search report for European Patent Application No. 16150746.2, dated Jul. 7, 2016.
(Continued)

*Primary Examiner* — Shaun M Campbell
(74) *Attorney, Agent, or Firm* — Shapiro, Gabor and Rosenberger, PLLC

(57) ABSTRACT

An improvement is achieved in the performance of a semiconductor device. The semiconductor device includes a first trench gate electrode and second and third trench gate electrodes located on both sides of the first trench gate electrode interposed therebetween. In each of a semiconductor layer located between the first and second trench gate electrodes and the semiconductor layer located between the first and third trench gate electrodes, a plurality of $p^+$-type semiconductor regions are formed. The $p^+$-type semiconductor regions are arranged along the extending direction of the first trench gate electrode in plan view to be spaced apart from each other.

11 Claims, 57 Drawing Sheets

(51) Int. Cl.

| | | |
|---|---|---|
| *H01L 23/535* | (2006.01) | |
| *H01L 27/082* | (2006.01) | |
| *H01L 29/739* | (2006.01) | |
| *H01L 29/40* | (2006.01) | |
| *H01L 29/66* | (2006.01) | |
| *H01L 29/10* | (2006.01) | |
| *H01L 29/08* | (2006.01) | |
| *H01L 29/36* | (2006.01) | |
| *H01L 29/423* | (2006.01) | |

(52) U.S. Cl.
CPC ...... *H01L 27/0823* (2013.01); *H01L 29/0619* (2013.01); *H01L 29/0696* (2013.01); *H01L 29/0804* (2013.01); *H01L 29/0821* (2013.01); *H01L 29/1095* (2013.01); *H01L 29/36* (2013.01); *H01L 29/407* (2013.01); *H01L 29/4236* (2013.01); *H01L 29/66348* (2013.01)

(56) References Cited

U.S. PATENT DOCUMENTS

| | | | |
|---|---|---|---|
| 9,041,050 | B2 | 5/2015 | Matsuura |
| 9,818,851 | B2 * | 11/2017 | Nagata ................ H01L 29/7397 |
| 2010/0193836 | A1 | 8/2010 | Okuno et al. |
| 2011/0018029 | A1 | 1/2011 | Pfirsch et al. |
| 2011/0233684 | A1 | 9/2011 | Matsushita |
| 2013/0001638 | A1 | 1/2013 | Yoshikawa |
| 2013/0175574 | A1 * | 7/2013 | Matsuura .......... H01L 29/66348 257/139 |
| 2017/0012551 | A1 * | 1/2017 | Kondo .................. H02M 5/458 |
| 2017/0054010 | A1 * | 2/2017 | Matsuura ............ H01L 29/7397 |
| 2017/0092750 | A1 * | 3/2017 | Nagata .................. H01L 21/761 |
| 2018/0053838 | A1 * | 2/2018 | Matsuura ............ H01L 29/0696 |
| 2018/0069109 | A1 * | 3/2018 | Nagata .................. H02M 7/537 |
| 2018/0083130 | A1 * | 3/2018 | Matsuura ............ H01L 29/0696 |

FOREIGN PATENT DOCUMENTS

| | | |
|---|---|---|
| JP | 2006-210547 A | 8/2006 |
| JP | 2012-256839 A | 12/2012 |
| JP | 2013-140885 A | 7/2013 |

OTHER PUBLICATIONS

Office Action, dated Sep. 11, 2018, in Japanese Patent Application No. 2015-063339.

* cited by examiner

CHARGE QUANTITY PER UNIT AREA Qg (a.u.)

CHARGE QUANTITY PER UNIT AREA Qg (a.u.)

SEMICONDUCTOR DEVICE AND MANUFACTURING METHOD THEREOF

CROSS-REFERENCE TO RELATED APPLICATIONS

The disclosure of Japanese Patent Application No. 2015-063339 filed on Mar. 25, 2015 including the specification, drawings and abstract is incorporated herein by reference in its entirety.

BACKGROUND

The present invention relates to a semiconductor device, which can be used appropriately as, e.g., a semiconductor device including an insulated gate bipolar transistor (IGBT).

As an IGBT having a low ON resistance, a trench-gate-type IGBT has been used widely. There has been developed an IE-type IGBT in which, in a cell formation region, active cell regions each coupled to an emitter electrode and inactive cell regions each including a floating region are alternately arranged to allow an IE (Injection Enhancement) effect to be used. The IE effect reduces the likelihood of discharging of holes from the emitter electrode when the IGBT is in an ON state and thus increases the density of the charges stored in a drift region.

Japanese Unexamined Patent Publication No. 2012-256839 (Patent Document 1) discloses a technique in which, in an IE-type trench-gate IGBT, each of linear unit cell regions provided in a cell formation region includes a linear active cell region and linear inactive cell regions provided on both sides of the linear active cell region such that the linear active cell region is interposed therebetween.

Japanese Unexamined Patent Publication No. 2013-140885 (Patent Document 2) discloses a technique in which, in an IE-type trench-gate IGBT, each of linear unit cell regions provided in a cell formation region includes a linear hybrid cell region and, in the linear hybrid cell region, a first linear hybrid sub-cell region and a second linear hybrid sub-cell region are provided.

Japanese Unexamined Patent Publication No. 2006-210547 (Patent Document 3) discloses a technique in which, in an insulated-gate-type semiconductor device, a second semiconductor layer having a second conductivity type and provided over a first semiconductor layer having a first conductivity type, a plurality of striped trenches formed in a top surface of the second semiconductor layer, and a plurality of third semiconductor regions each having the first conductivity type and formed selectively in a longitudinal direction between the trenches are provided.

RELATED ART DOCUMENTS

Patent Documents

[Patent Document 1]
 Japanese Unexamined Patent Publication No. 2012-256839
[Patent Document 2]
 Japanese Unexamined Patent Publication No. 2013-140885
[Patent Document 3]
 Japanese Unexamined Patent Publication No. 2006-210547

SUMMARY

There has been known a semiconductor device including an IGBT having a GG-type (gate-gate-type) active cell region as an IE-type trench-gate IGBT, such as, e.g., the IE-type trench-gate IGBT disclosed in Patent Document 1 mentioned above. There has also been known a semiconductor device including an IGBT having an EGE-type (emitter-gate-emitter-type) active cell region as an IE-type trench gate IGBT, such as, e.g., the IE-type trench-gate IGBT disclosed in Patent Document 2 mentioned above.

In the semiconductor device including the IGBT having the EGE-type active region, in a switching operation when an inductance is coupled as a load, a gate potential is less affected by a displacement current generated in the active cell region than in the semiconductor device including the IGBT having the GG-type active cell region.

However, in the semiconductor device including the IGBT having the EGE-type active cell region, it is desirable to further improve the performance of the semiconductor device such as, e.g., the IE effect.

Other problems and novel features of the present invention will become apparent from a statement in the present specification and the accompanying drawings.

According to an embodiment, a semiconductor device includes a first trench gate electrode and second and third trench gate electrodes located on both sides of the first trench gate electrode interposed therebetween. The first trench gate electrode is coupled to a gate electrode. The second and third trench gate electrodes are coupled to an emitter electrode. In a semiconductor layer between the first and second trench gate electrodes, a plurality of $p^+$-type semiconductor regions are formed. In a semiconductor layer between the first and third trench gate electrodes, a plurality of $p^+$-type semiconductor regions are formed. Either between the first and second trench gate electrodes or between the first and third trench gate electrodes, the plurality of $p^+$-type semiconductor regions are arranged along an extending direction of the first trench gate electrode in plan view to be spaced apart from each other.

According to another embodiment, in a method of manufacturing a semiconductor device, a first trench gate electrode and second and third trench gate electrodes located on both sides of the first trench gate electrode interposed therebetween are formed. The first trench gate electrode is coupled to a gate electrode. The second and third trench gate electrodes are coupled to an emitter electrode. Next, in a semiconductor layer between the first and second trench gate electrodes, a plurality of $p^+$-type semiconductor regions are formed and, in a semiconductor layer between the first and third trench gate electrodes, a plurality of $p^+$-type semiconductor regions are formed. Either between the first and second trench gate electrodes or between the first and third trench gate electrodes, the plurality of $p^+$-type semiconductor regions are arranged along an extending direction of the first trench gate electrode in plan view to be spaced apart from each other.

According to the embodiment, the performance of the semiconductor device can be improved.

BRIEF DESCRIPTION OF THE DRAWINGS

FIG. 30 is an equivalent circuit diagram showing the displacement current paths when the semiconductor device in Comparative Example 1 is turned ON;

FIG. 32 is an equivalent circuit diagram showing the displacement current paths when the semiconductor device in Comparative Example 2 is turned ON;

FIG. 48 is a graph showing a switching waveform when the semiconductor device in Comparative Example 2 is turned ON;

FIG. 49 is a graph showing a switching waveform when the semiconductor device in Comparative Example 2 is turned ON;

FIG. 53 is a graph showing the potential dependence of the hole current density when the semiconductor device in Comparative Example 2 is turned ON;

DETAILED DESCRIPTION

Figure 1:
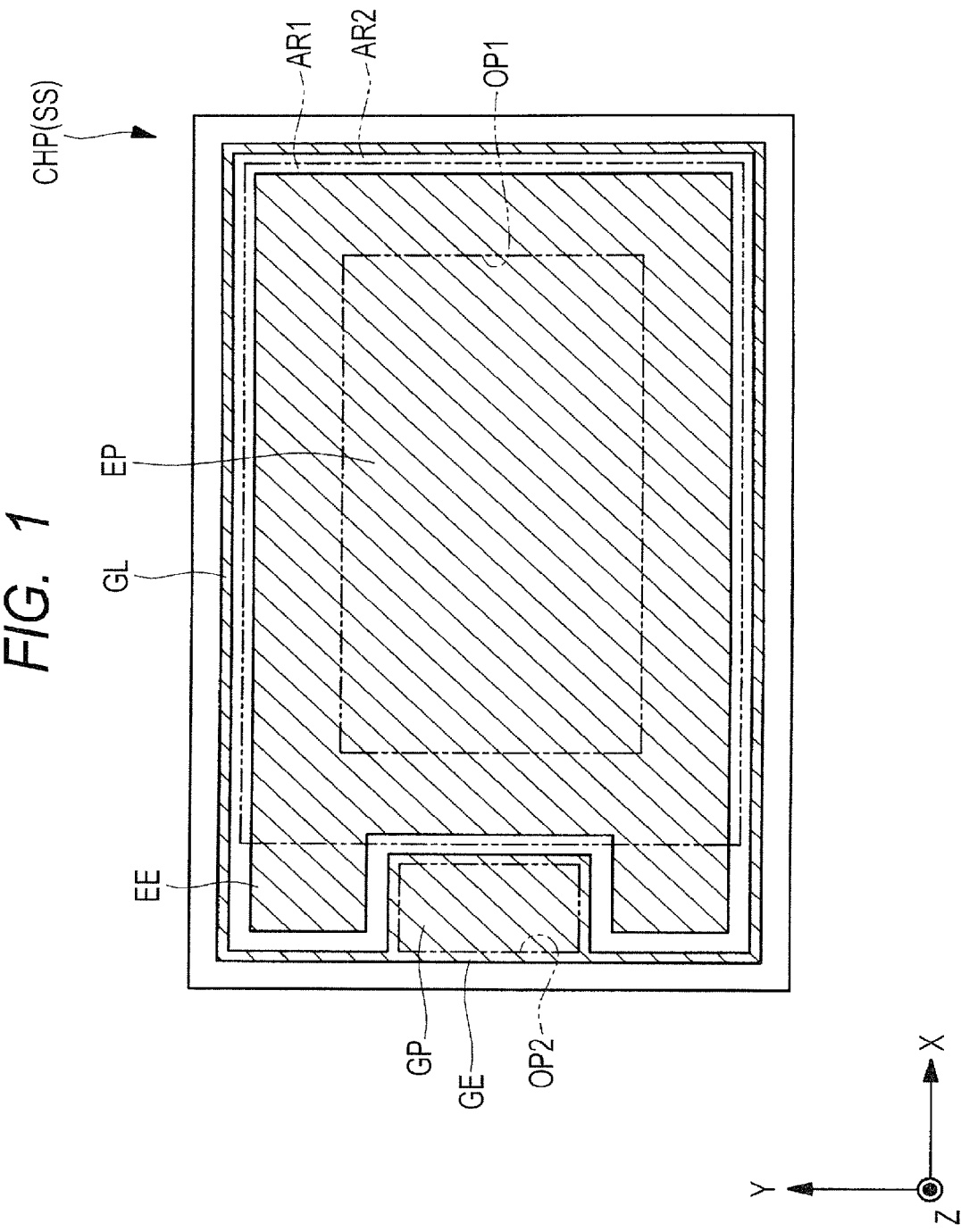
FIG. 1 is a plan view of a semiconductor chip as a semiconductor device in Embodiment 1.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are mentioned, they are not limited to specific numbers unless particularly explicitly described otherwise or unless they are obviously limited to specific numbers in principle. The number and the like of the elements may be not less than or not more than specific numbers.

Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe representative embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

Embodiment 1

A detailed description will be given below of a semiconductor device in Embodiment 1 with reference to the drawings. The semiconductor device in Embodiment 1 includes an IGBT having an EGE-type (emitter-gate-emitter-type) active cell region. Note that the possession of the EGE-type active cell region by the IGBT means that, among three trench gate electrodes arranged in the active cell region to be spaced apart from each other, the trench gate electrode located in the middle is electrically coupled to a gate electrode and each of the two trench gate electrodes located at both ends is electrically coupled to an emitter electrode.

<Configuration of Semiconductor Device>

First, a description will be given of a configuration of a semiconductor chip as the semiconductor device in Embodiment 1.

Figure 2:
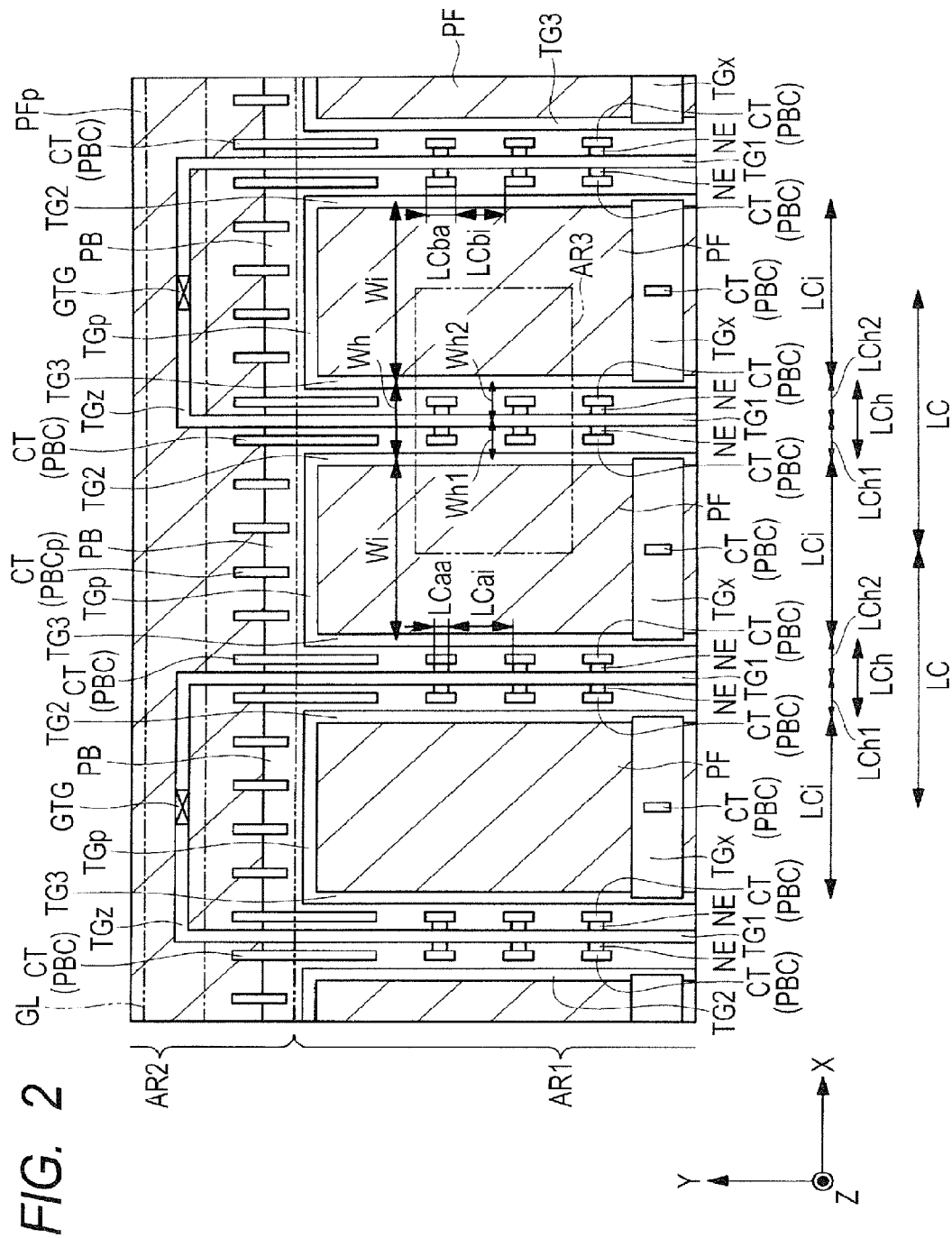
FIG. 2 is a main-portion plan view of the semiconductor device in Embodiment 1.
Figure 3:
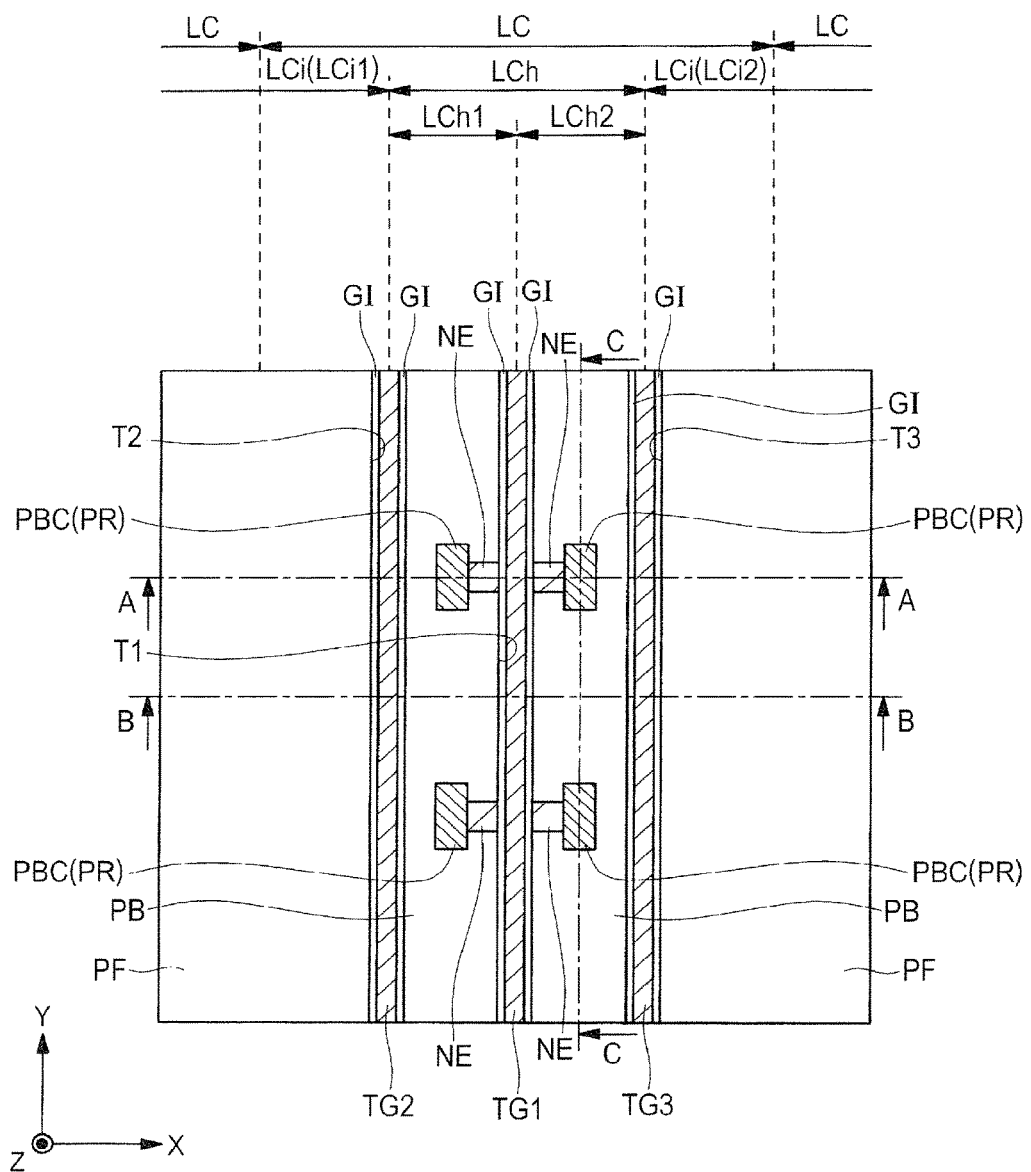
FIG. 3 is a main-portion plan view of the semiconductor device in Embodiment 1.
Figure 4:
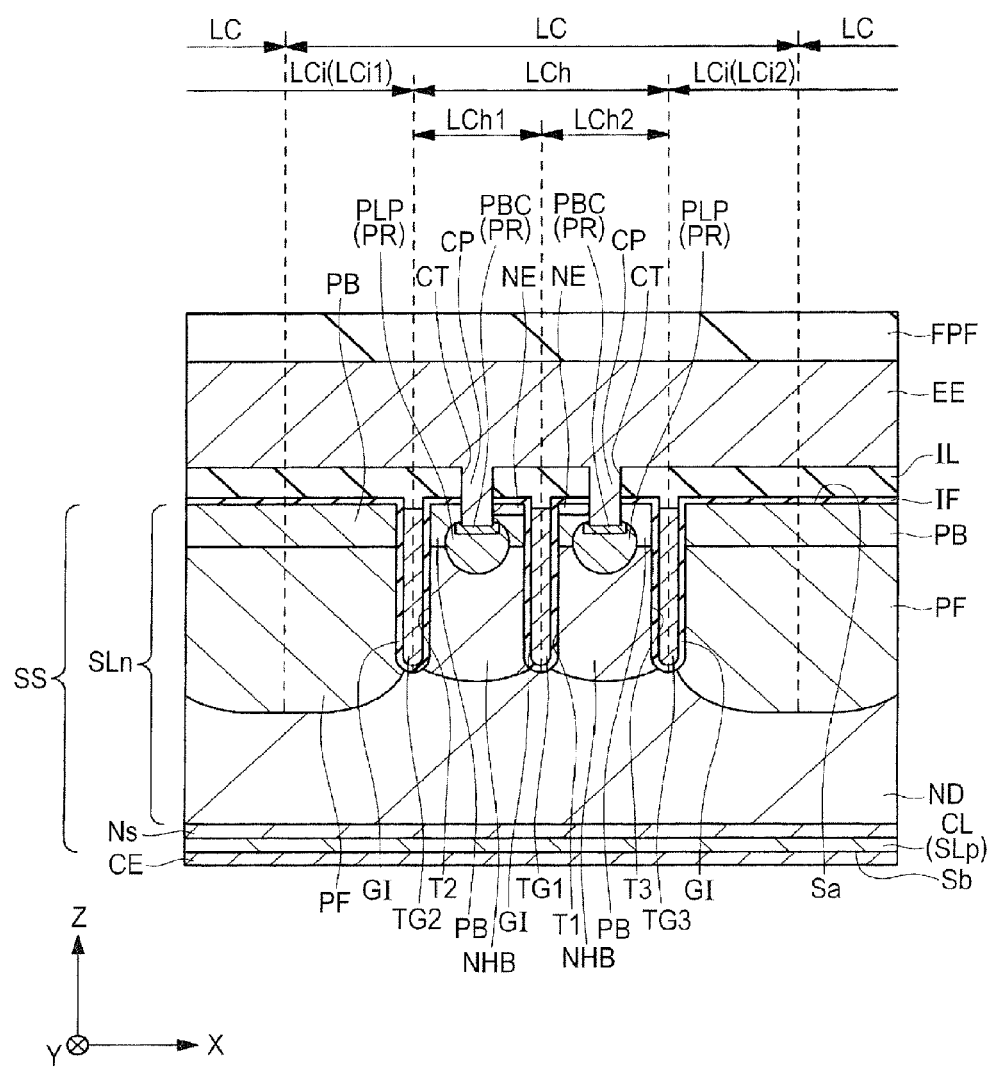
FIG. 4 is a main-portion cross-sectional view of the semiconductor device in Embodiment 1.
Figure 5:
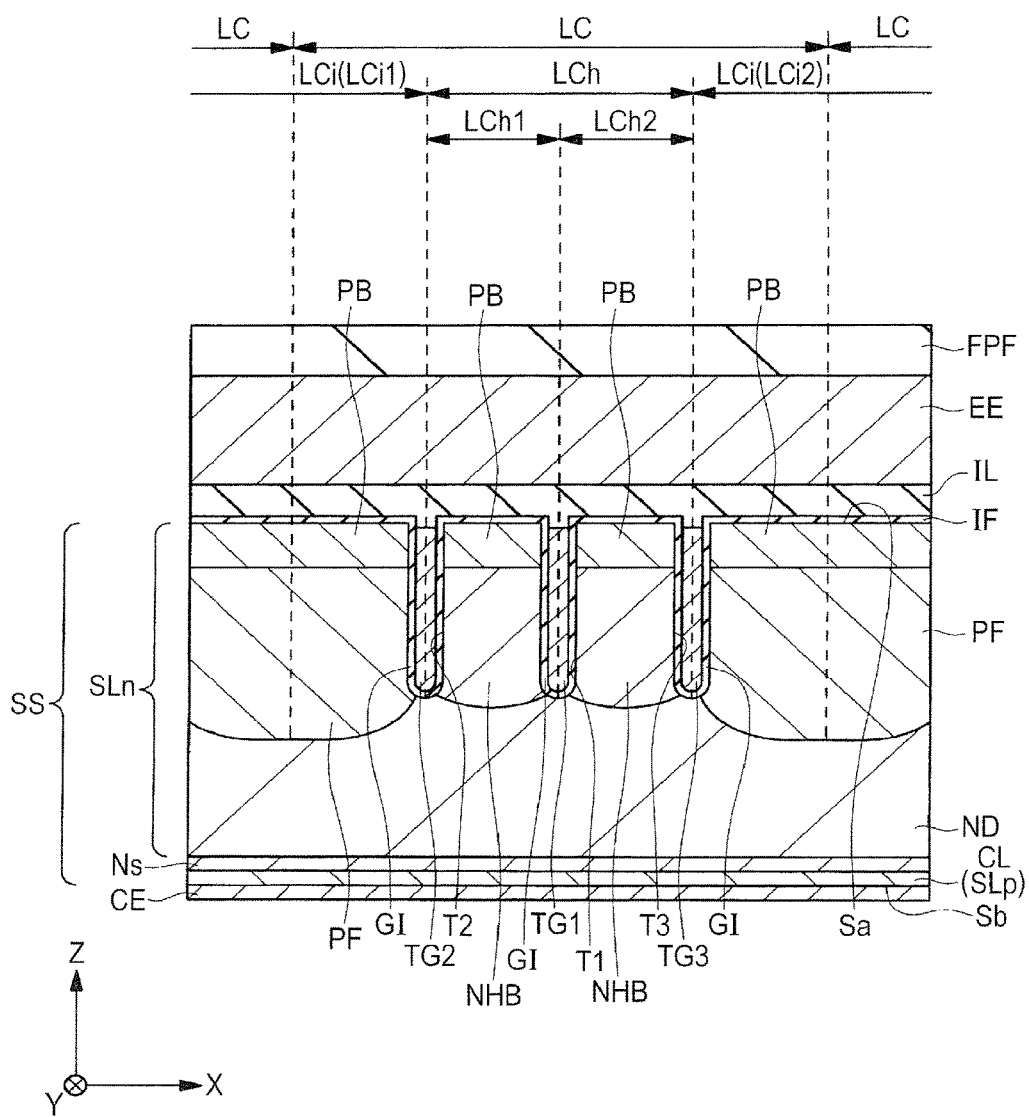
FIG. 5 is a main-portion cross-sectional view of the semiconductor device in Embodiment 1.
Figure 6:
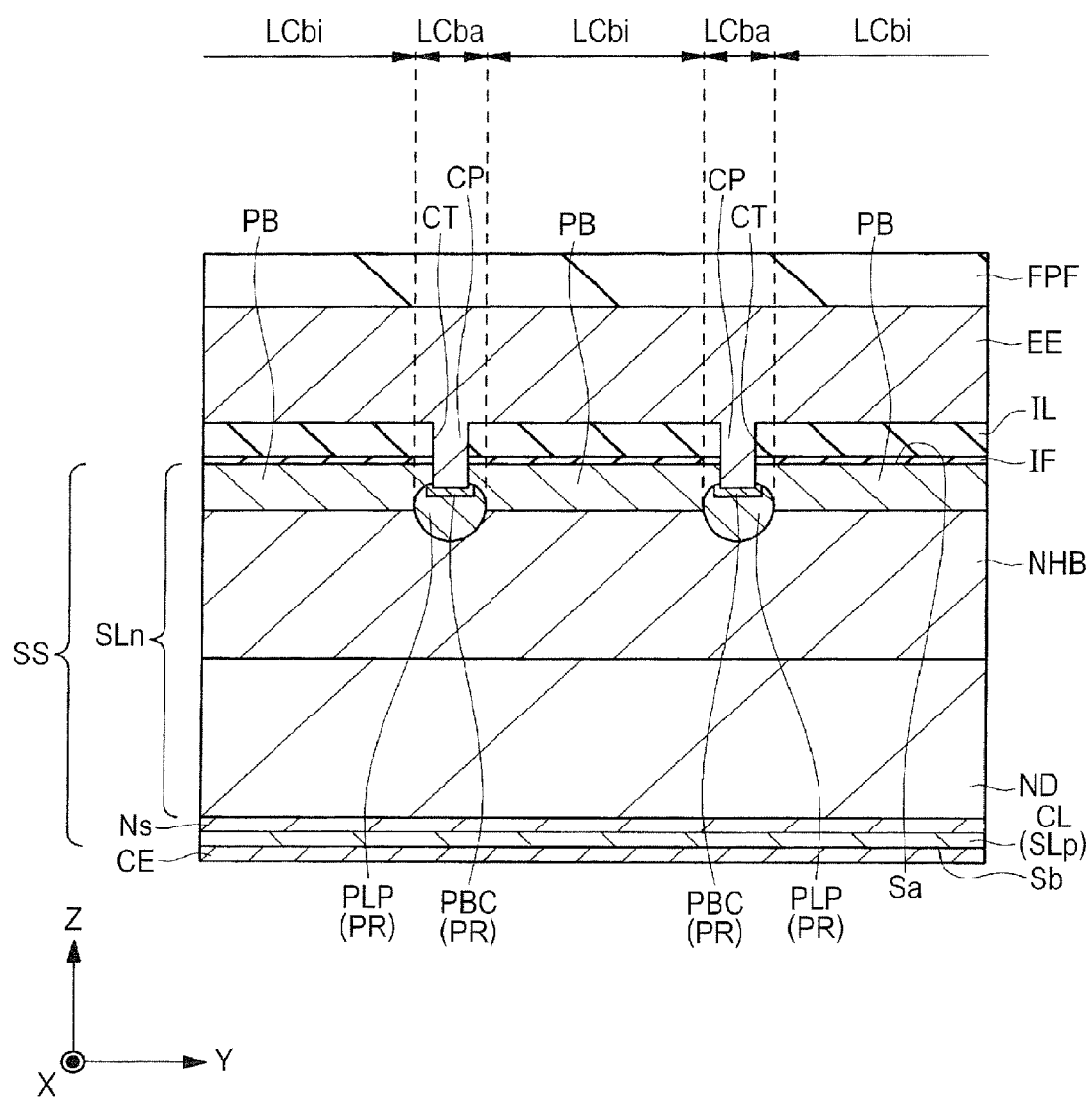
FIG. 6 is a main-portion cross-sectional view of the semiconductor device in Embodiment 1.

FIG. 1 is a plan view of the semiconductor chip as the semiconductor device in Embodiment 1. FIGS. 2 and 3 are main-portion plan views of the semiconductor device in Embodiment 1. FIGS. 4 to 6 are main-portion cross-sectional views of the semiconductor device in Embodiment 1. FIG. 3 shows an area AR3 enclosed by the two-dot-dash line in FIG. 2. FIG. 4 is a cross-sectional view along the line A-A in FIG. 3. FIG. 5 is a cross-sectional view along the line B-B in FIG. 3. FIG. 6 is a cross-sectional view along the line C-C in FIG. 3.

Note that, for easier understanding, FIG. 1 shows the semiconductor device in Embodiment 1 in a see-through state where an insulating film FPF (see FIG. 4) has been removed and shows the respective outer peripheries of a cell formation area AR1, an emitter pad EP, and a gate pad GP by the two-dot-dash lines. Also, for easier understanding, FIG. 2 shows the semiconductor device in Embodiment 1 in a see-through state where the insulating film FPF, a gate wire GL, an emitter electrode EE, an interlayer insulating film IL, and the portion of a p-type body region PB (see FIG. 4) which is formed over a p-type floating region PR have been removed and shows the respective outer peripheries of the cell formation area AR1 and the gate wire GL by the two-dot-dash lines.

As shown in FIG. 1, the semiconductor chip CHP as the semiconductor device in Embodiment 1 has a semiconductor substrate SS. The semiconductor substrate has an upper surface Sa (see FIG. 4) as one main surface and a lower surface Sb (see FIG. 4) as the other main surface opposite to the upper surface. The semiconductor substrate SS also has the cell formation area AR1 as a local area of the upper surface Sa and a gate-wire-lead-out area AR2 as another local area of the upper surface Sa. The gate-wire-lead-out area AR2 is provided closer to, e.g., the outer periphery of the semiconductor substrate SS than the cell formation area AR1.

In the cell formation area AR1, the emitter electrode EE is provided. The center portion of the emitter electrode EE serves as the emitter pad EP to which bonding wires or the like are to be coupled. The emitter pad EP is made of the portion of the emitter electrode EE which is exposed from an opening OP1 formed in the insulating film FPF (see FIG. 4) formed so as to cover the emitter electrode EE. The emitter electrode EE is made of a metal film containing, e.g., aluminum as a main component.

In the gate-wire-lead-out area AR2, the gate wire GL and a gate electrode GE are provided. The gate wire GL is provided closer to, e.g., the outer periphery of the semiconductor substrate SS than the emitter electrode EE. The gate wire GL is coupled to the gate electrode GE. The center portion of the gate electrode GE serves as the gate pad GP to which bonding wires or the like are to be coupled. The gate pad GP is made of the portion of the gate electrode GE which is exposed from an opening OP2 formed in the insulating film FPF (see FIG. 4) formed so as to cover the gate electrode GE. Each of the gate wire GL and the gate electrode GE is made of a metal film containing, e.g., aluminum as a main component.

As shown in FIGS. 1 to 6, two directions crossing each other, or preferably orthogonal to each other in the upper surface of the semiconductor substrate SS are assumed to be an X-axis direction and a Y-axis direction and a direction perpendicular to the upper surface of the semiconductor substrate SS, i.e., vertical direction is assumed to be a Z-axis direction. At this time, in the cell formation area AR1, as shown in FIG. 2, a plurality of unit cell regions LC are provided. In plan view, the plurality of unit cell regions LC extend in the Y-axis direction and are periodically arranged in the X-axis direction.

Note that, in the present specification, the wording "in plan view" means that an object is viewed from a direction perpendicular to the upper surface Sa of the semiconductor substrate SS.

Each of the unit cell regions LC includes a hybrid cell region LCh as an EGE-type active cell region and two inactive cell regions LCi. The two inactive cell regions LCi are located on both sides of the hybrid cell region LCh interposed therebetween in the X-axis direction. Each of the hybrid cell region LCh and the two inactive cell regions LCi extends in the Y-axis direction in plan view. Preferably, the hybrid cell region LCh has a width Wh smaller than a width Wi of each of the inactive cell regions LCi.

The two unit cell regions LC adjacent to each other in the X-axis direction share one of the inactive cell regions LCi. Accordingly, each of the unit cell regions LC has a positive half portion LCi1 of the inactive cell region LCi which is located on the negative side of the hybrid cell region LCh in the X-axis direction to be adjacent thereto. The unit cell region LC also has a negative half portion LCi2 of the inactive cell region LCi which is located on the positive side of the hybrid cell region LCh in the X-axis direction to be adjacent thereto.

The hybrid cell region LCh includes hybrid sub-cell regions LCh1 and LCh2. The hybrid cell region LCh also includes a trench gate electrode TG1 located at a boundary surface between the hybrid sub-cell regions LCh1 and LCh2.

The trench gate electrode TG1 is provided in the middle of the hybrid cell region LCh. This allows a width Wh1 of the hybrid sub-cell region LCh1 and a width Wh2 of the hybrid sub-cell region LCh2 to be equal and allows the hybrid sub-cell regions LCh1 and LCh2 to be arranged symmetrically relative to the trench gate electrode TG1.

The hybrid cell region LCh has trench gate electrodes TG2 and TG3. The trench gate electrode TG2 is located between the hybrid sub-cell region LCh1 and the portion LCi1 of the inactive cell region LCi. The trench gate electrode TG3 is located between the hybrid sub-cell region LCh2 and the portion LCi2 of the inactive cell region LCi. The trench gate electrodes TG2 and TG3 are electrically coupled to the emitter electrode EE.

In the hybrid sub-cell region LCh1, in the portion of the p-type body region PB which is closer to the upper surface Sa of the semiconductor substrate SS, a plurality of $n^+$-type emitter regions NE are formed. The p-type body region PB is a semiconductor region having a p-type conductivity type. The $n^+$-type emitter regions NE are semiconductor regions each having an n-type conductivity type different from the p-type conductivity type. In the hybrid sub-cell region LCh1, the p-type body region PB is formed continuously along the Y-axis direction in plan view. In the hybrid sub-cell region LCh1, the plurality of $n^+$-type emitter regions NE are arranged along the Y-axis direction in plan view to be spaced apart from each other.

Note that, in the present specification, the fact that a semiconductor has the p-type conductivity type means that only holes or both electrons and holes may be charge carriers, the density of the holes is higher than the density of the electrons, and the holes are major charge carriers. Also, in the present specification, the fact that a semiconductor has the n-type conductivity type means that only electrons or both electrons and holes may be charge carriers, the density of the electrons is higher than the density of the holes, and the electrons are major charge carriers.

In the hybrid sub-cell region LCh2, in the portion of the p-type body region BP which is closer to the upper surface Sa of the semiconductor substrate SS, the plurality of $n^+$-type emitter regions NE are provided. In the hybrid sub-cell region LCh2, the p-type body region PB is formed continuously along the Y-axis direction in plan view. In the hybrid sub-cell region LCh2, the plurality of $n^+$-type emitter regions NE are arranged along the Y-axis direction to be spaced apart from each other.

In each of the hybrid sub-cell regions LCh1 and LCh2, regions where the $n^+$-type emitter regions NE are formed along the Y-axis direction, i.e., active sections LCaa and regions (p-type body region PB) where the n$^+$-type emitter regions NE are not formed, i.e., inactive sections LCai are alternately arranged.

In the inactive cell regions LCi, p-type floating regions PF are provided. The end portions of the p-type floating regions PF which are closer to the lower surface Sb are located closer to the lower surface Sb in the Z-axis direction than the end portions of trenches T1, T2, and T3 which are closer to the lower surface Sb. In the trenches T1, T2, and T3, the trench gate electrodes TG1, TG2, and TG3 are respectively formed. In such a case, even when the width Wi of the inactive cell region LCi in the X-axis direction is larger than the width Wh of the hybrid cell region LCh in the X-axis direction, a sufficient breakdown voltage can be ensured.

Note that, in the example shown in FIG. 2, the width Wh of the hybrid cell region LCh in the X-axis direction is set smaller than the width Wi of each of the inactive cell regions LCi in the X-axis direction. In such a case, the IE effect of the IGBT can be enhanced.

The gate-wire-lead-out area AR2 has a portion where, e.g., a p-type floating region PFp is provided so as to surround the cell formation area AR1. The p-type floating region PFp is electrically coupled to the emitter electrode EE via the portion of a p$^+$-type body contact region PBCp which is exposed at the bottom surface of a contact trench CT.

In the gate-wire-lead-out area AR2, the gate wire GL is placed and the trench gate electrode TG1 extends from within the cell formation area AR1 toward the gate wire GL. In the gate-wire-lead-out area AR2, the respective end portions of the adjacent two trench gate electrodes TG1 are coupled to each other by a trench gate electrode TGz. In plan view, the trench gate electrode TGz is located in the region where the gate wire GL is located. The trench gate electrode TGz is electrically coupled to the gate wire GL via a coupling electrode GTG. Note that the end portion of each of the inactive cell regions LCi which is closer to the gate-wire-lead-out area AR2 is defined by an end-portion trench gate electrode TGp.

In plan view, the trench gate electrodes TG2 and TG3 are located on both sides of the inactive cell region LCi interposed therebetween. The trench gate electrode TG3 is electrically coupled to the trench gate electrode TG2 not only by the end-portion trench gate electrode TGp, but also by an emitter coupling portion TGx made of, e.g., a polycrystalline silicon film and formed in the same layer as those of the trench gate electrodes TG2 and TG3. The emitter coupling portion TGx is electrically coupled to the emitter electrode EE via the contact trench CT formed in the emitter coupling portion TGx. By thus providing such a structure, it is possible to improve the reliability of electrical coupling between the trench gate electrodes TG2 and TG3 and the emitter electrode EE.

In Embodiment 1, in the hybrid sub-cell region LCh1, a plurality of p$^+$-type semiconductor regions PR each including a type body contact region PBC and a p$^+$-type latch-up preventing region PLP are provided. In the hybrid sub-cell region LCh1, the plurality of p$^+$-type semiconductor regions PR are formed in the respective portions of a semiconductor layer SLn which are located between the trenches T1 and T2 to be in contact with the p-type body region PB.

In the hybrid sub-cell region LCh1, the plurality of p$^+$-type semiconductor regions PR are arranged along the Y-axis direction in plan view to be spaced apart from each other. This can reduce the ON voltage of the semiconductor chip CHP and reduce a switching loss when an IGBT in which an inductor having an inductance L is coupled as a load to a collector electrode or an emitter electrode is subjected to switching (hereinafter referred to also as "L-load switching") to be turned ON.

Note that, in the present specification, a switching operation in which the IGBT shifts from an OFF state to an ON state is referred to as "turn-ON" and a switching operation in which the IGBT shifts from the ON state to the OFF state is referred to as "turn-OFF".

Also, in the hybrid sub-cell region LCh1, in the p-type body region PB, the plurality of contact trenches CT as openings are formed in the p-type body region PB. The plurality of contact trenches CT are arranged along the Y-axis direction to be spaced apart from each other in plan view. The plurality of contact trenches CT reach the p$^+$-type body contact region PBC located in the hybrid sub-cell region LCh1.

Also, in Embodiment 1, in the hybrid sub-cell region LCh2, the plurality of p$^+$-type body contact regions PR each including the p$^+$-type body contact region PBC and the p$^+$-type latch-up preventing region PLP are provided. In the hybrid sub-cell region LCh2, the plurality of p$^+$-type semiconductor regions PR are formed in the respective portions of the semiconductor layer SLn which are located between the trenches T1 and T3 to be in contact with the p-type body region PB.

In the hybrid sub-cell region LCh2, the plurality of p$^+$-type semiconductor regions PR are arranged along the Y-axis direction in plan view to be spaced apart from each other. This can reduce the ON voltage of the semiconductor chip CHP and reduce the switching loss when the semiconductor chip CHP is turned ON by the L-load switching.

Also, in the hybrid sub-cell region LCh2, in the p-type body region PB, the plurality of contact trenches CT as openings are formed. The plurality of contact trenches CT are arranged along the Y-axis direction in plan view to be spaced apart from each other. Each of the plurality of contact trenches CT reaches the p$^+$-type body contact region PBC located in the hybrid sub-cell region LCh2.

As shown in FIGS. 2 and 6, in each of the hybrid sub-cell regions LCh1 and LCh2, the regions where the p$^+$-type semiconductor regions PR are formed, i.e., active sections LCba and the regions where the p$^+$-type semiconductor regions PR are not formed, i.e., inactive sections LCbi are alternately arranged.

In Embodiment 1, in the hybrid sub-cell region LCh1, the plurality of n$^+$-type emitter regions NE are preferably located at the same positions as those of the plurality of p$^+$-type semiconductor regions PR in the Y-axis direction. Also, in Embodiment 1, in the hybrid sub-cell region LCh2, the plurality of n$^+$-type emitter regions NE are located at the same positions as those of the plurality of p$^+$-type semiconductor regions PR in the Y-axis direction.

Next, a description will be given of a configuration of the unit cell regions LC in the semiconductor chip as the semiconductor device in Embodiment 1. Specifically, using FIGS. 4 to 6, the description will be given of cross-sectional structures along the lines A-A, B-B, and C-C in FIG. 3.

As shown in FIGS. 4 to 6, the semiconductor substrate SS has the upper surface Sa as the first main surface and the lower surface Sb as the second main surface opposite to the upper surface Sa. In the semiconductor substrate SS, the n-type semiconductor layer SLn is formed. In the portion of the semiconductor substrate SS which is located closer to the lower surface Sb than the semiconductor layer SLn, a semiconductor layer SLp is formed.

In the portion of the semiconductor layer SLn other than the upper-layer portion thereof, an n$^-$-type drift region ND is formed as an n-type semiconductor region. Between the semiconductor layers SLn and SLp, an n-type field stop region Ns is formed as an n-type semiconductor region. The semiconductor layer SLp forms a p$^+$-type collector region CL as a p-type semiconductor region. Over the lower surface Sb of the semiconductor substrate SS, the collector electrode CE electrically coupled to the p$^+$-type collector region CL, i.e., the semiconductor layer SLp is formed.

On the other hand, in the cell formation area AR1, the p-type body region PB is provided closer to the upper surface Sa of the semiconductor substrate SS, i.e., in the upper-layer portion of the semiconductor layer SLn.

In the upper surface Sa of the semiconductor substrate SS at the boundary portion between the hybrid sub-cell regions LCh1 and LCh2, the trench T1 is formed as a trench portion. The trench T1 extends in the Y-axis direction from the upper surface Sa in plan view to reach a middle point in the semiconductor layer SLn.

Over the inner wall of the trench T1, the gate insulating film GI is formed. In the trench T1, the trench gate electrode TG1 is formed over the gate insulating film GI so as to be embedded in the trench T1. The trench gate electrode TG1 is electrically coupled to the gate electrode GE (see FIG. 1). Note that the trench gate electrode TG1 is formed continuously along the Y-axis direction in plan view.

On the other hand, in the upper surface Sa of the semiconductor substrate SS in the boundary portion between the hybrid cell region LCh and the inactive cell region LCi, the trenches T2 and T3 each as the trench portion are formed. Each of the trenches T2 and T3 extends from the upper surface Sa to reach a middle point in the semiconductor layer SLn. The trenches T2 and T3 are located on both sides of the trench T1 interposed therebetween to extend in the Y-axis direction in plan view.

Over the inner wall of each of the trenches T2 and T3, the gate insulating film GI is formed. In the trench T2, the trench gate electrode TG2 is formed over the gate insulating film GI so as to be embedded in the trench T2. In the trench T3, the trench gate electrode TG3 is formed over the gate insulating film GI so as to be embedded in the trench T3. The trench gate electrodes TG2 and TG3 are electrically coupled to the emitter electrode EE. Note that, each of the trench gate electrodes TG2 and TG3 is formed continuously along the Y-axis direction in plan view.

In the hybrid sub-cell region LCh1, the p-type body region PB is formed in the portion of the semiconductor layer SLn which is located between the trenches T1 and T2 to be in contact with the gate insulating film GI formed over the inner wall of the trench T1 and with the gate insulating film GI formed over the inner wall of the trench T2. In the hybrid sub-cell region LCh2, the p-type body region PB is formed in the portion of the semiconductor layer SLn which is located between the trenches T1 and T3 to be in contact with the gate insulating film GI formed over the inner wall of the trench T1 and with the gate insulating film GI formed over the inner wall of the trench T3.

As shown in FIG. 4, in the cross section along the line A-A in FIG. 3, in each of the hybrid-sub-cell regions LCh1 and LCh2, the n$^+$-type emitter region NE is formed only in the portion of the upper surface Sa of the semiconductor substrate SS which is closer to the trench gate electrode TG1. On the other hand, as shown in FIG. 5, in the cross section along the line B-B, in each of the hybrid sub-cell formation regions LCh1 and LCh2, the n$^+$-type emitter region NE is not formed in the upper surface Sa of the semiconductor substrate SS.

As described above, in the hybrid sub-cell region LCH1, the plurality of n'-type emitter regions NE are arranged along the Y-axis direction in plan view to be spaced apart from each other. In the hybrid sub-cell region LCh2, the plurality of n$^+$-type emitter regions NE are arranged along the Y-axis direction in plan view to be spaced apart from each other.

As shown in FIG. 4, in the cross section along the line A-A in FIG. 3, in the hybrid sub-cell region LCh1, the n$^+$-type emitter region NE is formed in the portion of the semiconductor layer SLn which is located between the trenches T1 and T2 to be in contact with the p-type body region PB and with the gate insulating film GI formed over the inner wall of the trench T1. On the other hand, in the hybrid sub-cell region LCh2, the n$^+$-type emitter region NE is formed in the portion of the semiconductor layer SLn which is located between the trenches T1 and T3 to be in contact with the p-type body region PB and with the gate insulating film GI formed over the inner wall of the trench T1.

The plurality of n$^+$-type emitter regions NE formed in the hybrid sub-cell region LCh1 are electrically coupled to the emitter electrode EE. The plurality of n$^+$-type emitter regions NE formed in the hybrid sub-cell region LCh2 are electrically coupled to the emitter electrode EE.

Preferably, in each of the hybrid sub-cell regions LCh1 and LCh2, under the p-type body region PB, an n-type hole barrier region NHB as an n-type semiconductor region is formed. In each of the hybrid sub-cell regions CLh1 and LCh2, the n-type impurity concentration in the n-type hole barrier region NHB is higher than the n-type impurity concentration in the portion of the semiconductor layer SLn (n-type drift region ND) which is located closer to the lower surface Sb than the n-type hole barrier region NHB and lower than the n-type impurity concentration in the type emitter region NE.

In the hybrid sub-cell region LCh1, the n-type hole barrier region NHB is formed in the portion of the semiconductor layer SLn which is located between the trenches T1 and T2. In the hybrid sub-cell region LCh2, the n-type hole barrier region NHB is formed in the portion of the semiconductor layer SLn which is located between the trenches T1 and T3.

Note that, in the hybrid sub-cell region LCh1, the n-type hole barrier region NHB may be in contact with the p-type body region PB, the gate insulating film GI formed over the inner wall of the trench T1, and the gate insulating film GI formed over the inner wall of the trench T2. Also, in the hybrid sub-cell region LCh2, the n-type hole barrier region NHB may be in contact with the p-type body region PB, the gate insulating film GI formed over the inner wall of the trench T1, and the gate insulating film GI formed over the inner wall of the trench T3. As a result, the holes stored in the n$^-$-type drift region ND are less likely to be discharged into the emitter electrode EE in each of the hybrid sub-cell regions LCh1 and LCh2. Therefore, an IE effect can be enhanced.

In each of the inactive cell regions LCi, the p-type floating region PF as the p-type semiconductor region is provided under the p-type body region PB to be closer to the upper surface Sa of the semiconductor substrate SS. That is, in the portion LCi1 of the inactive cell region LCi, the p-type floating region PF is formed in the portion of the semiconductor layer SLn which is located opposite to the trench T1 relative to the trench T2 interposed therebetween. In the portion LCi2 of the inactive cell region LCi, the p-type floating region PF is formed in the portion of the semiconductor layer SLn which is located opposite to the trench T1 relative to the trench T3 interposed therebetween.

As described above, in the portion LCi1 of the inactive cell region LCi, the end portion of the p-type floating region PF which is closer to the lower surface Sb is located closer to the lower surface Sb in the Z-axis direction than the end portion of the trench T2 which is closer to the lower surface Sb. Also, in the portion LCi2 of the inactive cell region LCi, the end portion of the P-type floating region PF which is closer to the lower surface Sb is located closer to the lower surface Sb in the Z-axis direction than the end portion of the trench T3 which is closer to the lower surface Sb.

Also, as described above, in the portion LCi1, the p-type floating region PF is preferably in contact with the gate insulating film GI formed over the inner wall of the trench T2. Also, in the portion LCi2, the p-type floating region PF is preferably in contact with the gate insulating film GI formed over the inner wall of the trench T3.

As shown in FIGS. 4 and 5, in each of the hybrid cell region LCh and the inactive cell regions LCi, the interlayer insulating film IL made of, e.g., silicon dioxide or the like is formed over the upper surface Sa of the semiconductor substrate SS. The interlayer insulating film IL is formed so as to cover the p-type body region PB in each of the hybrid sub-cell regions LCh1 and LCh2. Note that, between the upper surface Sa of the semiconductor substrate SS and the interlayer insulating film IL, an insulating film IF may also be formed.

In Embodiment 1, in each of the hybrid sub-cell regions LCh1 and LCh2, in the interlayer insulating film IL and the semiconductor layer SLn, the contact trenches CT are formed as a plurality of openings each extending through the interlayer insulating film IL to reach a middle point in the semiconductor layer SLn. In each of the hybrid sub-cell regions LCh1 and LCh2, the plurality of contact trenches CT are arranged to be spaced apart from each other in the Y-axis direction in plan view.

Accordingly, as shown in FIG. 4, in the cross-section along the line A-A in FIG. 3, the contact trenches CT are formed. However, as shown in FIG. 5, in the cross section along the line B-B in FIG. 3, the contact trenches CT are not formed.

As shown in FIG. 4, in the cross section along the line A-A in FIG. 3, in each of the hybrid sub-cell regions LCh1 and LCh2, in the portion of the p-type body region PB which is exposed at the bottom surface of each of the plurality of contact trenches CT, the $p^+$-type body contact region PBC as the p-type semiconductor region is formed. Also, under the $p^+$-type body contact region PBC, the $p^+$-type latch-up preventing region PLP is formed. The $p^+$-type body contact region PBC and the $p^+$-type latch-up preventing region PLP form each of the $p^+$-type semiconductor regions PR.

That is, in each of the hybrid sub-cell regions LCh1 and LCh2, the $p^+$-type semiconductor region PR includes the $p^+$-type body contact region PBC and the $p^+$-type latch-up preventing region PLP. In each of the hybrid sub-cell regions LCh1 and LCh2, the p-type impurity concentration in the $p^+$-type body contact region PBC is higher than the p-type impurity concentration in the $p^+$-type latch-up preventing region PLP.

In each of the hybrid sub-cell regions LCh1 and LCh2, the plurality of $p^+$-type semiconductor regions PR are formed in the portions of the p-type body region PB which are exposed individually in the plurality of contact trenches CT. Also, as shown in FIG. 4, in the cross section along the line A-A in FIG. 3, in the hybrid sub-cell region CLh1, the plurality of $p^+$-type semiconductor regions PR are formed in the portion of the semiconductor layer SLn which is located between the trenches T1 and T2. On the other hand, in the hybrid sub-cell region LCh2, the plurality of $p^+$-type semiconductor regions PR are formed in the portion of the semiconductor layer SLn which is located between the trenches T1 and T3.

In the hybrid sub-cell region CLh1, the p-type impurity concentration in each of the plurality of $p^+$-type semiconductor regions PR is higher than the p-type impurity concentration in the p-type body region PB. In the hybrid sub-cell region CLh2, the p-type impurity concentration in each of the plurality of $p^+$-type semiconductor regions PR is higher than the p-type impurity concentration in the p-type body region PB. In the hybrid sub-cell region LCh1, the plurality of $p^+$-type semiconductor regions PR are arranged along the Y-axis direction in plan view to be spaced apart from each other. Also, in the hybrid sub-cell region LCh2, the plurality of $p^+$-type semiconductor regions PR are arranged along the Y-axis direction in plan view to be spaced apart from each other.

As shown in FIG. 4 which is the cross section along the line A-A in FIG. 3, in each of the hybrid sub-cell regions LCh1 and LCh2, the plurality of coupling electrodes CP are formed to be embedded individually in the plurality of contact trenches CT.

In each of the hybrid sub-cell regions LCh1 and LCh2, the coupling electrodes CP are in contact with the $n^+$-type emitter regions NE and the $p^+$-type semiconductor regions PR. Accordingly, in each of the hybrid sub-cell regions LCh1 and LCh2, the $n^+$-type emitter region NE and the plurality of $p^+$-type semiconductor regions PR are electrically coupled to the emitter electrode EE via the plurality of coupling electrodes CP.

In each of the hybrid sub-cell regions LCh1 and LCh2, in each pair of the coupling electrode CP and the $p^+$-type semiconductor region PR which are coupled to each other, the coupling electrode CP is in contact with the $p^+$-type body contact region PBC included in the $p^+$-type semiconductor region PR. This can reduce the contact resistance between the coupling electrode CP and the $p^+$-type semiconductor region PR.

As shown in FIGS. 4 and 5, over the interlayer insulating film IL, the emitter electrode EE made of a metal film containing, e.g., aluminum as a main component is provided. The emitter electrode EE is coupled to the $n^+$-type emitter regions NE and the $p^+$-type body contact regions PBC via the contact trenches CT. In the example shown in FIG. 4, the coupling electrodes CP and the emitter electrode EE are formed integrally.

Over the emitter electrode EE, the insulating film FPF as a passivation film made of, e.g., a polyimide-based organic insulating film or the like is further formed.

Note that, in the technique disclosed in Patent Document 3 described above, a semiconductor region equivalent to the p-type floating region PF in the semiconductor device in Embodiment 1 has not been formed. Also, in the technique disclosed in Patent Document 3 described above, unlike in Embodiment 1, a semiconductor region equivalent to the p-type body region PB in the semiconductor device in Embodiment 1 is selectively formed in a longitudinal direction between the trenches.

<Method of Manufacturing Semiconductor Device>

Next, a method of manufacturing a semiconductor device in Embodiment 1 will be described. FIGS. 7 to 24 are main-portion cross-sectional views showing the manufacturing process of the semiconductor device in Embodiment 1. FIGS. 7 to 17, 19, and 21 to 24 are cross-sectional views along the line A-A in FIG. 3, similarly to FIG. 4. FIGS. 18 and 20 are cross-sectional views along the line B-B in FIG. 3, similarly to FIG. 5.

The following will mainly describe the cell formation area AR1 (see FIG. 2). For the gate-wire-lead-out area AR2 (see FIG. 2), FIG. 2 is referred to as necessary. The following will also describe the unit cell regions LC each including the hybrid cell region LCh as the active cell region and the inactive cell regions LCi. As described above, the hybrid cell region LCh includes the hybrid sub-cell regions LCh1 and LCh2.

Note that each of the unit cell regions CL includes the positive half portion LCi1 of the inactive cell region LCi which is located on the negative side of the hybrid cell region LCh in the X-axis direction to be adjacent thereto. Also, the unit cell region LC includes the negative half portion CLi2 of the inactive cell region CLi which is located on the positive side of the hybrid cell region CLh in the X-axis direction to be adjacent thereto.

Figure 7:
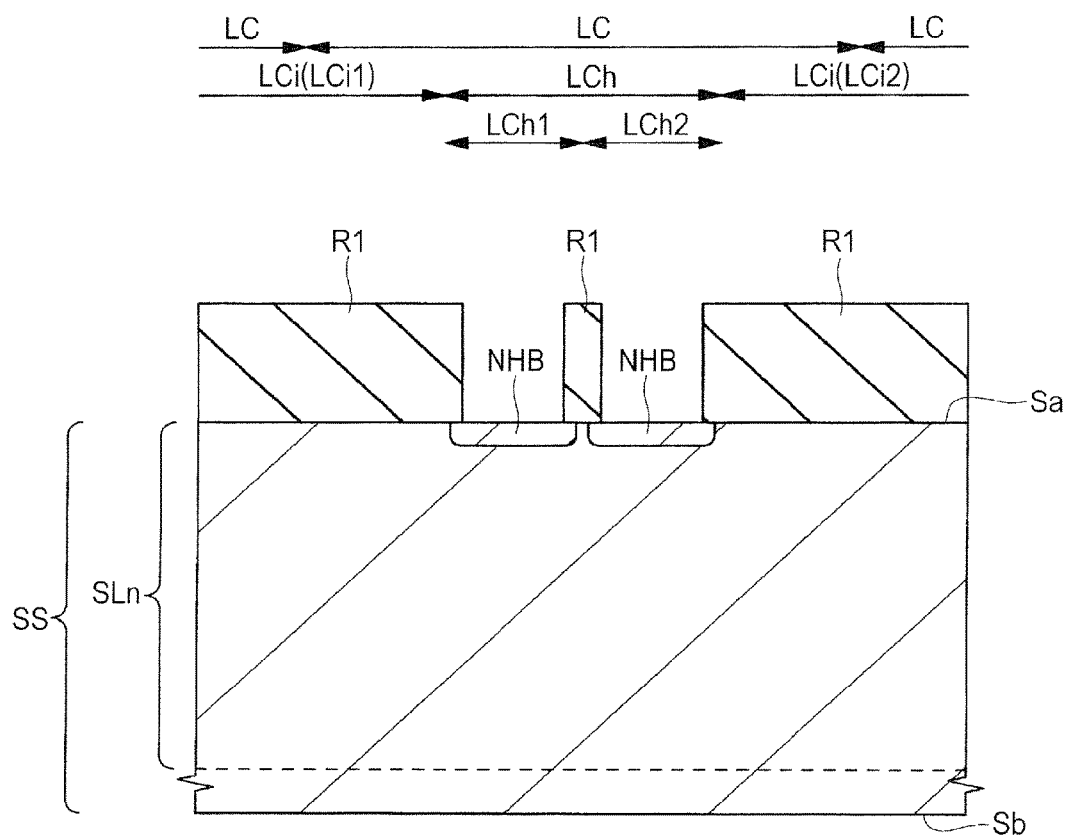
FIG. 7 is a main-portion cross-sectional view showing the manufacturing process of the semiconductor device in Embodiment 1.

First, as shown in FIG. 7, the semiconductor substrate SS made of a silicon single crystal into which an n-type impurity such as, e.g., phosphorus (P) has been introduced is provided. The semiconductor substrate SS has the upper surface Sa as the first main surface and the lower surface Sb as the second main surface opposite to the upper surface Sa.

The impurity concentration of the n-type impurity in the semiconductor substrate SS can be set to, e.g., about $2\times10^{14}$ cm$^{-3}$. At this stage, the semiconductor substrate SS is a thin plate of a semiconductor having a generally circular two-dimensional shape, which is referred to as a wafer. The thickness of the semiconductor substrate SS can be set to, e.g., about 450 μm to 1000 μm.

Note that, in the semiconductor substrate SS, the semiconductor layer closer to the upper surface Sa than the semiconductor layer in which the n-type field stop region Ns (see FIG. 4) is to be formed is assumed to be the semiconductor layer SLn. The semiconductor layer SLn is an n-type semiconductor layer. It follows therefore that, when the semiconductor substrate SS is provided, the n-type semiconductor layer SLn is formed in the semiconductor substrate SS.

Next, over the entire upper surface Sa of the semiconductor substrate SS, a resist film R1 for introducing an n-type hole barrier region is formed by coating or the like and patterned by typical lithography. Using the patterned resist film R1 as a mask, an n-type impurity is introduced into the upper surface Sa of the semiconductor substrate SS by, e.g., ion implantation to form the n-type hole barrier regions NHB. At this time, as a preferred example of conditions for the ion implantation, ion implantation conditions such that, e.g., an ion species is phosphorus (P), a dose is about $6\times10^{12}$ cm$^{-2}$, and an implantation energy is about 80 KeV can be shown. Then, by ashing or the like, the unneeded resist film R1 is removed.

Figure 8:
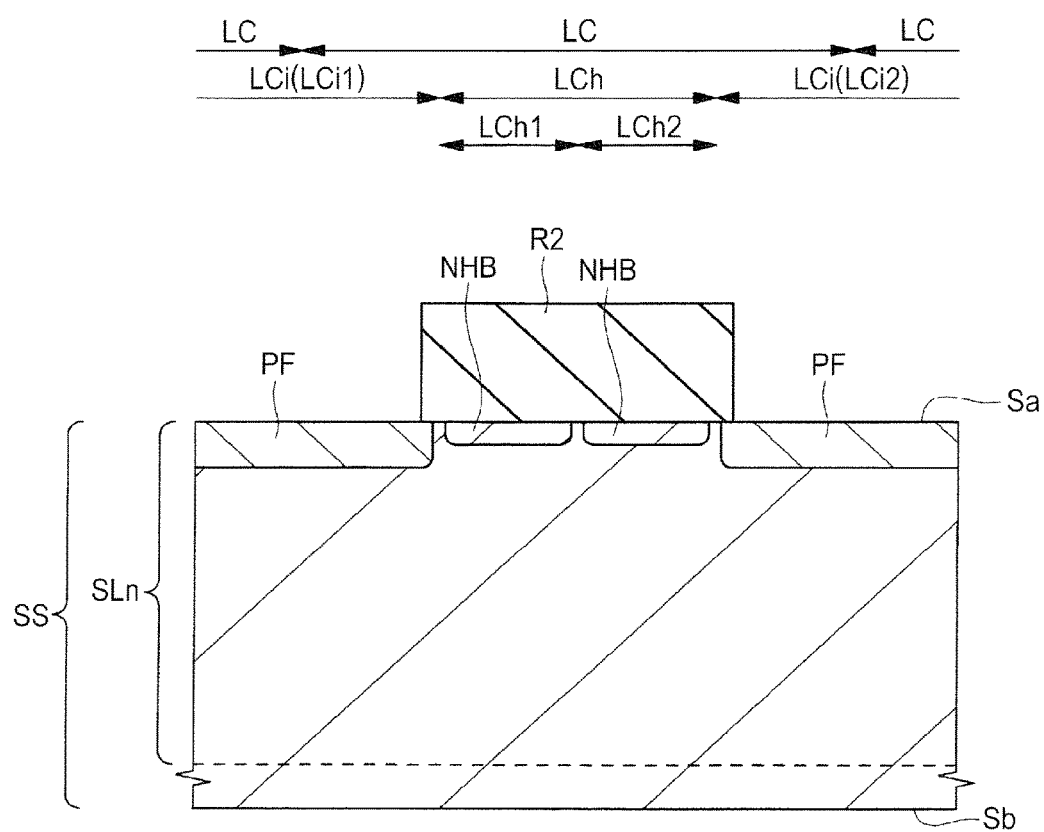
FIG. 8 is a main-portion cross-sectional view showing the manufacturing process of the semiconductor device in Embodiment 1.

Next, as shown in FIG. 8, over the upper surface Sa of the semiconductor substrate SS, a resist film R2 for introducing a p-type floating region is formed by coating or the like and patterned by typical lithography. Using the patterned resist film R2 as a mask, a p-type impurity is introduced into the upper surface Sa of the semiconductor substrate SS by, e.g., ion implantation to form the p-type floating region PF. At this time, as a preferred example of conditions for the ion implantation, ion implantation conditions such that, e.g., an ion species is boron (B), a dose is about $3.5\times10^{13}$ cm$^{-2}$, and an ion implantation energy is about 75 KeV can be shown. Then, by ashing or the like, the unneeded resist film R2 is removed. Note that, when the p-type floating region PF is formed in the cell formation area AR1 (see FIG. 2), the p-type floating region PFp is formed in, e.g., the gate-wire-lead-out area AR2 (see FIG. 2).

Figure 9:
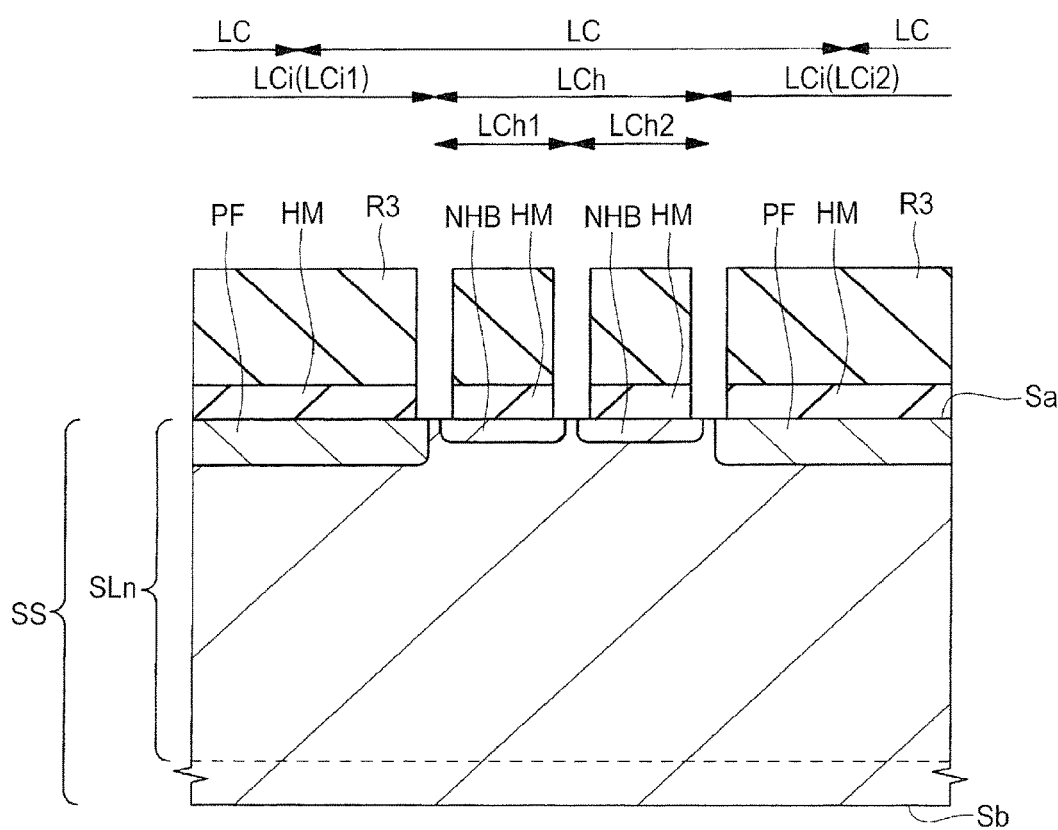
FIG. 9 is a main-portion cross-sectional view showing the manufacturing process of the semiconductor device in Embodiment 1.

Next, as shown in FIG. 9, over the upper surface Sa of the semiconductor substrate SS, a hard mask film HM made of, e.g., silicon dioxide is deposited by, e.g., a CVD (Chemical Vapor Deposition) method or the like. The hard mask film HM has a thickness of, e.g., about 450 nm.

Next, as shown in FIG. 9, over the upper surface Sa of the semiconductor substrate SS, a resist film R3 for processing a hard mask is formed by coating or the like and patterned by typical lithography. Using the patterned resist film R3 as a mask, the hard mask film HM is patterned by, e.g., dry etching.

Figure 10:
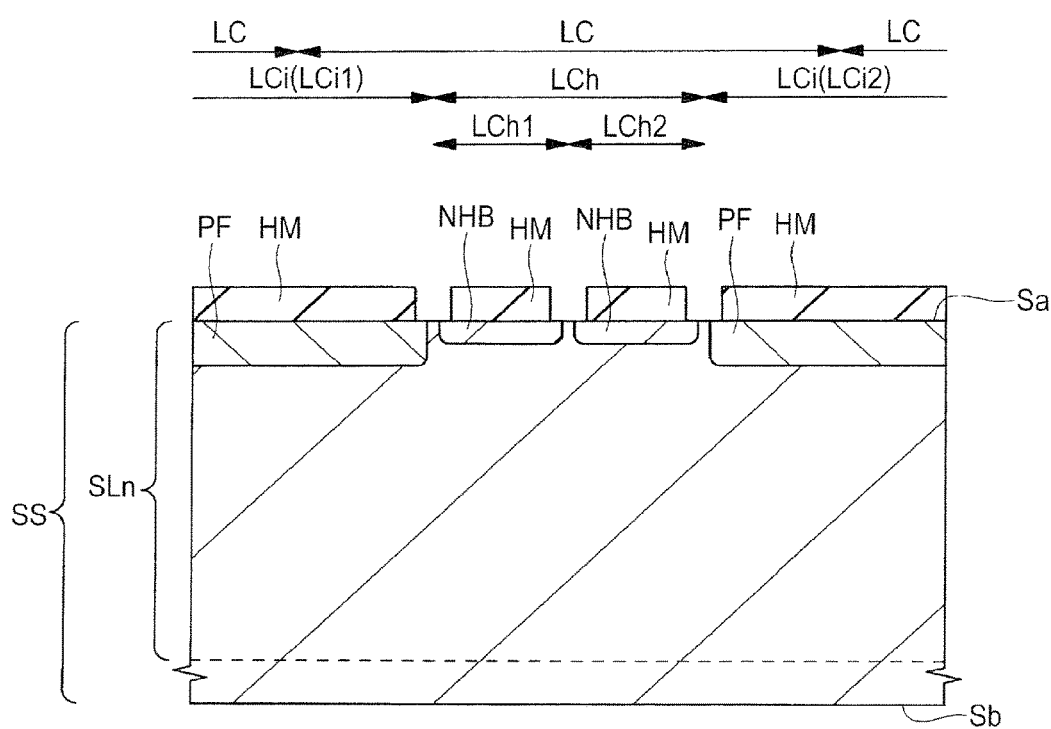
FIG. 10 is a main-portion cross-sectional view showing the manufacturing process of the semiconductor device in Embodiment 1.

Then, as shown in FIG. 10, the unneeded resist film R3 is removed by ashing or the like.

Figure 11:
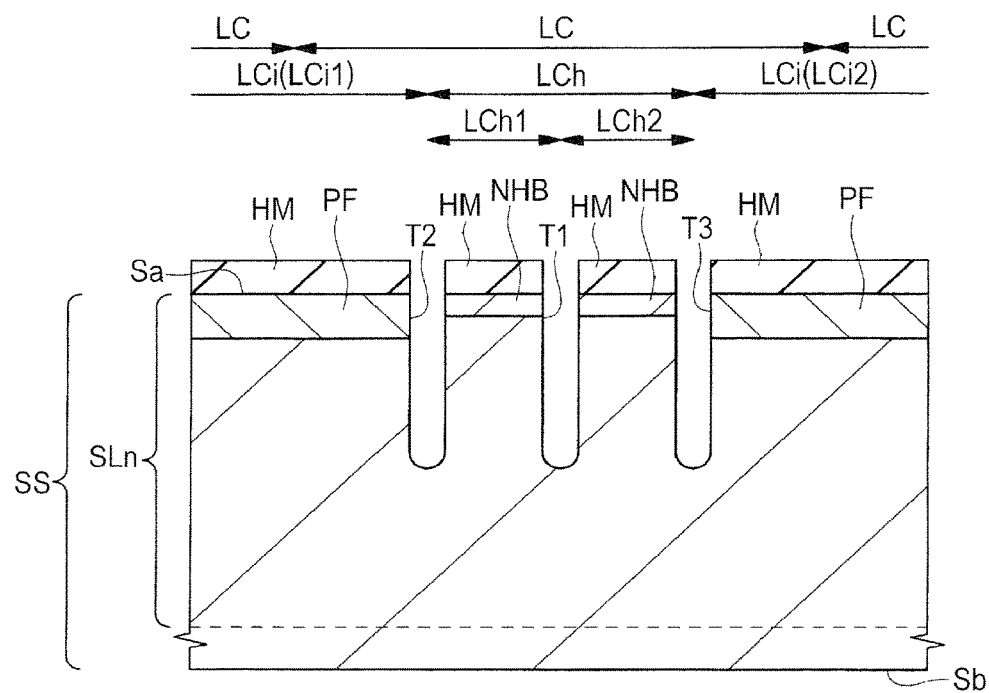
FIG. 11 is a main-portion cross-sectional view showing the manufacturing process of the semiconductor device in Embodiment 1.

Next, as shown in FIG. 11, using the patterned hard mask film HM, the trenches T1, T2, and T3 are formed by, e.g., anisotropic dry etching. At this time, the trench T1 is formed to extend from the upper surface Sa of the semiconductor substrate SS in the Y-axis direction in plan view and reach a middle point in the semiconductor layer SLn. Also, the trenches T2 and T3 are formed to extend in the Y-axis direction in plan view from the upper surface Sa of the semiconductor substrate SS, reach middle points in the semiconductor layer SLn, and be located on both sides of the trench T1 interposed therebetween. As a gas for the anisotropic dry etching, e.g., a Cl$_2$/O$_2$-based gas can be shown as a preferred example.

Figure 12:
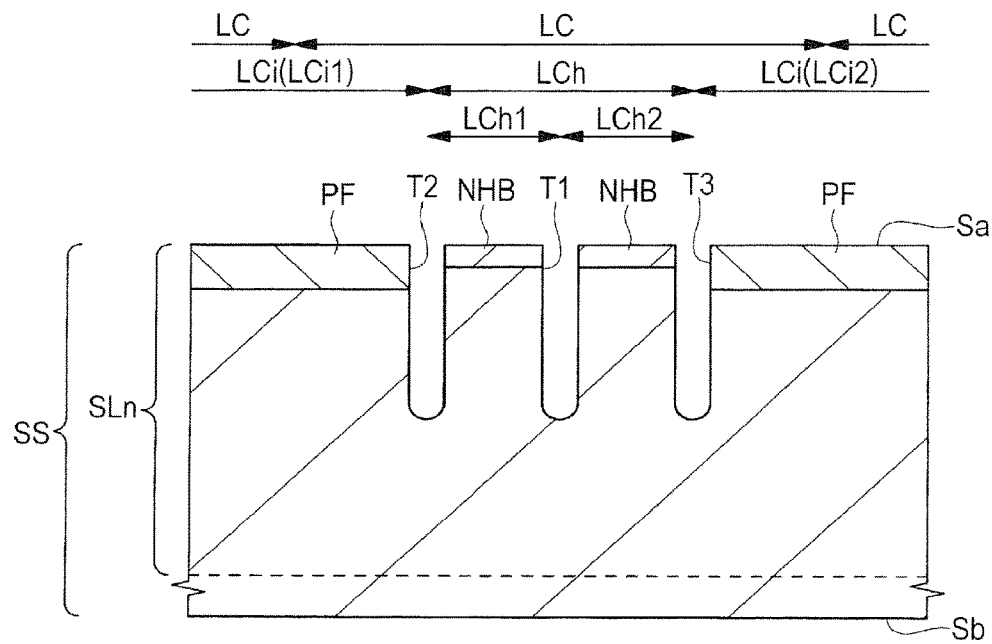
FIG. 12 is a main-portion cross-sectional view showing the manufacturing process of the semiconductor device in Embodiment 1.

Then, as shown in FIG. 12, by wet etching using, e.g., a hydrofluoric-acid-based etching solution or the like, the unneeded hard mask HM is removed.

Figure 13:
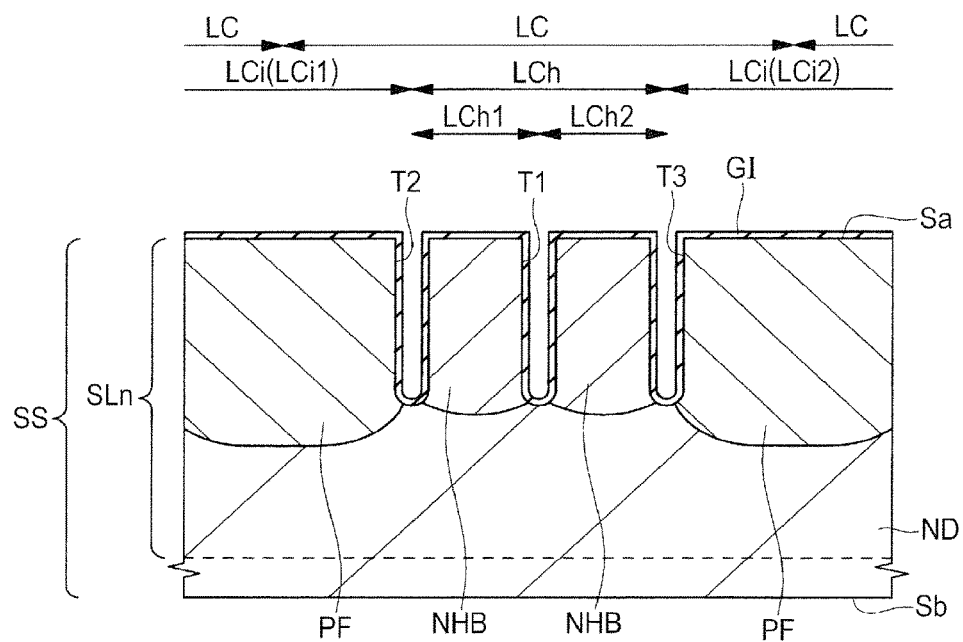
FIG. 13 is a main-portion cross-sectional view showing the manufacturing process of the semiconductor device in Embodiment 1.

Next, as shown in FIG. 13, extension diffusion (e.g., at 1200° C. for about 30 minutes) is performed on the p-type floating regions PF and the n-type hole barrier regions NHB. At this time, the extension diffusion is performed such that the end portion of the p-type floating region PF which is closer to the lower surface Sb is located closer to the lower surface Sb in the Z-axis direction than the respective end portions of the trenches T1, T2, and T3 which are closer to the lower surface Sb.

Thus, in the portion of the semiconductor layer SLn which is located opposite to the trench T1 relative to the trench T2 interposed therebetween, the p-type floating region PF is formed and, in the portion of the semiconductor layer SLn which is located opposite to the trench T1 relative to the trench T3 interposed therebetween, the p-type floating regions PF are formed. Preferably, the p-type floating region PF formed opposite to the trench T1 relative to the trench T2 interposed therebetween is in contact with the gate insulating film GI formed over the inner wall of the trench T2, and the p-type floating region PF formed opposite to the trench T1 relative to the trench T3 interposed therebetween is in contact with the gate insulating film GI formed over the inner wall of the trench T3.

Additionally, the end portion of the p-type floating region PF formed opposite to the trench T1 relative to the trench T2 interposed therebetween which is closer to the lower surface Sb is located closer to the lower surface Sb in the Z-axis direction than the end portion of the trench T2 which is closer to the lower surface Sb. Also, the end portion of the p-type floating region PF formed opposite to the trench T1 relative to the trench T3 interposed therebetween which is closer to the lower surface Sb is located closer to the lower surface Sb in the Z-axis direction than the end portion of the trench T3 which is closer to the lower surface Sb.

In addition, in the portion of the semiconductor layer SLn which is located between the trenches T1 and T2 and the portion of the semiconductor layer SLn which is located between the trenches T1 and T3, the n-type hole barrier regions NHB are formed. Preferably, the n-type hole barrier region NHB formed between trenches T1 and T2 is in contact with the gate insulating film GI formed over the inner wall of the trench T1 and with the gate insulating film GI formed over the inner wall of the trench T2. Preferably, the n-type hole barrier region NHB formed between the trenches T1 and T3 is in contact with the gate insulating film GI formed over the inner wall of the trench T1 and with the gate insulating film GI formed over the inner wall of the trench T3.

During the extension diffusion, the region of the n-type semiconductor substrate SS where the p-type floating regions PF and the n-type hole barrier regions NHB are not formed serves as the $n^-$-type drift region ND. In other words, the region of the n-type semiconductor layer SLn where the p-type floating regions PF and the n-type hole barrier regions NHB are not formed serves as the n-type drift region ND. Note that, in the process step shown in FIG. 13, the n-type drift region ND is formed to extend from within the semiconductor layer SLn to the lower surface Sb of the semiconductor substrate SS.

Between the trenches T1 and T2, the n-type impurity concentration in the n-type hole barrier region NHB is higher than the n-type impurity concentration in the portion of the semiconductor layer SLn which is located closer to the lower surface Sb than the n-type hole barrier region NHB, i.e., in the $n^-$-type drift region ND and lower than the n-type impurity concentration in each of the $n^+$-type emitter regions NE. What applies to the n-type impurity concentration in the n-type hole barrier region NHB between the trenches T1 and T2 similarly applies to the n-type impurity concentration in the n-type hole barrier region NHB between the trenches T1 and T3.

Next, as shown in FIG. 13, by, e.g., a thermal oxidation method or the like, the gate insulating film GI made of, e.g., silicon dioxide is formed over the upper surface Sa of the semiconductor substrate SS and the respective inner walls of the trenches T1, T2, and T3. The thickness of the gate insulating film GI is, e.g., about 0.12 μm.

Figure 14:
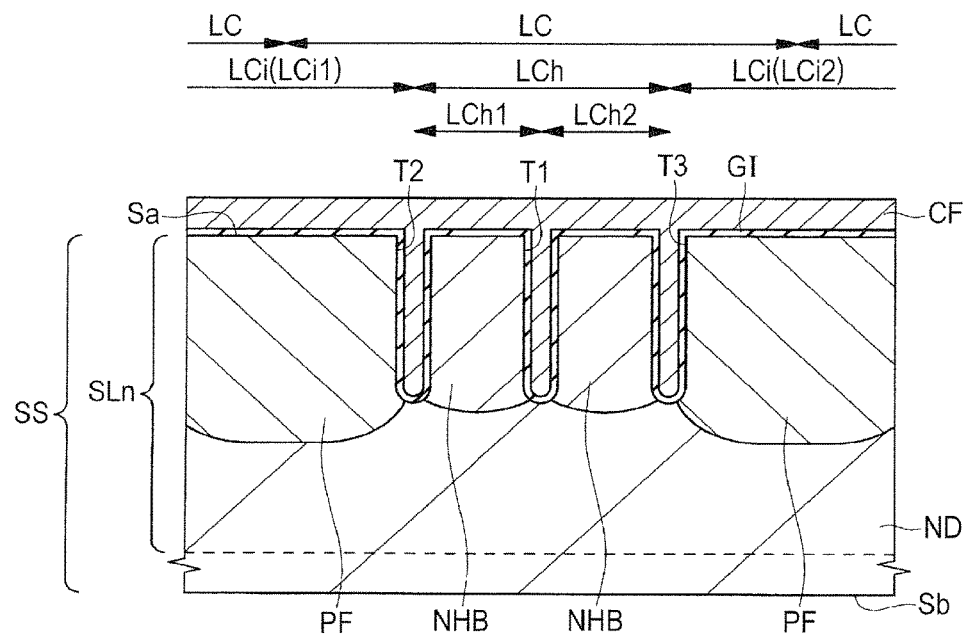
FIG. 14 is a main-portion cross-sectional view showing the manufacturing process of the semiconductor device in Embodiment 1.

Next, as shown in FIG. 14, over the upper surface Sa of the semiconductor substrate SS and in each of the trenches T1, T2, and T3, a conductive film CG made of polycrystalline silicon doped with phosphorus (P) (Doped Poly-Silicon) is deposited by, e.g., a CVD method or the like. The thickness of the conductive film CF is. e.g., about 0.6 μm.

Figure 15:
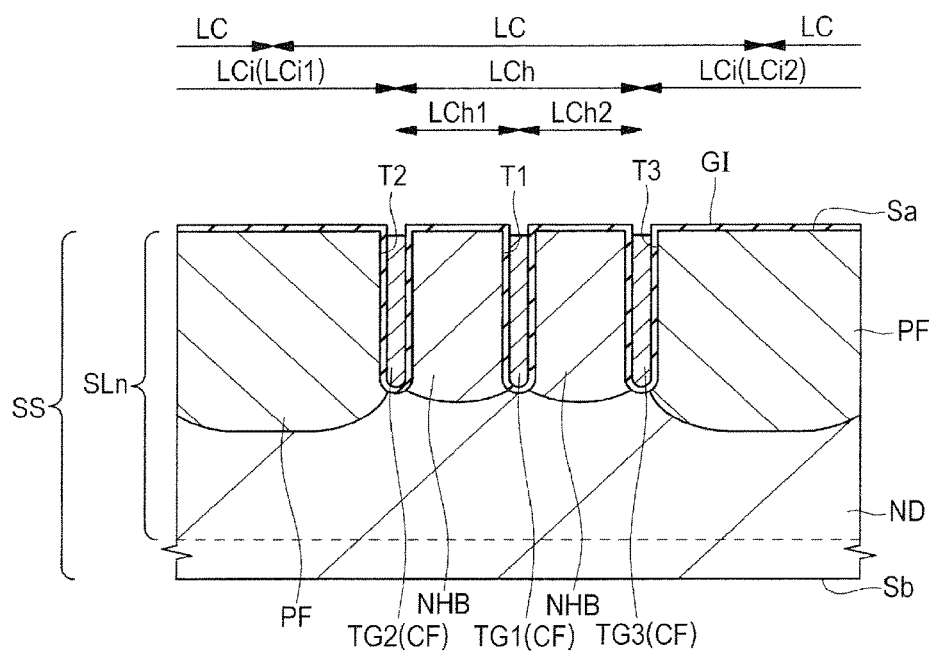
FIG. 15 is a main-portion cross-sectional view showing the manufacturing process of the semiconductor device in Embodiment 1.

Next, as shown in FIG. 15, by, e.g., dry etching or the like, the conductive film CF is etched back. Thus, the trench gate electrode TG1 made of the conductive film CF embedded in the trench T1 via the gate insulating film GI is formed. Also, the trench gate electrode GT2 made of the conductive film CF embedded in the trench T2 via the gate insulating film GI is formed. Also, the trench gate electrode GT3 made of the conductive film CF embedded in the trench T3 via the gate insulating film GI is formed.

In other words, over the gate insulating film GI, the trench gate electrode TG1 is formed so as to be embedded in the trench T1 and, over the gate insulating film GI, the trench gate electrode TG2 is formed so as to be embedded in the trench T2 and, over the gate insulating film GI, the trench gate electrode TG3 is formed so as to be embedded in the trench T3. As a preferred example of a gas for the etching, e.g., a $SF_6$ gas or the like can be shown.

Figure 16:
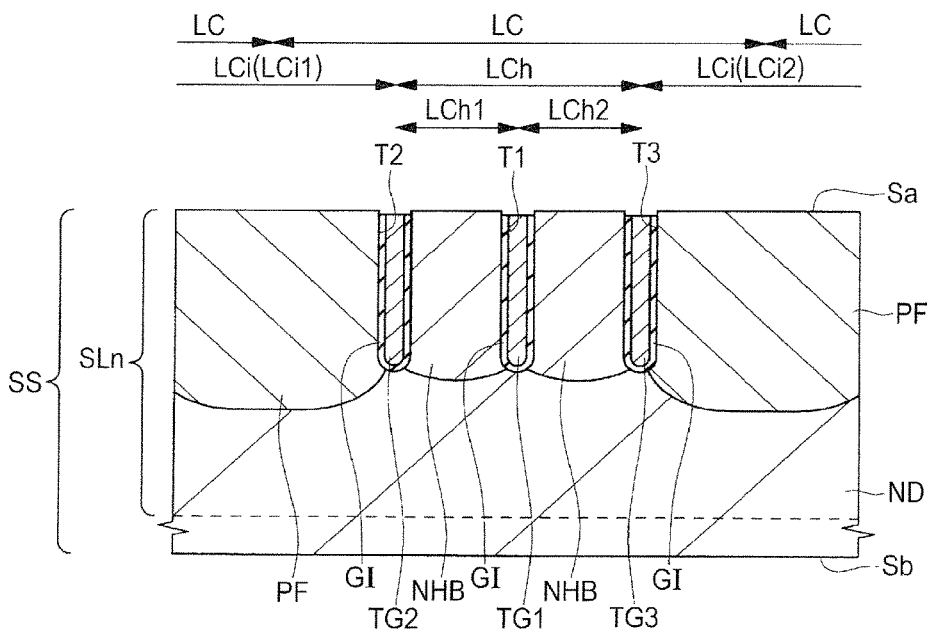
FIG. 16 is a main-portion cross-sectional view showing the manufacturing process of the semiconductor device in Embodiment 1.

Next, as shown in FIG. 16, the gate insulating film GI except for the portions thereof located in the trenches T1, T2, and T3 is removed by dry etching or the like.

Figure 17:
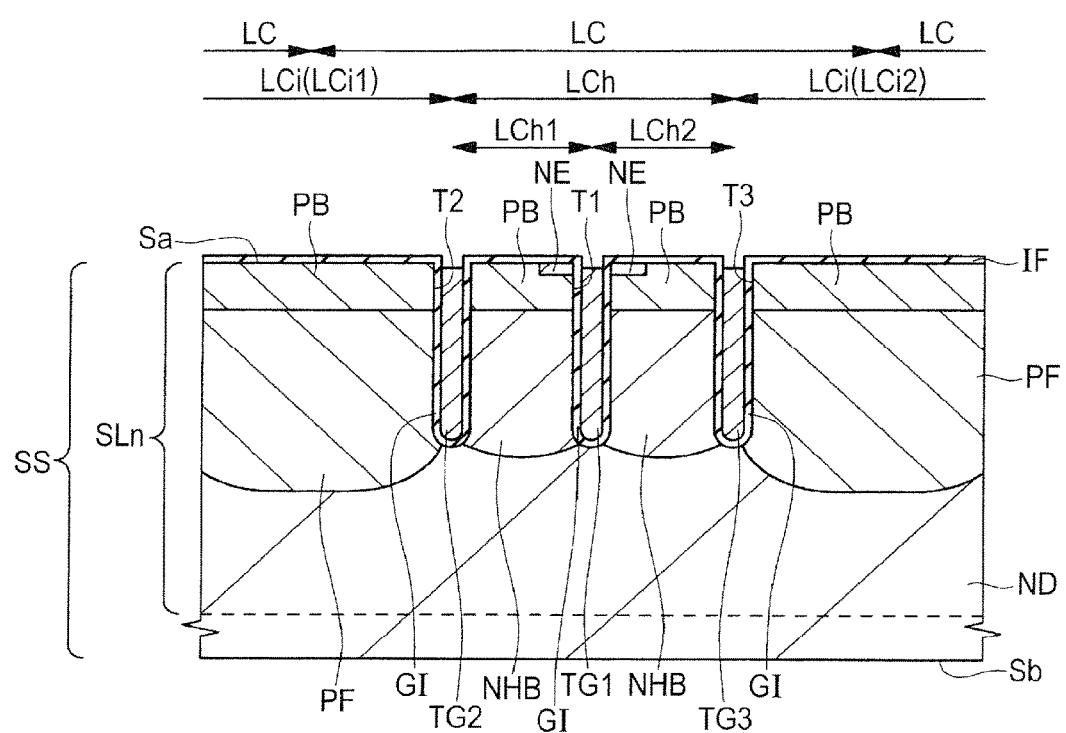
FIG. 17 is a main-portion cross-sectional view showing the manufacturing process of the semiconductor device in Embodiment 1.
Figure 18:
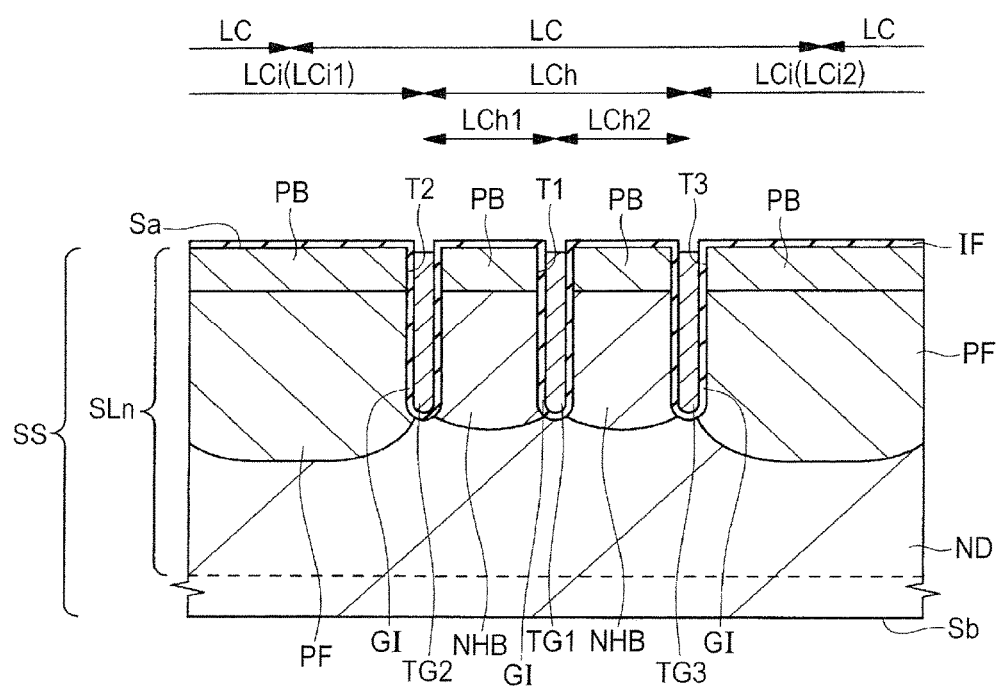
FIG. 18 is a main-portion cross-sectional view showing the manufacturing process of the semiconductor device in Embodiment 1.

Next, as shown in FIG. 17, over the upper surface Sa of the semiconductor substrate SS, the insulating film IF made of a relatively thin silicon dioxide film (which is as thin as, e.g., the gate insulating film GI) for subsequent ion implantation is formed by, e.g., thermal oxidation or CVD. Next, over the upper surface Sa of the semiconductor substrate SS, a resist film (the depiction thereof is omitted) for introducing a p-type body region is formed by typical lithography. Using the resist film for introducing the p-type body region as a mask, a p-type impurity is introduced into the entire surface of the cell formation area AR1 and other regions into which the p-type impurity needs to be introduced to form the p-type body region PB.

Specifically, in the portion of the semiconductor layer SLn which is located between the trenches T1 and T2, the p-type body region PB is formed to be in contact with the gate insulating film GI formed over the inner wall of the trench T1 and with the gate insulating film GI formed over the inner wall of the trench T2. Also, in the portion of the semiconductor layer SLn which is located between the trenches T1 and T3, the p-type body region PB is formed to be in contact with the gate insulating film GI formed over the inner wall of the trench T1 and with the gate insulating film GI formed over the inner wall of the trench T3.

At this time, as a preferred example of conditions for the ion implantation, ion implantation conditions such that, e.g., an ion species is boron (B), a dose is about $3\times10^{13}$ cm$^{-2}$, and an implantation energy is about 75 KeV can be shown. Then, by ashing or the like, the unneeded resist film for introducing the p-type body region is removed.

Then, over the upper surface Sa of the semiconductor substrate SS, a resist film (the depiction thereof is omitted) for introducing $n^+$-type emitter regions is formed by typical lithography. Using the resist film for introducing the $n^+$-type emitter regions as a mask, an n-type impurity is introduced into the upper-layer portion of the p-type body region PB of the hybrid cell region LCh by, e.g., ion implantation to form the $n^+$-type emitter regions NE.

Specifically, in the portion of the semiconductor layer SLn which is located between the trenches T1 and T2, the $n^+$-type emitter region NE is formed to be in contact with the gate insulating film GI formed over the inner wall of the trench T1 and with the p-type body region PB. Also, in the portion of the semiconductor layer SLn which is located between the trenches T1 and T3, the n'-type emitter region NE is formed to be in contact with the gate insulating film GI formed over the inner wall of the trench T1 and with the p-type body region PB.

At this time, as a preferred example of conditions for the ion implantation, ion implantation conditions such that, e.g., an ion species is arsenic (As), a dose is about $5\times10^{15}$ cm$^{-2}$, and an implantation energy is about 80 KeV can be shown. Then, by asking or the like, the unneeded resist film for introducing the $n^+$-type emitter regions is removed.

Here, the cross section shown in FIG. 17 is equivalent to the cross section along the line A-A in FIG. 3, i.e., the cross section shown in FIG. 4. On the other hand, in the cross section along the line B-B in FIG. 3, i.e., in a cross section equivalent to the cross section shown in FIG. 5, the n'-type emitter regions NE are not formed so that a state as shown in FIG. 18 is reached.

Figure 19:
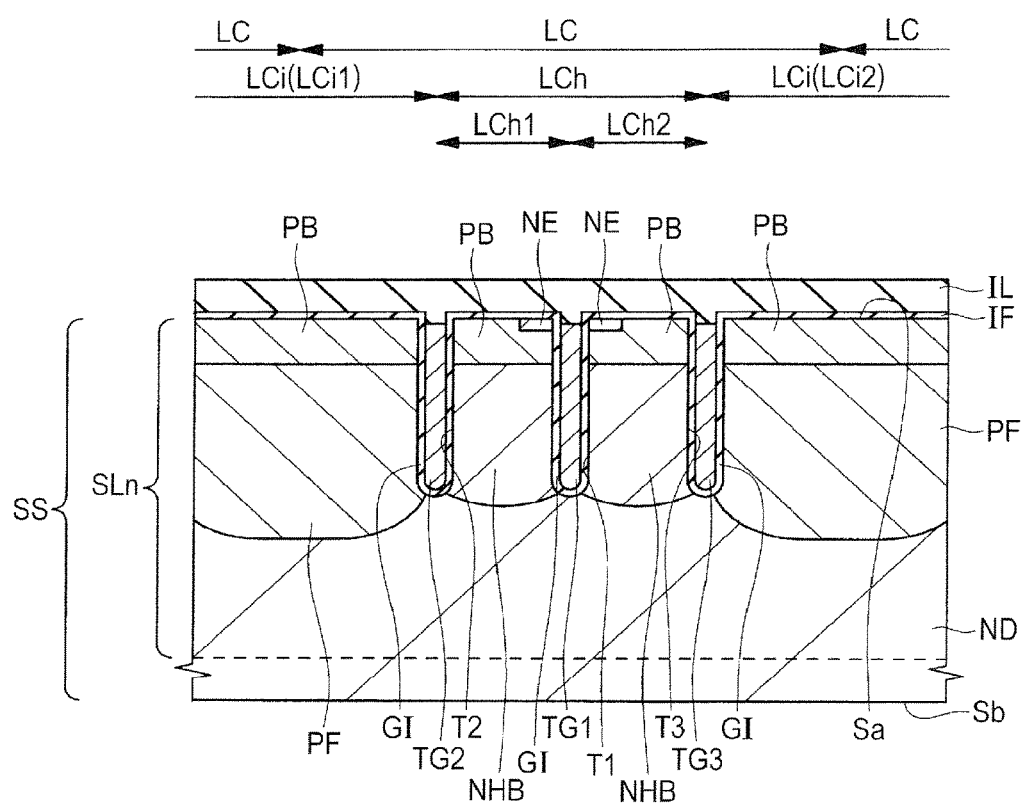
FIG. 19 is a main-portion cross-sectional view showing the manufacturing process of the semiconductor device in Embodiment 1.
Figure 20:
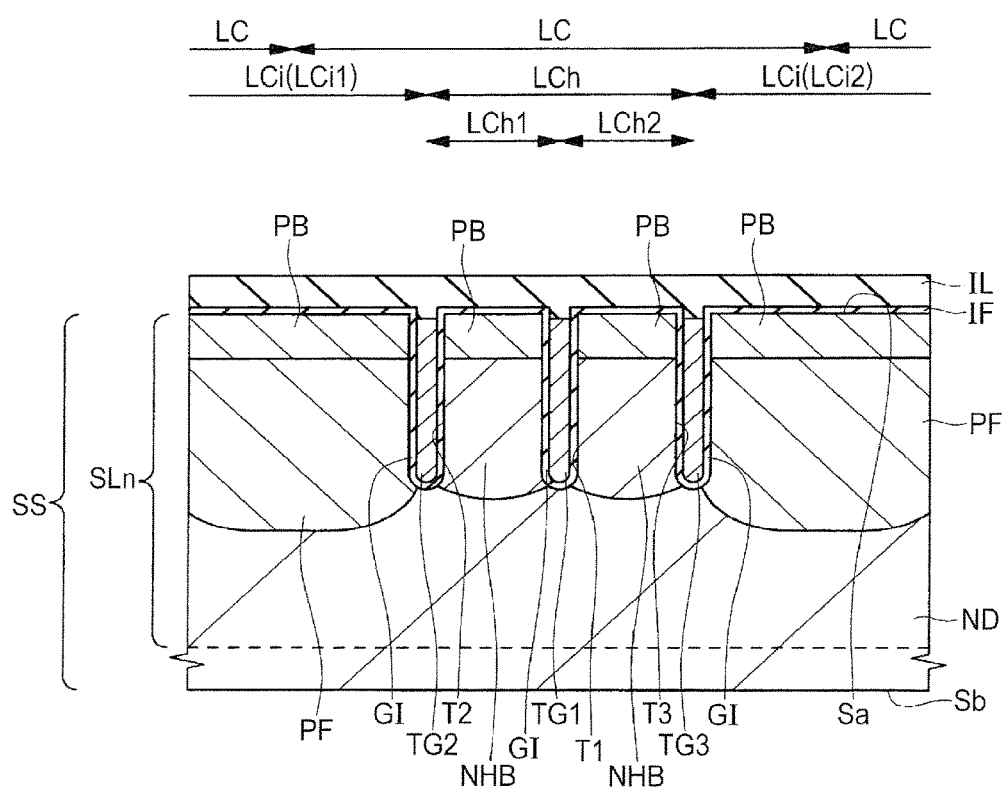
FIG. 20 is a main-portion cross-sectional view showing the manufacturing process of the semiconductor device in Embodiment 1.

Next, as shown in FIG. 19, over the upper surface Sa of the semiconductor substrate SS, the interlayer insulating film IL made of, e.g., a PSG (Phosphosilicate Glass) film is formed by, e.g., a CVD method or the like. The interlayer insulating film IL is formed so as to cover the p-type body region PB via the insulating film IF. The interlayer insulating film IL has a thickness of, e.g., about 0.6 μm. As preferred examples of the material of the interlayer insulating film IL, not only the PSG film, but also a BPSG (Borophosphosilicate Glass film), an NSG (Non-doped Silicate Glass) film, a SOG (Spin-On-Glass) film, a composite film thereof, or the like can be shown.

Here, the cross section shown in FIG. 19 is equivalent to the cross section along the line A-A in FIG. 3, i.e., the cross section shown in FIG. 4. On the other hand, in the cross section along the line B-B in FIG. 3, i.e., in the cross section equivalent to the cross section shown in FIG. 5, the n'-type emitter regions NE are not formed so that a state as shown in FIG. 20 is reached.

Figure 21:
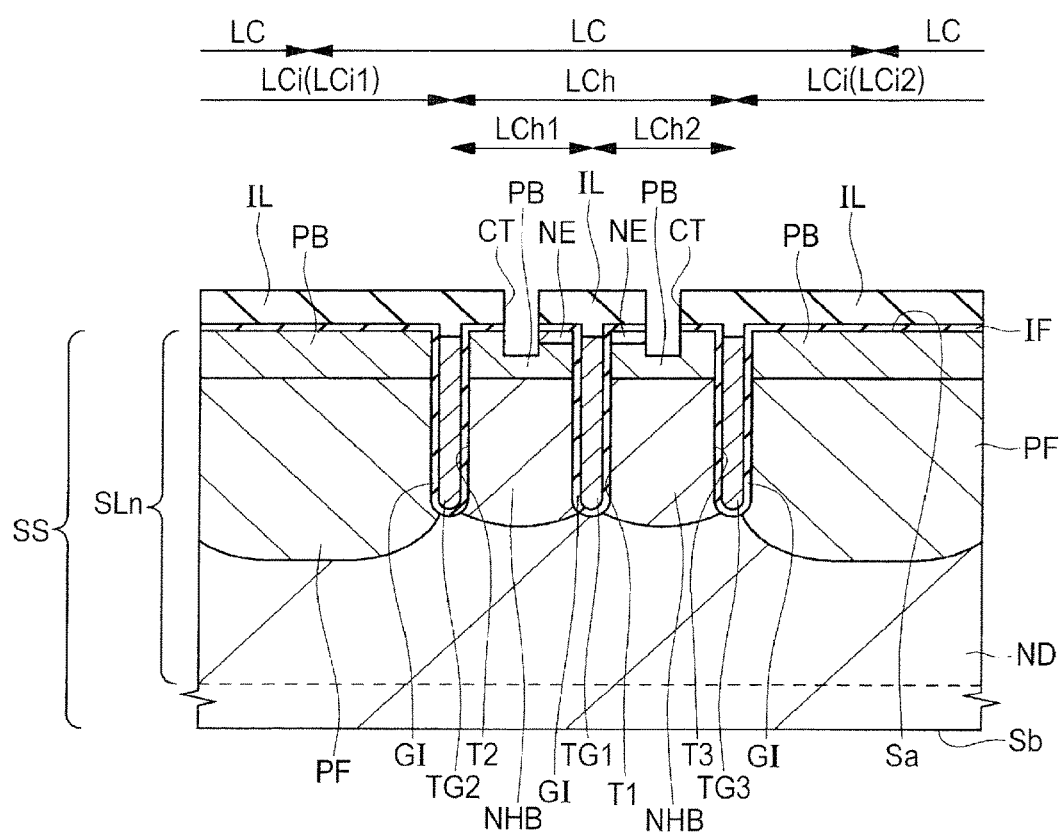
FIG. 21 is a main-portion cross-sectional view showing the manufacturing process of the semiconductor device in Embodiment 1.

Next, as shown in FIG. 21, over the interlayer insulating film IL, a resist film (the depiction thereof is omitted) for forming contact trenches is formed by typical lithography. Subsequently, the contact trenches CT are formed by, e.g., anisotropic dry etching or the like. As a preferred example of a gas used for the anisotropic dry etching, a gas mixture including, e.g., an Ar gas, a $CHF_3$ gas, and a $CF_4$ gas or the like can be shown. Then, the unneeded resist film for forming the contact trenches is removed by asking or the like.

Next, as shown in FIG. 21, the contact trenches CT are extended into the semiconductor substrate SS by, e.g., anisotropic dry etching. As a preferred example of the gas for the anisotropic dry etching, e.g., a $Cl_2/O_2$ gas can be shown.

Here, the cross section shown in FIG. 21 is equivalent to a cross section along the line A-A in FIG. 3, i.e., the cross section shown in FIG. 4. On the other hand, in a cross section along the line B-B in FIG. 3, i.e., a cross section equivalent to the cross section shown in FIG. 5, the contact trenches CT are not formed. As a consequence, the cross section along the line B-B in FIG. 3 remains unchanged from the cross section shown in FIG. 20.

Accordingly, by performing the process step shown in FIG. 21, the contact trenches CT are formed as a plurality of openings each extending through the interlayer insulating film IL in the hybrid sub-cell region LCh1 and reaching a middle point in the p-type body region PB. In the hybrid sub-cell region LCh1, the plurality of contact trenches CT are arranged along the Y-axis direction in plan view to be spaced apart from each other.

Also, by performing the process step shown in FIG. 21, in the hybrid sub-cell region LCh2, the contact trenches CT are formed as a plurality of openings each extending through the interlayer insulating film IL and reaching a middle point in the p-type body region PB. In the hybrid sub-cell region LCh2, the plurality of contact trenches CT are arranged along the Y-axis direction in plan view to be spaced apart from each other.

Figure 22:
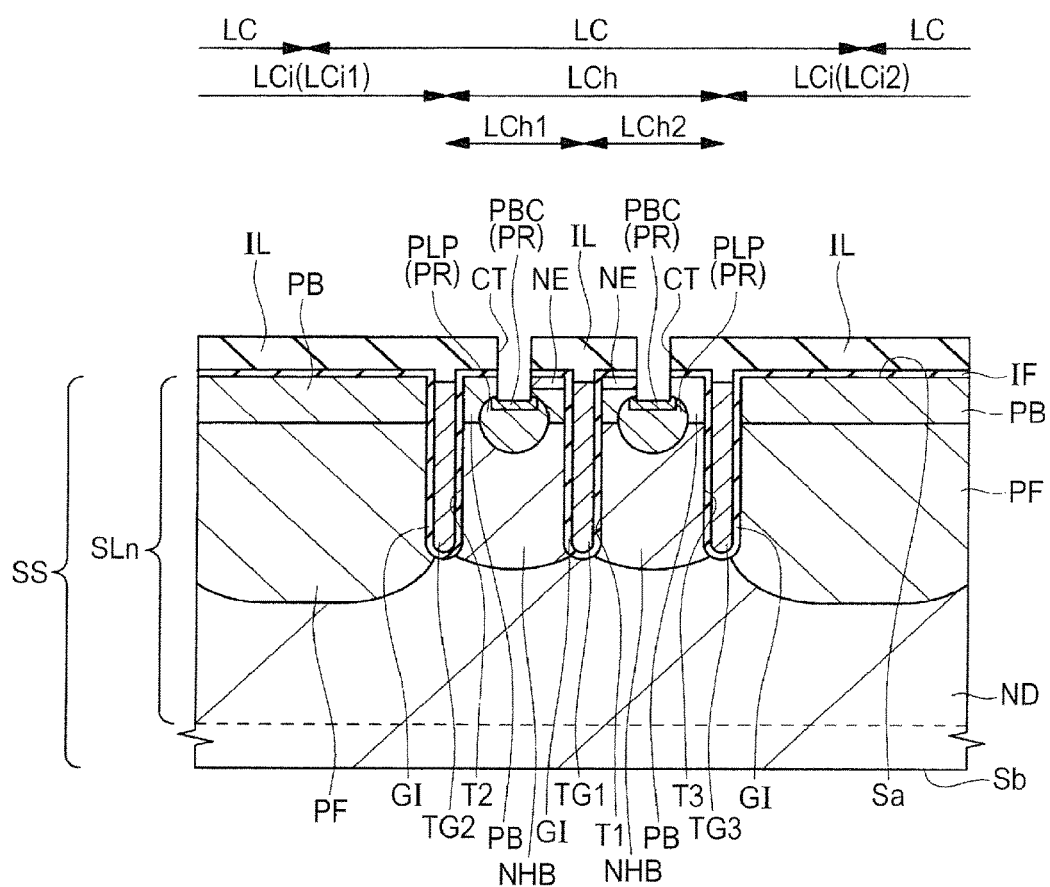
FIG. 22 is a main-portion cross-sectional view showing the manufacturing process of the semiconductor device in Embodiment 1.

Next, as shown in FIG. 22, a p-type impurity is ion-implanted through, e.g., the contact trenches CT to form the type body contact regions PBC. Here, as a preferred example of conditions for the ion implantation, ion implantation conditions such that, e.g., an ion species is boron (B), a dose is about $5\times10^{15}$ $cm^{-2}$, and an implantation energy is about 80 KeV can be shown.

Likewise, a p-type impurity is ion-implanted through, e.g., the contact trenches CT to form the $p^+$-type latch-up preventing regions PLP. Here, as a preferred example of conditions for the ion implantation, ion implantation conditions such that, e.g., an ion species is boron (B), a dose is about $5\times10^{15}$ $cm^{-2}$, and an implantation energy is about 80 KeV can be shown. The p-type impurity concentration in each of the $p^+$-type body contact regions PBC is higher than the p-type impurity concentration in each of the $p^+$-type latch-up preventing regions PLP. The $p^+$-type body contact region PBC and the $p^+$-type latch-up preventing region PLP form the $p^+$-type semiconductor region PR.

The cross section shown in FIG. 22 is equivalent to the cross section along the line A-A in FIG. 3, i.e., the cross section shown in FIG. 4. On the other hand, in a cross section along the line B-B in FIG. 3, i.e., a cross section equivalent to the cross section shown in FIG. 5, the $p^+$-type semiconductor regions PR each including the $p^+$-type body contact region PBC and the $p^+$-type latch-up preventing region PLP are not formed. As a consequence, the cross section along the line B-B in FIG. 3 remains unchanged from the cross section shown in FIG. 20.

Accordingly, by performing the process step shown in FIG. 22, in the hybrid sub-cell region LCh1, in each of the portions of the p-type body region PB which are exposed in the individual contact trenches CT, the plurality of $p^+$-type semiconductor regions PR are formed. In the hybrid sub-cell region LCh1, the plurality of pt-type semiconductor regions PR are arranged along the Y-axis direction in plan view to be spaced apart from each other.

Also, by performing the process step shown in FIG. 22, in the hybrid sub-cell region LCH2, in the portions of the p-type body region PB which are exposed in the individual contact trenches CT, the plurality of $p^+$-type semiconductor regions PR are formed. In the hybrid sub-cell region LCh2, the plurality of type semiconductor regions PR are arranged along the Y-axis direction in plan view to be spaced apart from each other.

That is, by performing the process step shown in FIG. 22, in the portion of the semiconductor layer SLn which is located between the trenches T1 and T2, the plurality of $p^+$-type semiconductor regions PR are each formed to be in contact with the p-type body region PB. Also, in the portion of the semiconductor layer SLn which is located between the trenches T1 and T3, the plurality of $p^+$-type semiconductor regions PR are each formed to be in contact with the p-type body region PB. In each of the hybrid sub-cell regions LCh1 and LCh2, the p-type impurity concentration in each of the plurality of $p^+$-type semiconductor regions PR is higher than the p-type impurity concentration in the p-type body region PB.

In the manufacturing process of the semiconductor device in Embodiment 1, the plurality of contact trenches CT are formed to be arranged along the Y-axis direction in plan view and spaced apart from each other. Then, using the interlayer insulating film IL formed with the plurality of contact trenches CT as a mask, the plurality of $p^+$-type semiconductor regions PR can be formed to be arranged along the Y-axis direction in plan view and spaced apart from each other. Accordingly, in the manufacturing process of the semiconductor device in Embodiment 1, an additional mask for forming the plurality of $p^+$-type semiconductor regions PR need not be provided and additional lithography for forming the plurality of $p^+$-type semiconductor regions PR need not be performed.

Figure 23:
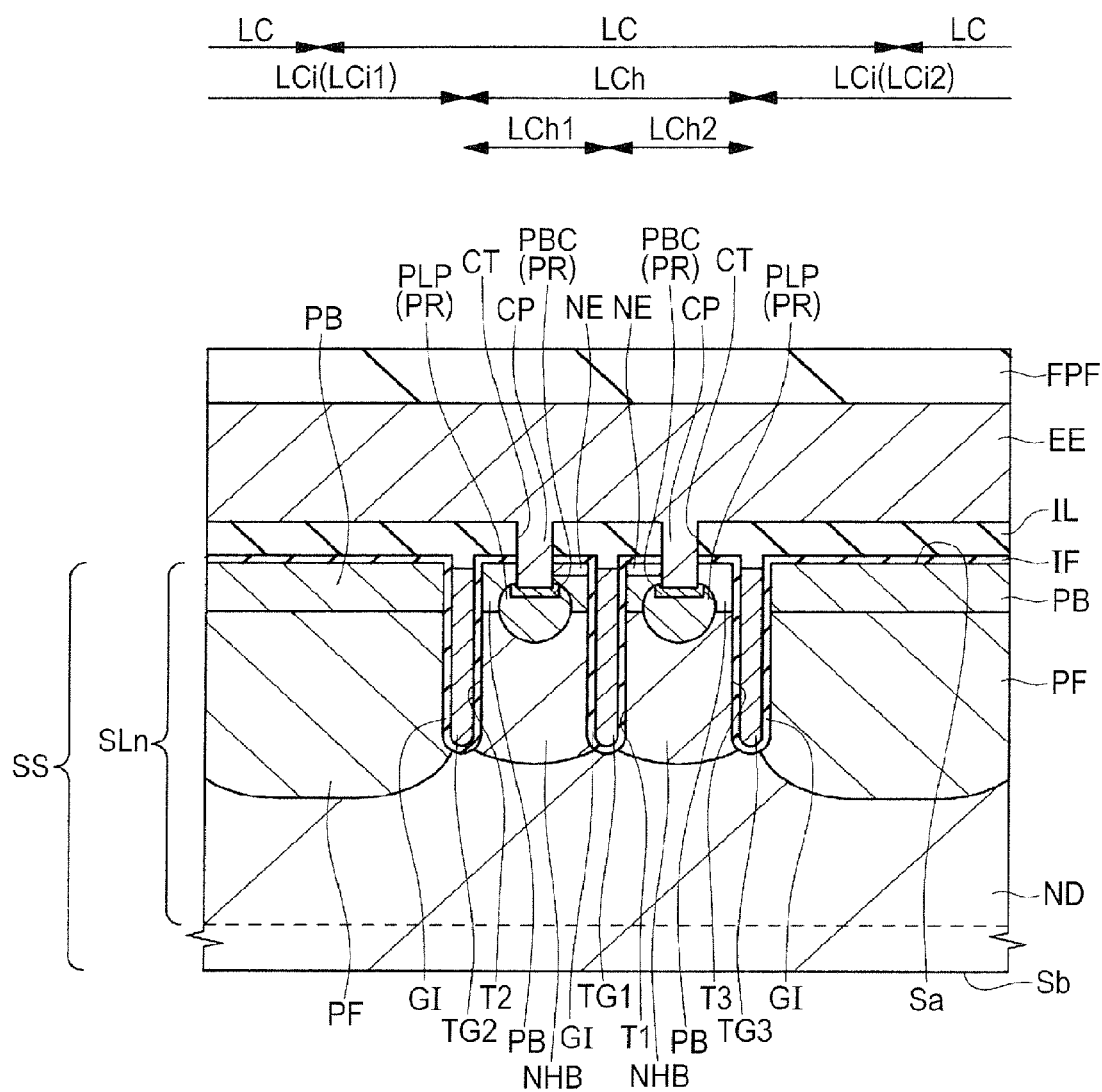
FIG. 23 is a main-portion cross-sectional view showing the manufacturing process of the semiconductor device in Embodiment 1.

Next, as shown in FIG. 23, the emitter electrode EE is formed. Specifically, the formation of the emitter electrode EE is performed in accordance with, e.g., the following procedure. First, over the upper surface Sa of the semiconductor substrate SS, a TiW film is formed as a barrier metal film by, e.g., sputtering. The TiW film has a thickness of, e.g., about 0.2 lam. The major part of titanium in the TiW film moves to the silicon interface as a result of subsequent heat treatment to form a silicide and contribute to an improvement in contact characteristic. However, such a process is intricate and is therefore not shown in the drawing.

Next, silicide anneal is performed for about 10 minutes in a nitrogen atmosphere at, e.g., about 600° C. Then, over the entire upper surface of the barrier metal film, an aluminum-based metal film (which contains several percent of added silicon and the remaining part of which is aluminum) is formed by, e.g., sputtering so as to be embedded in the contact trenches CT. The aluminum-based metal film has a thickness of, e.g., about 5 μm.

Next, by typical lithography, a resist film (the depiction thereof is omitted) for forming an emitter electrode is formed. Subsequently, the emitter electrode EE including the aluminum-based metal film and the barrier metal film is patterned by, e.g., dry etching. As a preferred example of a gas for the dry etching, e.g., a $Cl_2/BCl_3$ gas or the like can be shown. Then, the unneeded resist film for forming the emitter electrode is removed by asking or the like.

Here, the cross section shown in FIG. 23 is equivalent to the cross section along the line A-A in FIG. 3, i.e., the cross section shown in FIG. 4. On the other hand, in the cross section along the line B-B in FIG. 3, the contact trenches CT are not formed so that a cross section as shown in FIG. 5 is obtained.

By performing the process step shown in FIG. 23, in the hybrid sub-cell region LCh1, the plurality of coupling electrodes CP embedded individually in the plurality of contact trenches CT and the emitter electrode EE formed over the interlayer insulating film IL are formed. In the hybrid sub-cell region LCh1, the plurality of coupling electrodes CP are arranged along the Y-axis direction in plan view to be spaced apart from each other. Also, by performing the process step shown in FIG. 23, in the hybrid sub-cell region LCh2, the plurality of coupling electrodes CP embedded individually in the plurality of contact trenches CT and the emitter electrode EE formed over the interlayer insulating film IL are formed. In the hybrid sub-cell region LCh2, the plurality of coupling electrodes CP are arranged along the Y-axis direction in plan view to be spaced apart from each other.

The emitter electrode EE is electrically coupled to the type emitter regions NE and the plurality of $p^+$-type semiconductor regions PR which are formed in each of the hybrid sub-cell regions LCh1 and LCh2 via the plurality of coupling electrodes CP formed in the hybrid sub-cell region. Note that, when the emitter electrode EE is formed, the gate electrode GE (see FIG. 1) electrically coupled to the trench gate electrode TG1 may also be formed.

Note that, when the emitter electrode EE is formed in the cell formation area AR1 (see FIG. 2), the gate wire GL and the gate electrode GE (see FIG. 1) can be formed in the gate-wire-pull-out area AR2 (see FIG. 2).

Next, as shown in FIG. 23, over the emitter electrode EE, the insulating film FPF is formed as a passivation film made of an organic film containing, e.g., polyimide as a main component or the like. The insulating film FPF has a thickness of, e.g., about 2.5 μm.

Next, by typical lithography, a resist film (the depiction thereof is omitted) for forming openings is formed. Next, the insulating film FPF is patterned by, e.g., dry etching to be formed with the opening OP (see FIG. 1) extending through the insulating film FPF to reach the emitter electrode EE and form the emitter pad EP (see FIG. 1) made of the portion of the emitter electrode EE which is exposed in the opening OP1. Then, by asking or the like, the unneeded resist film for forming the openings is removed.

Note that, when the insulating film FPF is formed over the emitter electrode EE in the cell formation area AR1 (see FIG. 1), the insulating film FPF is formed over the gate electrode GE (see FIG. 1) in the gate-wire-lead-out area AR2 (see FIG. 1). Also, when the opening OP1 is formed in the cell formation area AR1 (see FIG. 1), the opening OP2 (see FIG. 1) is formed in the gate-wire-lead-out area AR2 (see FIG. 1) to extend through the insulating film FPF and reach the gate electrode GE, and the gate pad GP made of the portion of the gate electrode GE which is exposed in the opening OP2 is formed.

Figure 24:
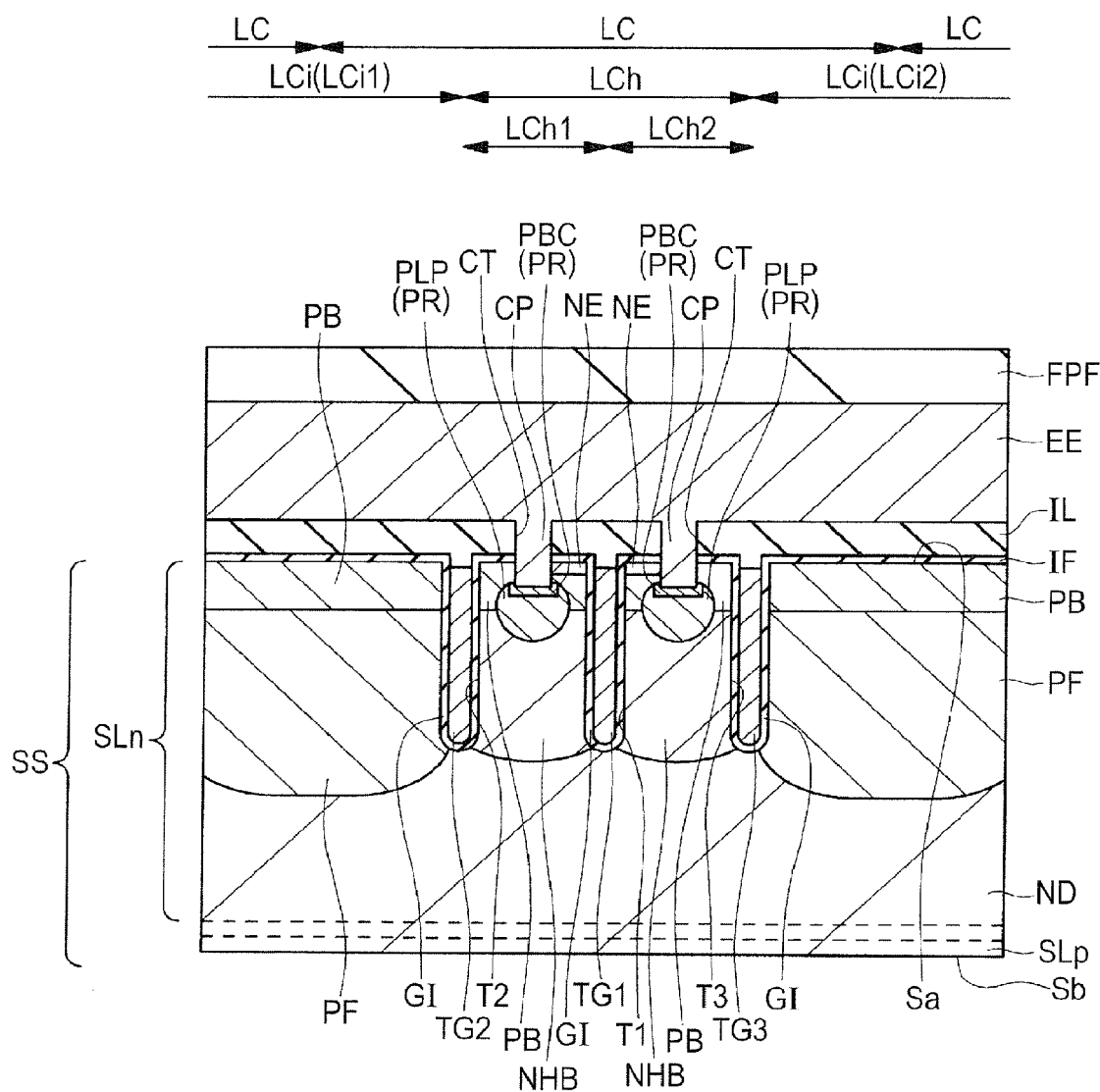
FIG. 24 is a main-portion cross-sectional view showing the manufacturing process of the semiconductor device in Embodiment 1.

Next, as shown in FIG. 24, back grinding treatment is performed on the lower surface Sb of the semiconductor substrate SS to reduce a thickness of, e.g., about 800 μm to, e.g., about 30 to 200 μm as necessary. When a breakdown voltage is, e.g., about 600 V, a final thickness is about 70 μm. Thus, in the portion of the thinned semiconductor substrate SS which is located closer to the lower surface Sb than the semiconductor layer SLn, the semiconductor layer SLp is formed. In addition, chemical etching or the like for removing damage to the lower surface Sb or the like is also performed as necessary.

In the thinned semiconductor substrate SS, a semiconductor layer which is closer to the lower surface Sb than the semiconductor layer where the n-type field stop region Ns (see FIG. 4) is to be formed and in which the $p^+$-type collector region CL (see FIG. 4) is to be formed is assumed to be the semiconductor layer SLp.

Next, as shown in FIG. 4, into the lower surface Sb of the semiconductor substrate SS, an n-type impurity is introduced by, e.g., ion implantation to form the n-type field stop region Ns.

Here, as a preferred example of conditions for the ion implantation, ion implantation conditions such that, e.g., an ion species is phosphorus (P), a dose is about $7 \times 10^{12}$ cm$^2$, and an implantation energy is about 350 KeV can be shown. Then, as necessary, laser anneal or the like is performed on the lower surface Sb of the semiconductor substrate SS so as to activate the impurity.

Next, into the lower surface Sb of the semiconductor substrate SS, a p-type impurity is introduced by, e.g., ion implantation to form the $p^+$-type collector region CL. Here, as a preferred example of conditions for the ion implantation, ion implantation conditions such that, e.g., an ion species is boron (B), a dose is about $1 \times 10^{13}$ cm$^{-2}$, and an implantation energy is about 40 KeV can be shown. Then, as necessary, laser anneal or the like is performed on the lower surface Sb of the semiconductor substrate SS so as to activate the impurity.

That is, in the step of forming the $p^+$-type collector region CL, the p-type semiconductor layer SLp is formed in the portion of the semiconductor substrate SS which is located closer to the lower surface Sb than the semiconductor layer SLn. The $p^+$-type collector region CL is formed of the p-type semiconductor layer SLp.

Next, by, e.g., sputtering, over the lower surface Sb of the semiconductor substrate SS, the collector electrode CE electrically coupled to the semiconductor layer SLp, i.e., the p'-type collector region CL is formed. Then, by dicing or the like, the semiconductor substrate SS is divided by dicing or the like into chip regions, each of which is encapsulated in a package as necessary to complete the semiconductor device in Embodiment 1.

<Semiconductor Device in Comparative Example 1>

Next, a description will be given of a semiconductor device in Comparative Example 1. The semiconductor device in Comparative Example 1 includes an IGBT having a GG-type (gate-gate-type) active cell region. Note that the possession of the GG-type active cell region by the IGBT means that each of two trench gate electrodes located to be spaced apart from each other in the active cell region is electrically coupled to the gate electrode.

Figure 25:
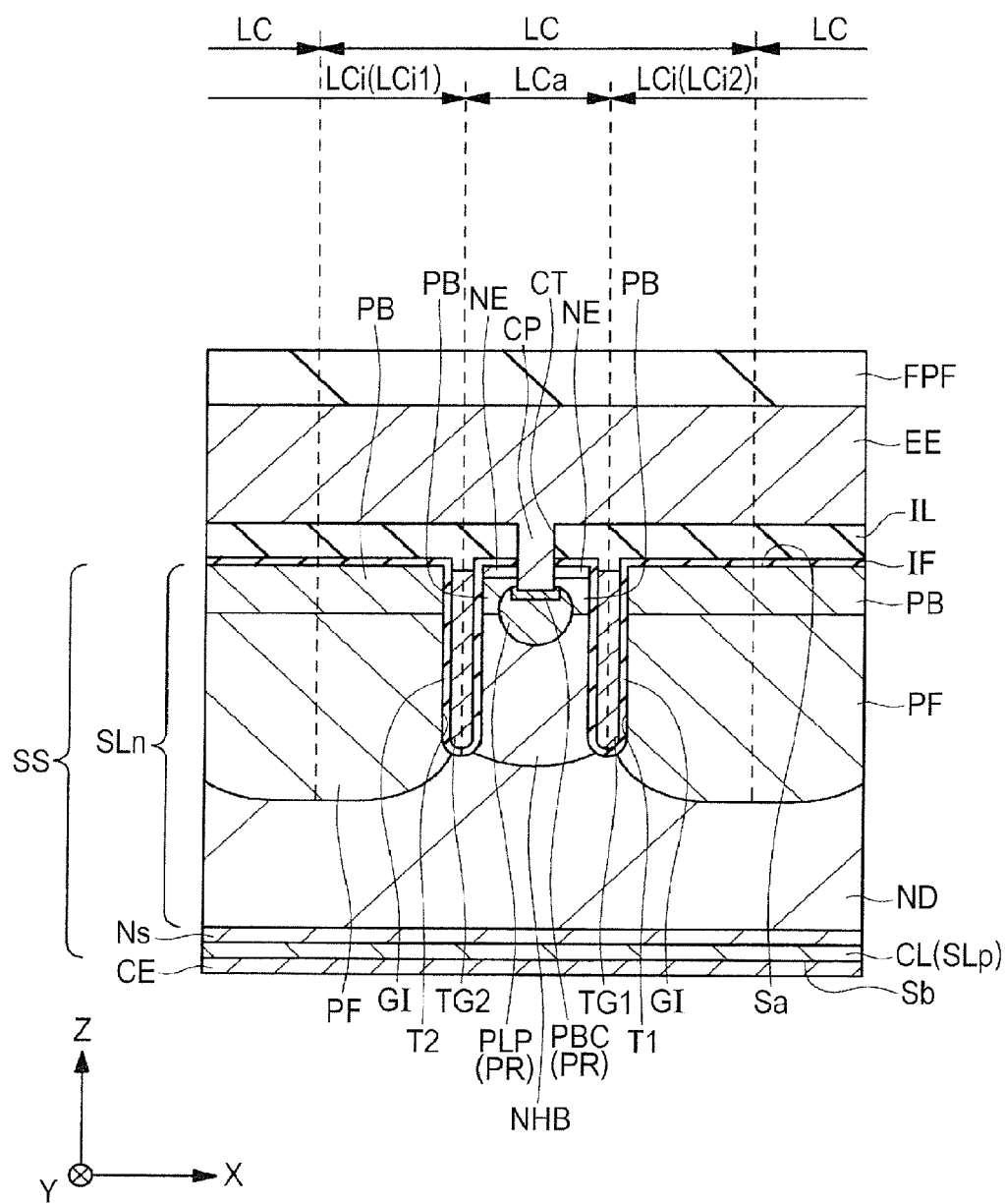
FIG. 25 is a main-portion cross-sectional view of a semiconductor device in Comparative Example 1.

FIG. 25 is a main-portion plan view of the semiconductor device in Comparative Example 1.

In the semiconductor device in Comparative Example 1, each of the unit cell regions LC includes a GG-type active cell region LCa and the two inactive cell regions LCi. That is, in the semiconductor device in Comparative Example 1, the unit cell region LC includes the GG-type active cell region LCa instead of the hybrid cell region LCh as the EGE-type active cell region in the semiconductor device in Embodiment 1.

The two unit cell regions LC adjacent to each other in an X-axis direction share the one inactive cell region LCi. Accordingly, each of the unit cell regions LC has the positive half portion LCi1 of the inactive cell region LCi which is located on the negative side of the active cell region LCa in the X-axis direction to be adjacent thereto. The unit cell region LC also has the negative half portion LCi2 of the inactive cell region LCi which is located on the positive side of the active cell region LCa in the X-axis direction to be adjacent thereto.

The active cell region LCa is the same as the hybrid sub-cell region LCh1 in the semiconductor device in Embodiment 1 except that the $n^+$-type emitter regions NE are located on both sides of the coupling electrode CP interposed therebetween. The active cell region LCa includes the trench gate electrodes TG1 and TG2. The trench gate electrode TG1 is interposed between the active cell region LCa and the portion LCi2 of the inactive cell region LCi. The trench gate electrode TG2 is located between the active cell region LCa and the portion LCi1 of the inactive cell region LCi. Note that, in Comparative Example 1, not only the trench gate electrode TG1, but also the trench gate electrode TG2 is electrically coupled to the gate electrode GE (see FIG. 1).

The $n^+$-type emitter regions NE are formed in the portion of the semiconductor layer SLn which is located between the trenches T1 and T2 and located on both sides of the coupling electrode CP interposed therebetween. That is, as the $n^+$-type emitter regions NE, not only a region in contact with the p-type body region PB and with the gate insulating film IG formed over the inner wall of the trench T1, but also a region in contact with the p-type body region PB and with the gate insulating film GI formed over the inner wall of the trench T2 is formed.

<Semiconductor Device in Comparative Example 2>

Next, a description will be given of a semiconductor device in Comparative Example 2. The semiconductor device in Comparative Example 2 includes an IGBT having an EGE-type active cell region.

Figure 26:
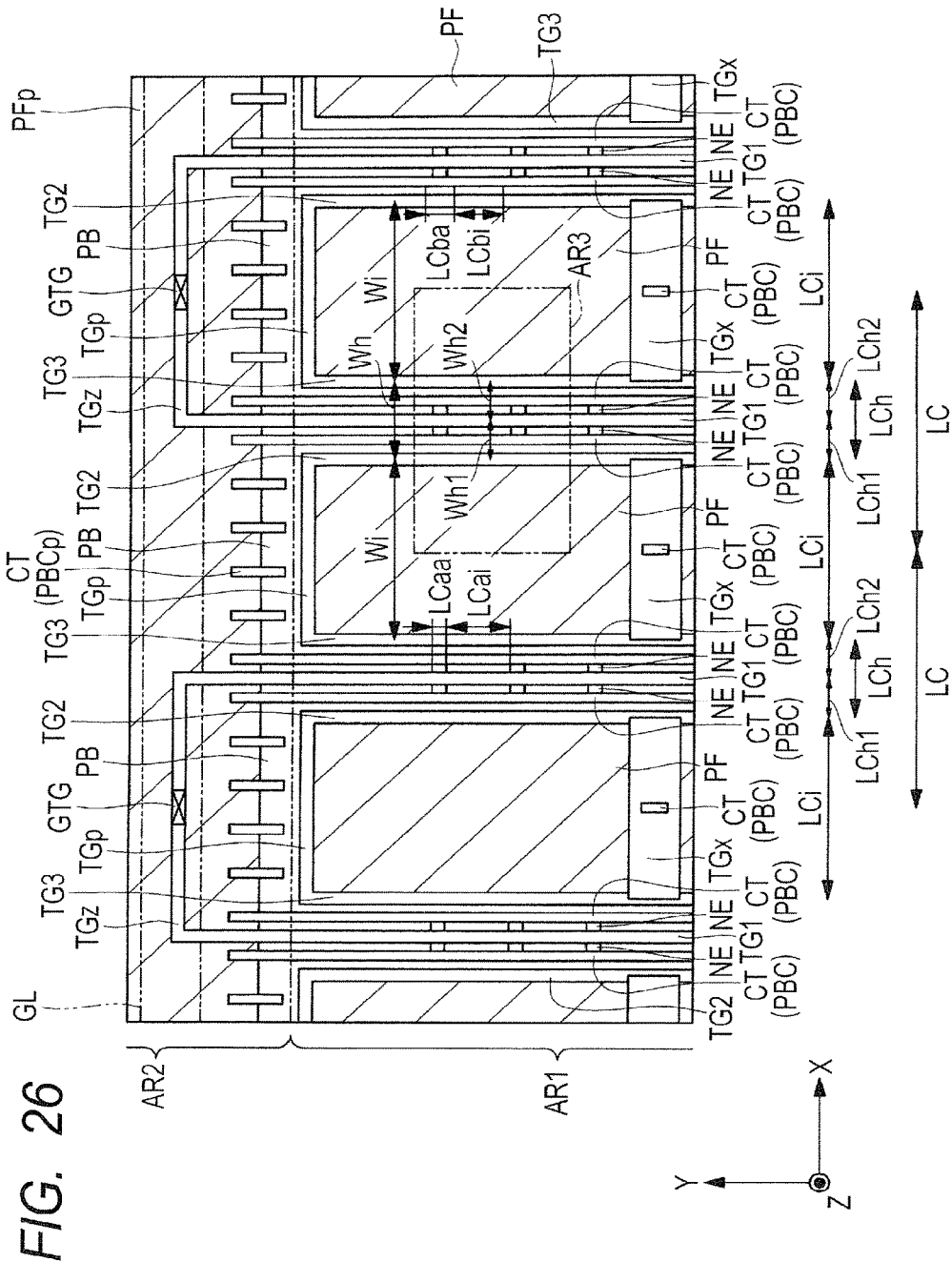
FIG. 26 is a main-portion plan view of a semiconductor device in Comparative Example 2.
Figure 27:
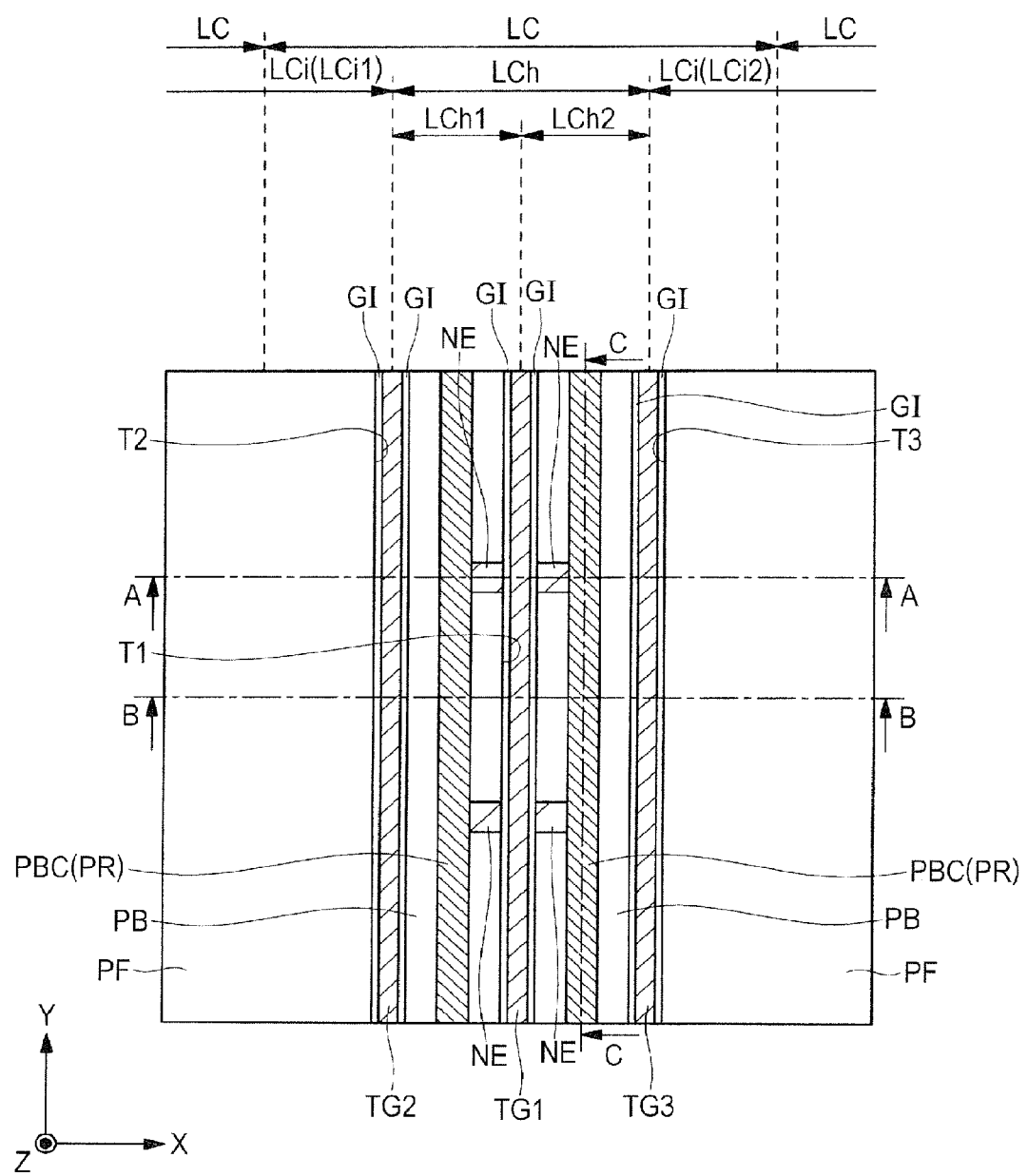
FIG. 27 is a main-portion plan view of the semiconductor device in Comparative Example 2.
Figure 28:
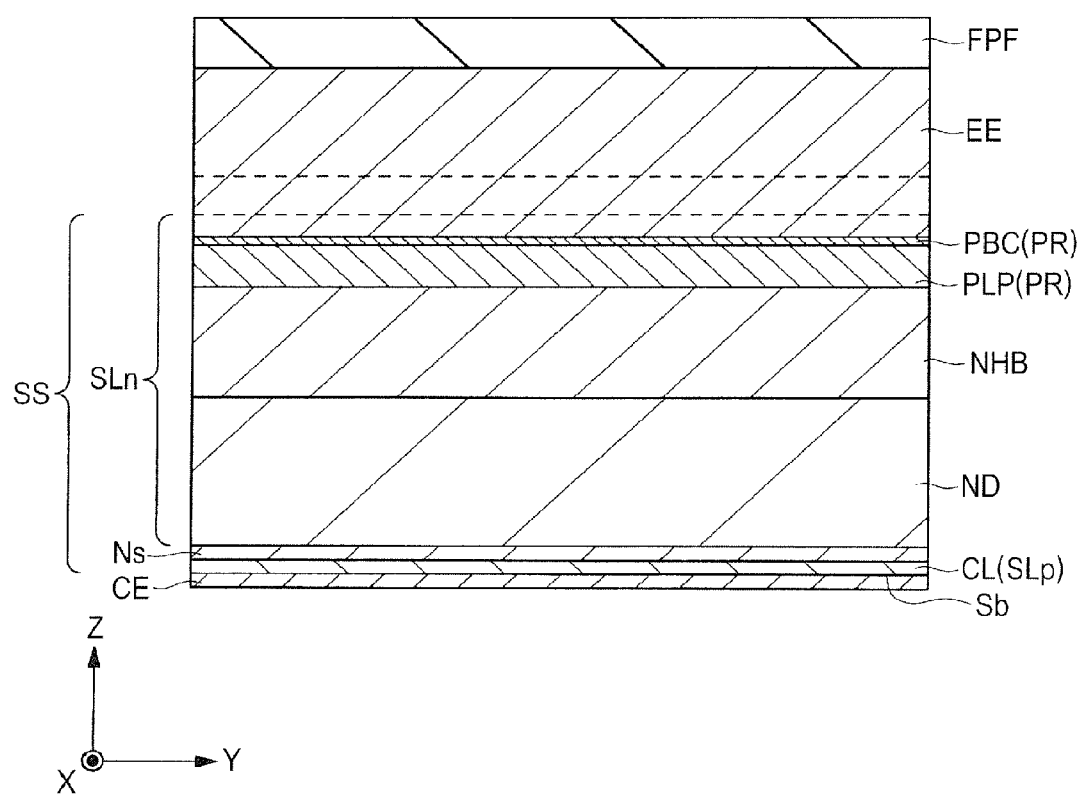
FIG. 28 is a main-portion cross-sectional view of the semiconductor device in Comparative Example 2.

FIGS. 26 and 27 are main-portion plan views of the semiconductor device in Comparative Example 2. FIG. 28 is a main-portion cross-sectional view of the semiconductor device in Comparative Example 2. FIG. 28 is a cross-sectional view along the line C-C in FIG. 27. Note that a cross-sectional view along the line A-A in FIG. 27 is the same as the cross-sectional view shown in FIG. 4. Also, a cross-sectional view along the line B-B in FIG. 27 is the same as the cross-sectional view shown in FIG. 4 except that the $n^+$-type emitter regions NE are not provided.

In the semiconductor device in Comparative Example 2, in the same manner as in the semiconductor device in Embodiment 1, each of the unit cell regions LC includes the hybrid cell region LCh as an active cell region and the two inactive cell regions LCi. Also, in the semiconductor device in Comparative Example 2, in the same manner as in the semiconductor device in Embodiment 1, the plurality of $n^+$-type emitter regions NE are formed in each of the hybrid sub-cell regions LCh1 and LCh2.

On the other hand, in Comparative Example 2, unlike in Embodiment 1, in the hybrid sub-cell region LCh1, the $p^+$-type semiconductor regions PR are formed continuously along the Y-axis direction. The plurality of $p^+$-type semiconductor regions PR are arranged along the Y-axis direction in plan view to be spaced apart from each other. Also, in the hybrid sub-cell region LCh1, the contact trenches CT as openings are formed continuously along the Y-axis direction in the p-type body region PB. The contact trenches CT reach the $p^+$-type body contact region PBC located in the hybrid sub-cell region LCh1.

Also, in Comparative Example 2, unlike in Embodiment 1, in the hybrid sub-cell region LCh2, the $p^+$-type semiconductor regions PR are formed continuously along the Y-axis direction. The plurality of $p^+$-type semiconductor regions PR are arranged along the Y-axis direction in plan view to be spaced apart from each other. Also, in the hybrid sub-cell region LCh2, the contact trenches CT as the openings are formed continuously along the Y-axis direction in the p-type body region PB. The contact trenches CT reach the $p^+$-type body contact region PBC located in the hybrid sub-cell region LCh2.

<About Advantage of Semiconductor Device in Comparative Example 2>

Next, a description will be given of the advantage of the semiconductor device in Comparative Example 2 over the semiconductor device in Comparative Example 1.

Figure 29:
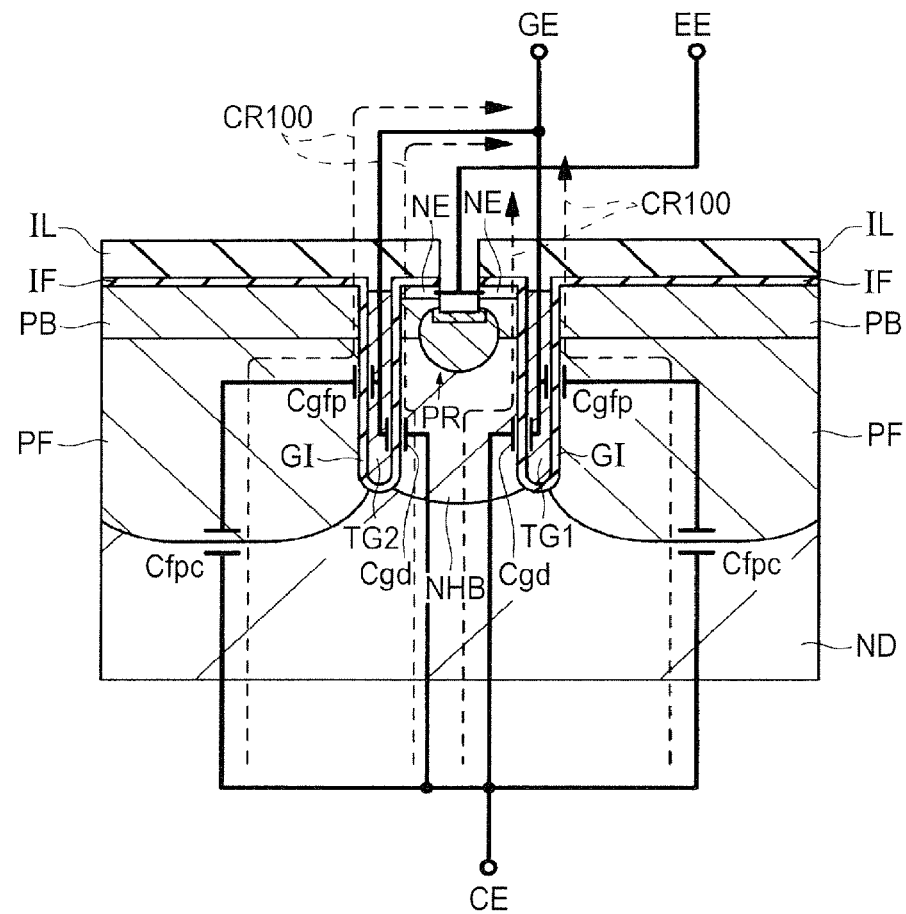
FIG. 29 is a cross-sectional view showing displacement current paths when the semiconductor device in Comparative Example 1 is turned ON in overlapping relation.
Figure 30:
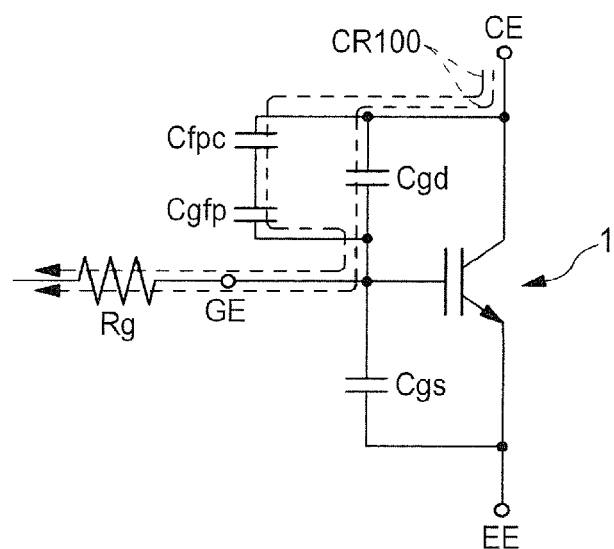
Figure 31:
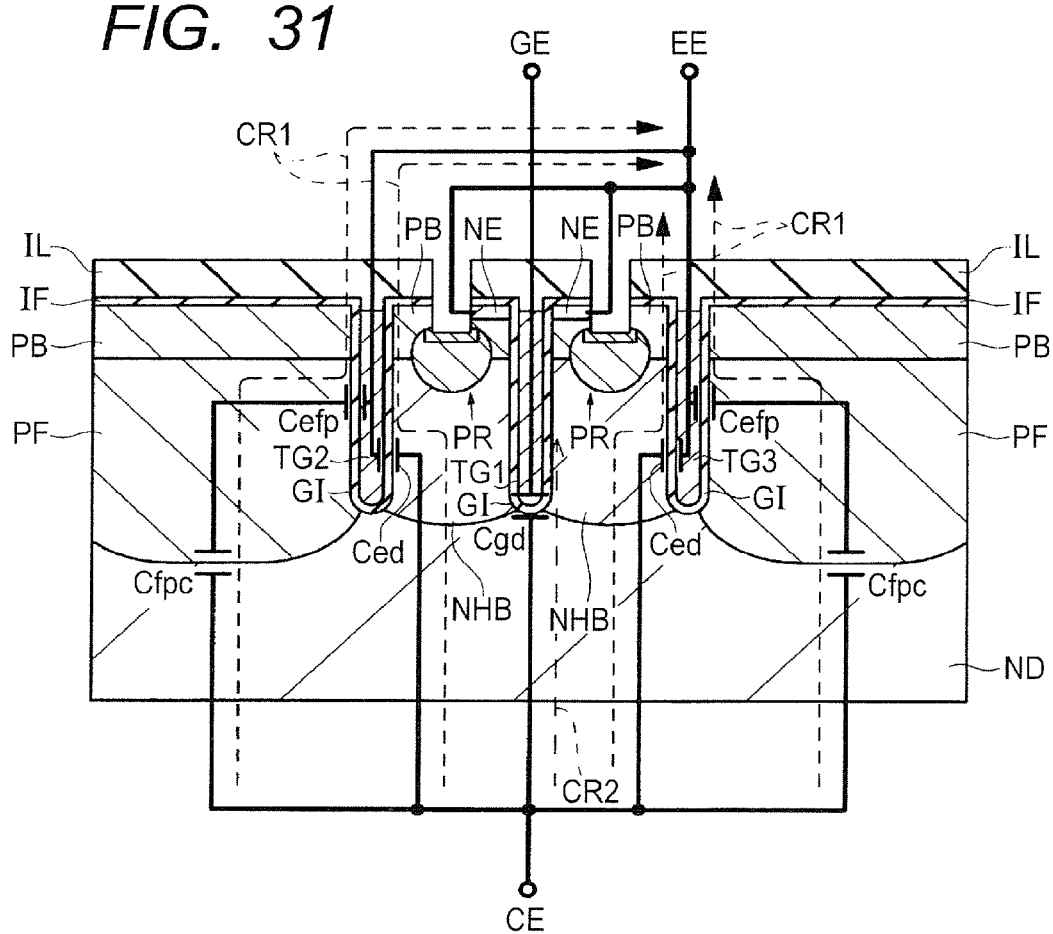
FIG. 31 is a cross-sectional view showing displacement current paths when the semiconductor device in Comparative Example 2 is turned ON in overlapping relation.
Figure 32:
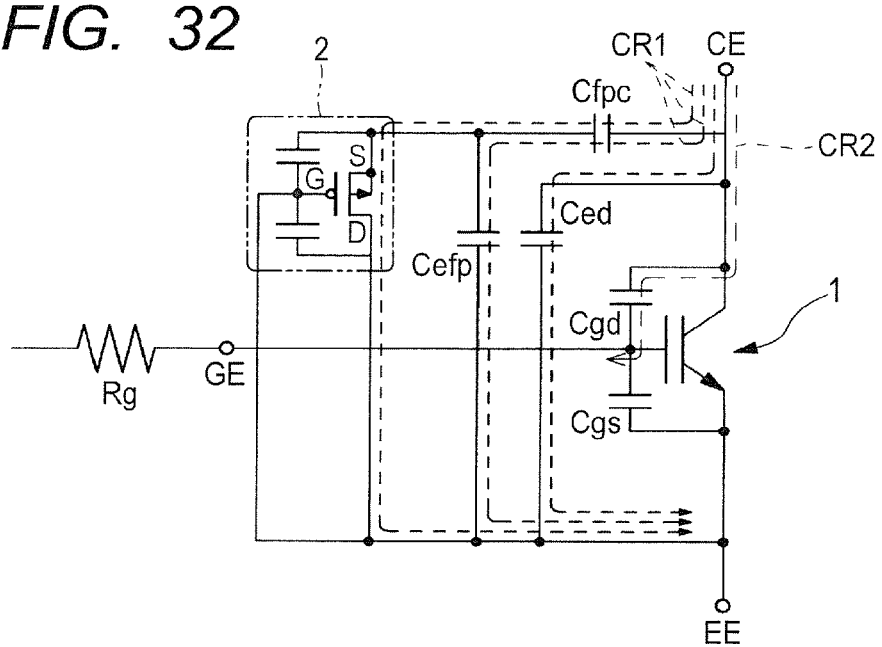

FIG. 29 is a cross-sectional view showing displacement current paths resulting from the charging up of a floating region due to the storage of carriers (holes) when the semiconductor device in Comparative Example 1 is turned ON in overlapping relation. FIG. 30 is an equivalent circuit diagram showing the displacement current paths resulting from the charging up of the floating region due to the storage of carriers (holes) when the semiconductor device in Comparative Example 1 is turned ON. FIG. 31 is a cross-sectional view showing displacement current paths resulting from the charging up of a floating region due to the storage of carriers (holes) when the semiconductor device in Comparative Example 2 is turned ON in overlapping relation. FIG. 32 is an equivalent circuit diagram showing the displacement current paths resulting from the charging up of the floating region due to the storage of carriers (holes) when the semiconductor device in Comparative Example 2 is turned ON.

Note that displacement current paths resulting from a rise in collector voltage at a turn-OFF time are the same displacement current paths as the displacement current paths at the turn-ON time shown in FIGS. 29 to 32, except that the directions of the arrows showing the displacement currents are opposite.

As shown in FIGS. 29 and 30, in the semiconductor device in Comparative Example 1 including the IGBT having the GG-type active cell region, the p-type floating region PF is adjacent, via the gate insulating film GI, to each of the trench gate electrodes TG1 and TG2 coupled to the gate electrode GE. The semiconductor device in Comparative Example 1 can be represented by an equivalent circuit using an IGBT 1 including the collector electrode CE, the emitter electrode EE, the gate electrode GE, capacitances Cgd, Cgs, Cfpc, and Cgfp, and a resistance Rg coupled to the gate electrode GE. In the semiconductor device in Comparative Example 1, a displacement current CR100 generated in the unit cell region LC flows into the gate electrode GE. Accordingly, the displacement current CR100 exerts large influence on the potential of the gate electrode GE, i.e., gate potential.

On the other hand, as shown in FIGS. 31 and 32, in the semiconductor device in Comparative Example 2 including the EGE-type active cell region, the p-type floating region PF and the trench gate electrode TG1 coupled to the gate electrode GE are cut off by each of the trench gate electrodes TG2 and TG3 coupled to the emitter electrode EE and are not adjacent to each other. The semiconductor device in Comparative Example 2 can be represented by an equivalent circuit using the IGBT 1 including the collector electrode CE, the emitter electrode EE, the gate electrode GE, the capacitances Cgd, Cgs, Cfpc, Ced, and Cefp, and the resistance Rg coupled to the gate electrode GE. A displacement current CR1 generated in the unit cell region LC flows into the emitter electrode EE, but does not flow into the gate electrode GE. Accordingly, the displacement current CR1 exerts small influence on the potential of the gate electrode GE, i.e., gate potential.

In Comparative Example 1, the displacement current CR100 generated in the active cell region LCa may flow into the gate electrode GE via a feedback capacitance made of the capacitance Cgd shown in FIGS. 29 and 30. On the other hand, in Comparative Example 2, the displacement current CR2 generated in the hybrid cell region LCh may flow into the gate electrode GE via a feedback capacitance made of the capacitance Cgd shown in FIGS. 31 and 32. Accordingly, to reduce the influence exerted by each of the displacement currents on the potential of the gate electrode GE, the capacitance Cgd as the feedback capacitance needs to be minimized.

On the other hand, the semiconductor device in Comparative Example 2 having the EGE-type active cell region has the advantage of being able to reduce the capacitance Cgd as the feedback capacitance over the semiconductor device in Comparative Example 1 having the GG-type active cell region. Accordingly, a circuit formed of the semiconductor device in Comparative Example 2, such as an inverter circuit, has an advantage in that fluctuation is less likely to occur in the output of the circuit than in a circuit formed of the semiconductor device in Comparative Example 1, such as an inverter circuit.

Figure 33:
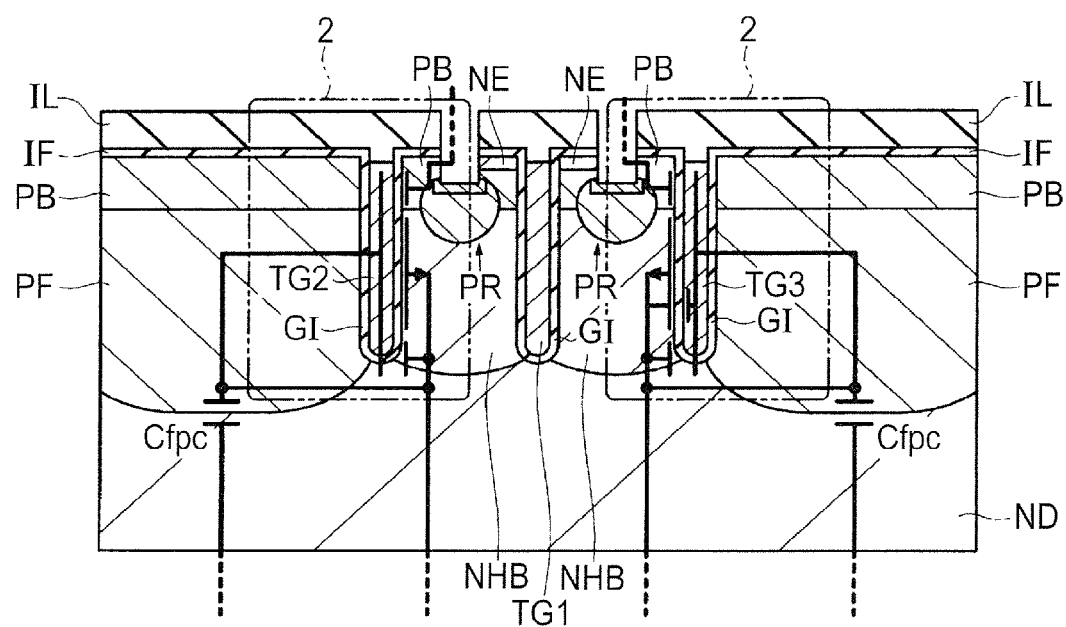
FIG. 33 is a cross-sectional view showing a p-channel parasitic MOSFET in the semiconductor device in Comparative Example 2.

Next, as shown in FIG. 32, a description will be given of the operation of a p-channel parasitic MOSFET (Metal Oxide Semiconductor Field Effect Transistor) 2 formed in the IGBT 1. FIG. 33 is a cross-sectional view showing a p-channel parasitic MOSFET in the semiconductor device in Comparative Example 2.

The following will describe an example in which the parasitic MOSFET is formed in the IGBT 1. However, it may also be possible that, in the IGBT 1, a parasitic MISFET made of any of various MISFETs (Metal Insulator Semiconductor Field Effect Transistors) other than a MOSFET is formed.

The following will consider an operation when the semiconductor device in Comparative Example 2 is turned OFF by L-load switching. When the semiconductor device in Comparative Example 2 is turned OFF by the L-load switching, a voltage VCE as a collector-emitter voltage rises upon the turning OFF. At this time, the conductivity type of the channel region of a p-channel parasitic MOSFET 2 is inverted to a p-type. Consequently, holes as the carriers stored in the p-type floating region PF and the n⁻-type drift region ND are discharged via the p-channel parasitic MOSFET 2. By the foregoing operation, the stored holes are promptly discharged so that the semiconductor device in Comparative Example 2 has the advantage of a higher switching speed over the semiconductor device in Comparative Example 1.

Next, a description will be given of a process in which the p-channel parasitic MOSFET 2 is brought into an ON state when the semiconductor device in Comparative Example 2 is turned OFF and the holes as the stored carriers are discharged. By way of example, the following will describe the result of calculation performed using TCAD (Technology Computer-Aided Design).

Figure 34:
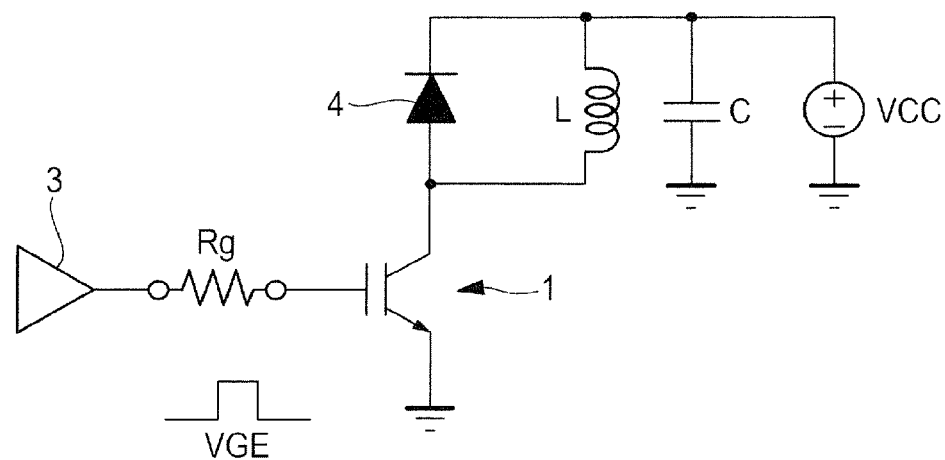
FIG. 34 is a circuit diagram showing an equivalent circuit in an L-load switching test.
Figure 35:
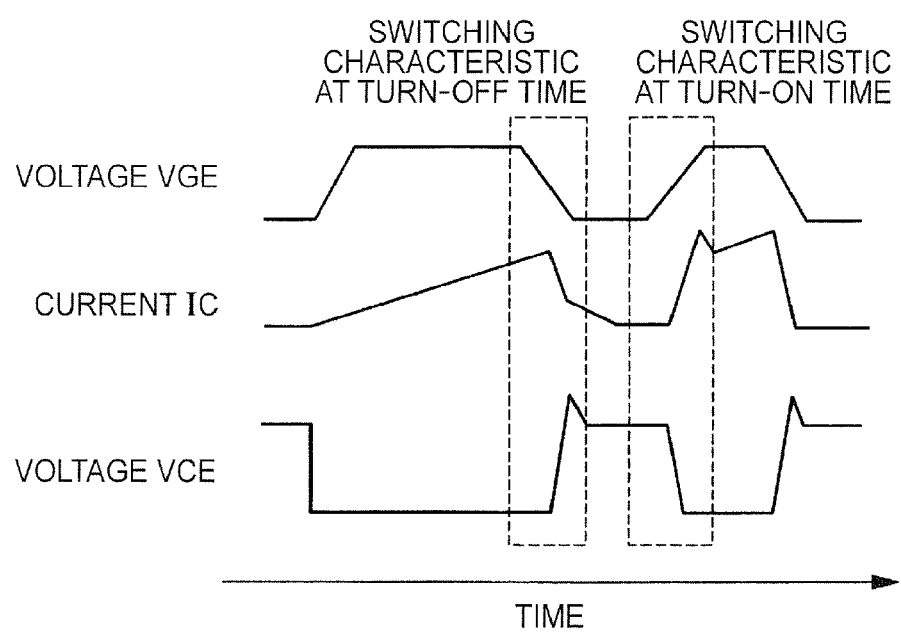
FIG. 35 is a view schematically showing a switching waveform in the L-load switching test.
Figure 36:
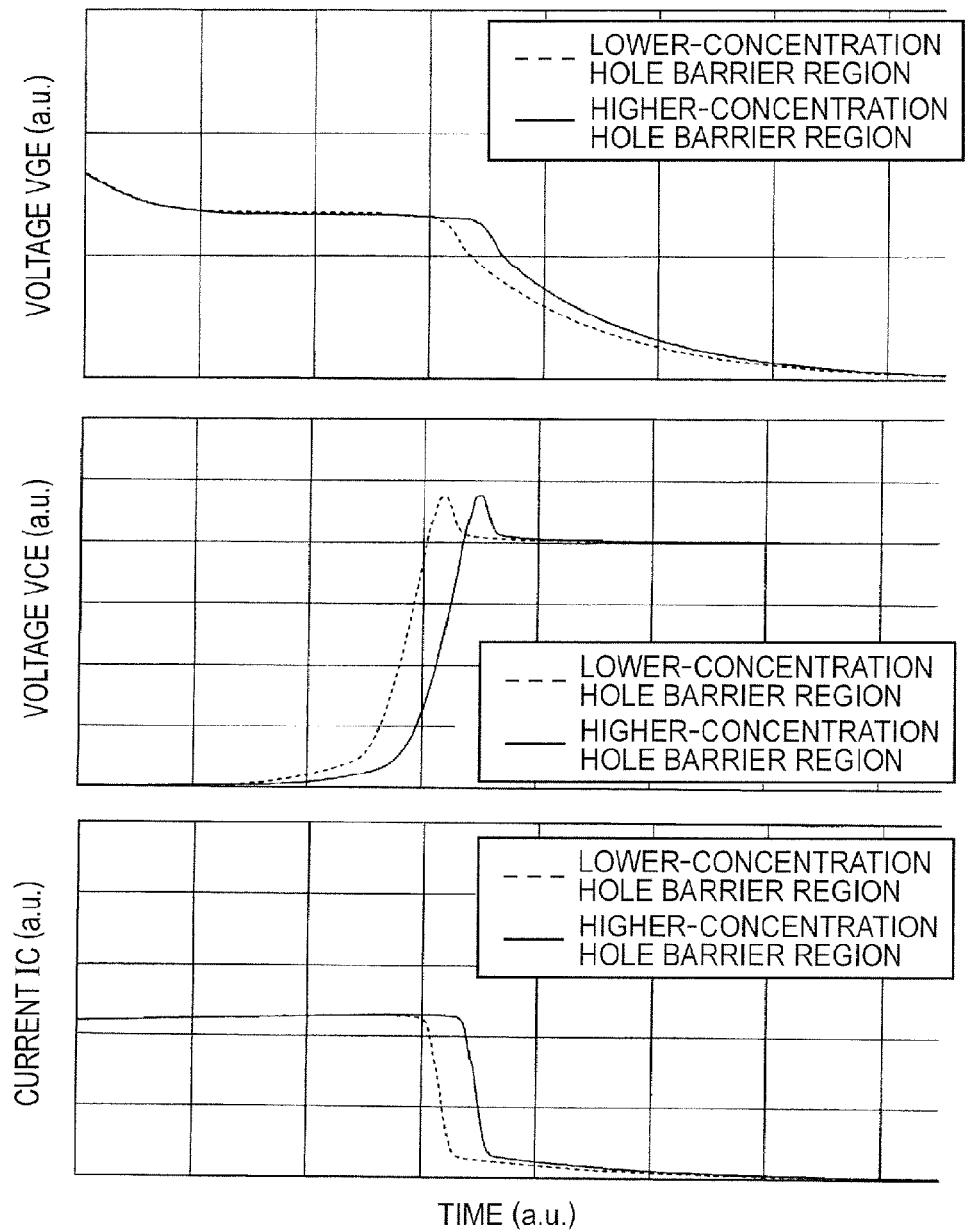
FIG. 36 is a graph showing a switching waveform when the semiconductor device in Comparative Example 2 is turned OFF.
Figure 37:
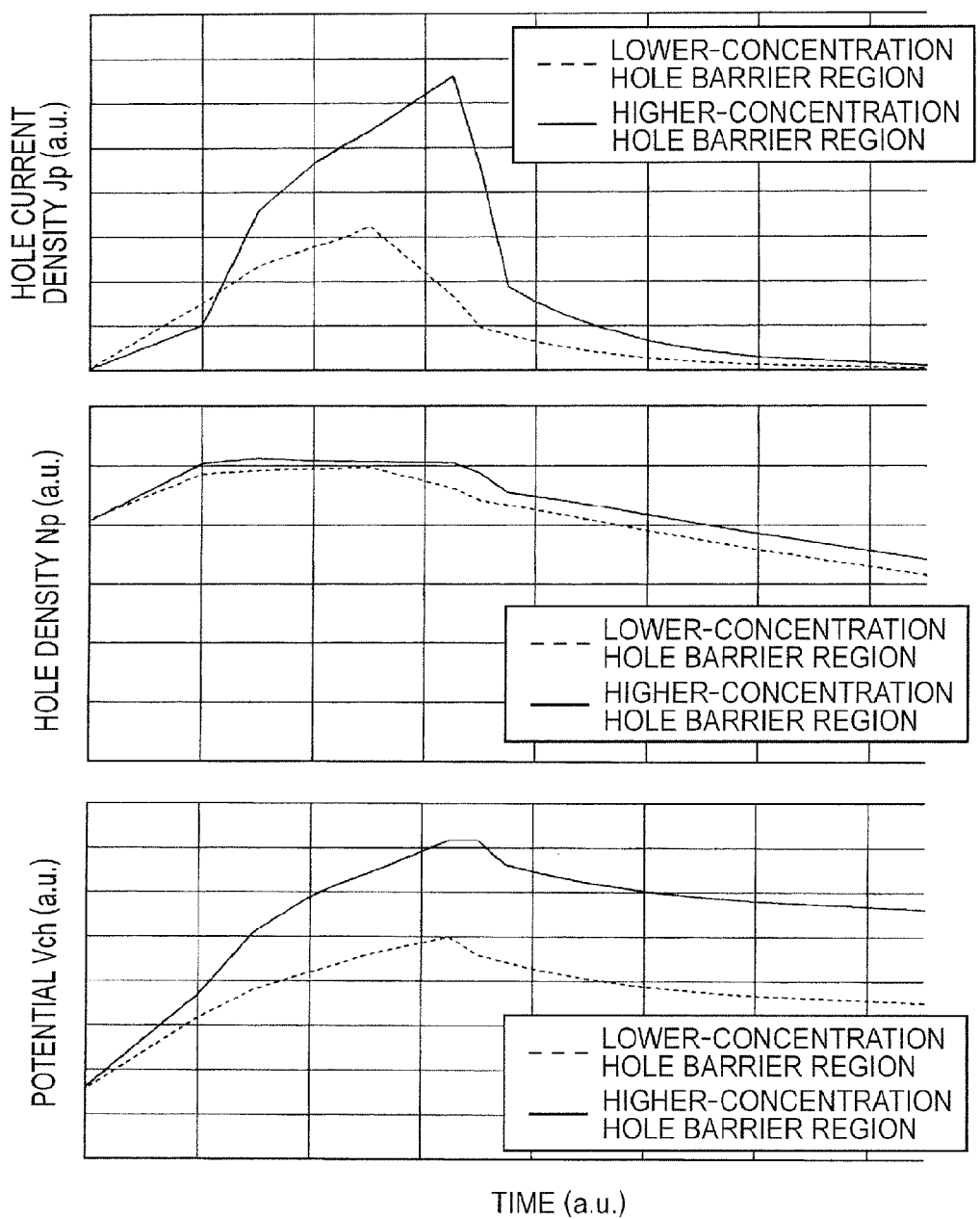
FIG. 37 is a graph showing a switching waveform when the semiconductor device in Comparative Example 2 is turned OFF.
Figure 38:
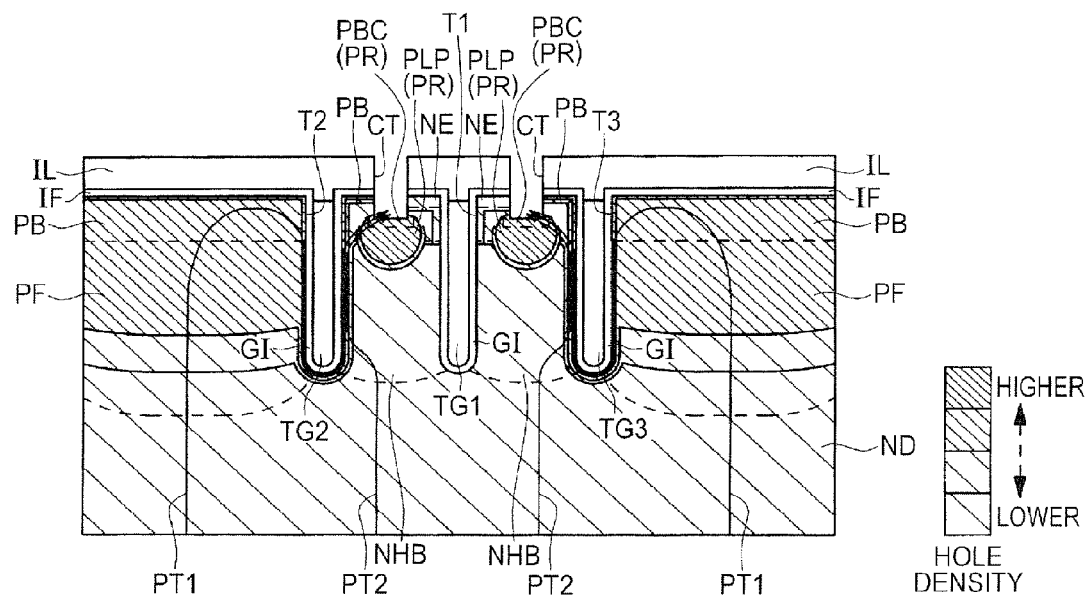
FIG. 38 is a cross-sectional view showing a hole density distribution when the semiconductor device in Comparative Example 2 is turned OFF.

FIG. 34 is a circuit diagram showing an equivalent circuit in an L-load switching test. FIG. 35 is a view schematically showing a switching waveform in the L-load switching test. FIGS. 36 and 37 are graphs showing switching waveforms when the semiconductor device in Comparative Example 2 is turned OFF. FIG. 38 is a cross-sectional view showing a hole density distribution when the semiconductor device in Comparative Example 2 is turned OFF.

Note that the results shown in FIGS. 36, 37, and 38 are obtained by calculation performed using the TCAD. The calculation using the TCAD was performed using the following numerical values, though the display of specific numerical values is omitted in the graphs of FIGS. 36, 37, and 38. That is, the impurity concentration in the n⁻-type drift region, i.e., the semiconductor layer SLn was set to $6.1 \times 10^{13}$ cm$^{-3}$. The thickness of the semiconductor layer SLn was set to 70 μm. The temperature was set to a room temperature. A power supply potential VCC (see FIG. 34) was set to 400 V. A current IC as a collector current was set to 50 A. An inductance L (see FIG. 34) was set to 200 pH. In addition, a voltage VGE as a gate-emitter voltage was varied between −15 V and +15 V.

FIG. 36 shows the time dependences of the voltage VGE as the gate-emitter voltage, the voltage VCE as the collector-emitter voltage, and the current IC as the collector current. FIG. 37 shows the time dependences of a hole current density Jp, a hole density Np, and a potential Vch as the potential of the channel region of the p-channel parasitic MOSFET. The abscissa axis in each of FIGS. 36 and 37 shows the same time range.

Note that FIGS. 36 and 37 show the time dependences in the two cases where the impurity concentration in each of the n-type hole barrier regions NHB is low and where the impurity concentration in each of the n-type hole barrier regions NHB is high. Since the influence of the impurity concentration in the re-type hole barrier region NHB will be described later, a description is given here of the case where the impurity concentration in the n-type hole barrier region NHB is low.

In an equivalent circuit at the time of L-load switching, a driver 3, the resistance Rg, the IGBT 1, a FRD (Fast Recovery Diode) 4, the inductance L, a capacitance C, and the power supply potential VCC are coupled to each other, as shown in FIG. 34.

As shown in FIG. 35, when the voltage VGE as a switching waveform including first and second two pulses is applied to the semiconductor device including the IGBT, the switching characteristic of the semiconductor device at a turn-OFF time is measured as the switching characteristic at a turn-ON time when the first pulse is applied.

As shown in FIG. 36, at the turn-OFF time, the voltage VCE rises as the voltage VGE drops and the current IC decreases. Also, as shown in FIG. 37, as the voltage VGE drops, the voltage VCE rises, and the current IC decreases, the potential Vch rises, the hole current density Jp increases, and the hole density Np increases. From the foregoing, it will be understood that, when the IGBT included in the semiconductor device is turned OFF, the potential of the channel region of the p-channel parasitic MOSFET rises to bring the parasitic MOSFET into the ON state and holes as carriers are discharged.

Also, in the hole density distribution shown in FIG. 38, the hole densities are higher in the respective portions of the p-type floating regions PF, the n-type hole barrier regions NHB, and the p-type body regions PB which are closer to the trenches T2 and T3 and lower in the respective portions of the p-type floating regions PF, the n-type hole barrier regions NHB, and the p-type body regions PB which are further away from the trenches T2 and T3, except in the p$^+$-type semiconductor regions PR where the hole densities are originally high.

Consequently, as shown in FIG. 38, a hole current flows through each of current paths PT1 each extending from the n$^-$-type drift region ND through the p-type floating region PF and also through the respective portions of the p-type floating region PF, the n-type hole barrier region NHB, and the p-type body region PB which are closer to the trenches T2 and T3. Also, as shown in FIG. 38, a hole current flows through each of current paths PT2 each extending from the n-type drift region ND through the n-type hole barrier region NHB and also through the respective portions of the n-type hole barrier region NHB and the p-type body region PB which are closer to the trenches T2 and T3.

<About Problems of Semiconductor Device in Comparative Example 2>

The semiconductor device including the IGBT having the EGE-type active cell region (semiconductor device in Comparative Example 2) also has problems which do not affect the semiconductor device including the IGBT having the GG-type active cell region (semiconductor device in Comparative Example 1). The following will describe the problems of the semiconductor device in Comparative Example 2 which do not affect the semiconductor device in Comparative Example 1.

First, a description will be given of a rise in ON voltage.

Figure 39:
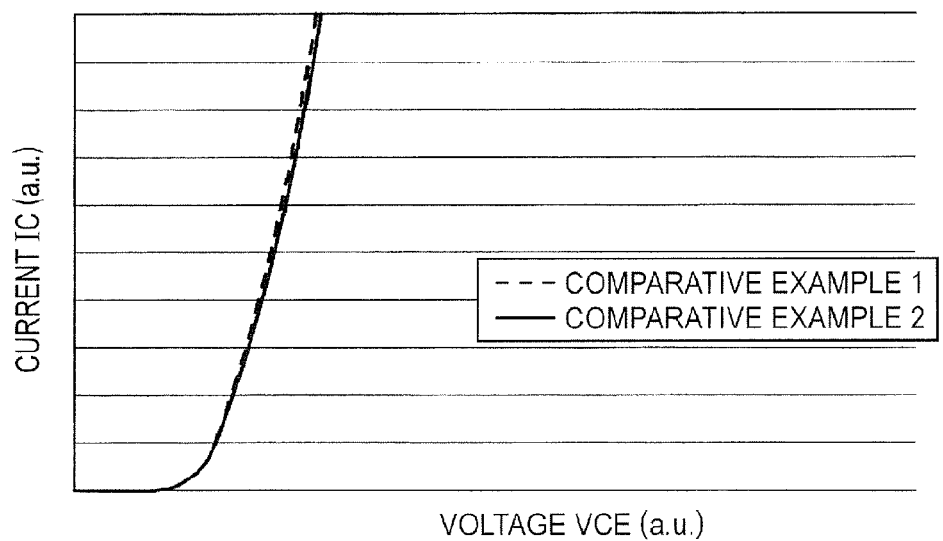
FIG. 39 is a graph showing the dependence of a collector current on a collector-emitter voltage in each of the semiconductor devices in Comparative Examples 1 and 2 in an ON state.
Figure 40:
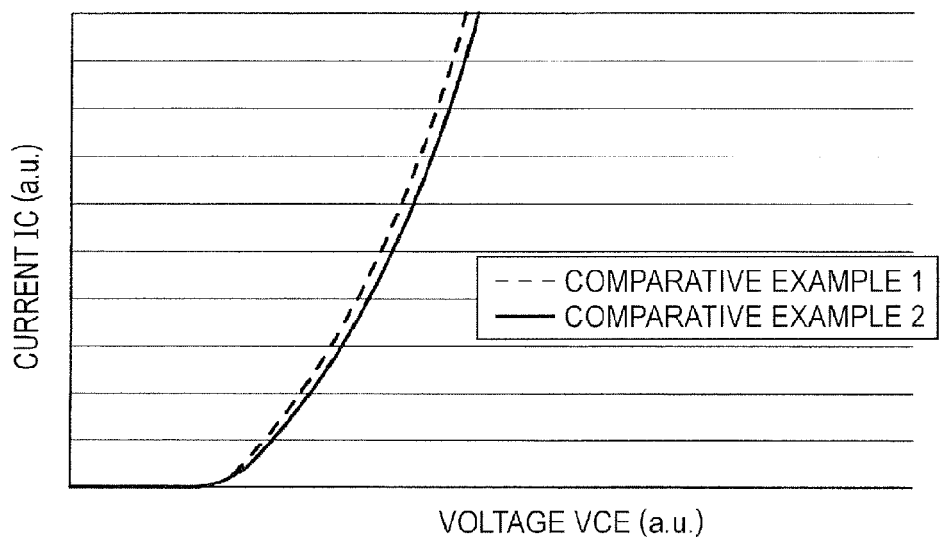
FIG. 40 is a graph showing the dependence of the collector current on the collector-emitter voltage in each of the semiconductor devices in Comparative Examples 1 and 2 in the ON state.
Figure 41:
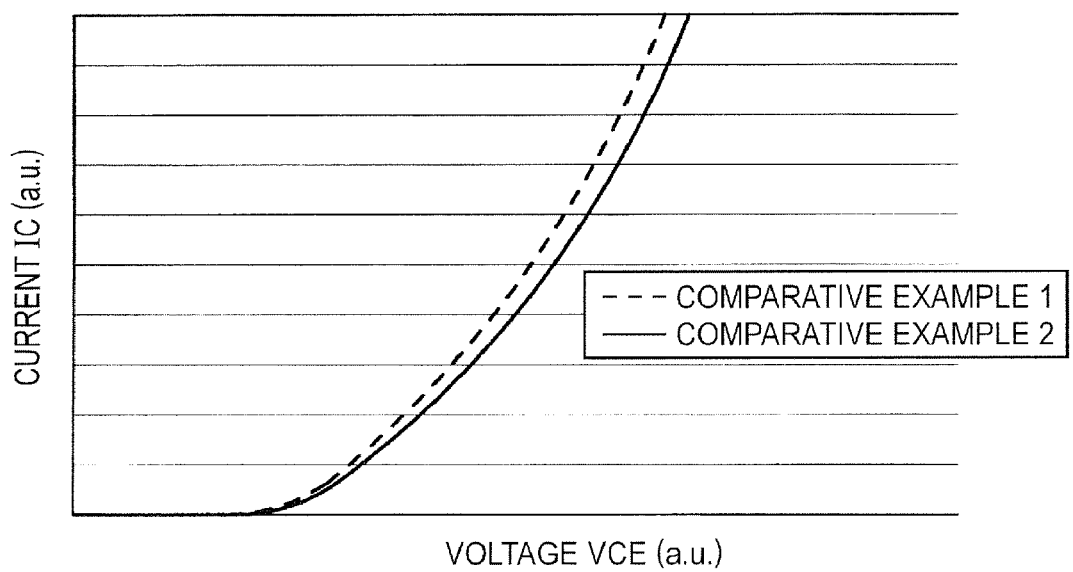
FIG. 41 is a graph showing the dependence of the collector current on the collector-emitter voltage in each of the semiconductor devices in Comparative Examples 1 and 2 in the ON state.

FIGS. 39 to 41 are graphs showing the collector-emitter voltage dependences of collector currents in the semiconductor devices in Comparative Examples 1 and 2 in the ON state. The abscissa axis in each of FIGS. 39 to 41 shows the voltage VCE as the collector-emitter voltage. The ordinate axis in each of FIGS. 39 to 41 shows the current IC as the collector current. Accordingly, each of FIGS. 39 to 41 shows a value at which the voltage VCE is saturated in the ON state, i.e., an ON voltage.

Also, each of FIGS. 39 to 41 shows the case where the thickness of the semiconductor layer SLn, i.e., the thickness of the n$^-$-type drift region ND was varied. FIG. 39 shows the case where the thickness of the semiconductor layer SLn was set to 70 μm. FIG. 40 shows the case where the thickness of the semiconductor layer SLn was set to 135 μm. FIG. 41 shows the case where the thickness of the semiconductor layer SLn was set to 180 μm. Note that, in the graphs of FIGS. 39 to 41, the display of specific numerical values is omitted and, in FIGS. 39 to 41, the abscissa axes and the ordinate axes have equal ranges.

When comparisons are made between FIGS. 39 to 41, it will be understood that the ON voltage of the semiconductor device in Comparative Example 2 is higher than the ON voltage of the semiconductor device in Comparative Example 1 irrespective the thickness of the semiconductor layer SLn, i.e., the thickness of the n$^-$-type drift region ND. Also, when comparisons are made between FIGS. 39 to 41, it will be understood that, as the thickness of the semiconductor layer SLn, i.e., the thickness of the n-type drift region ND is larger, the increment in the ON voltage of the semiconductor device in Comparative Example 2 is larger than the increment in the ON voltage of the semiconductor device in Comparative Example 1.

Figure 42:
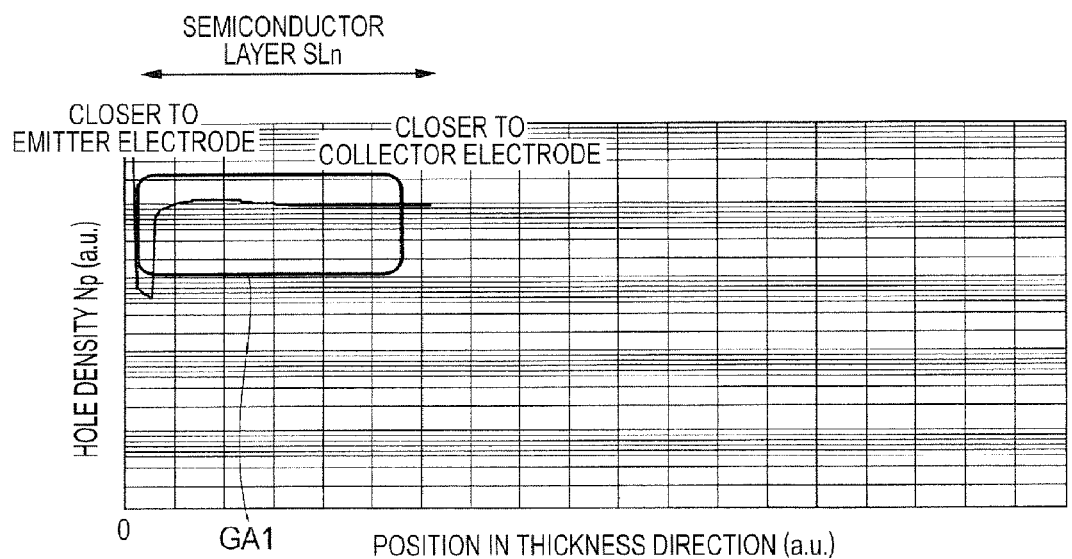
FIG. 42 is a graph showing a hole density distribution in a thickness direction in the semiconductor device in Comparative Example 1 in the ON state.
Figure 43:
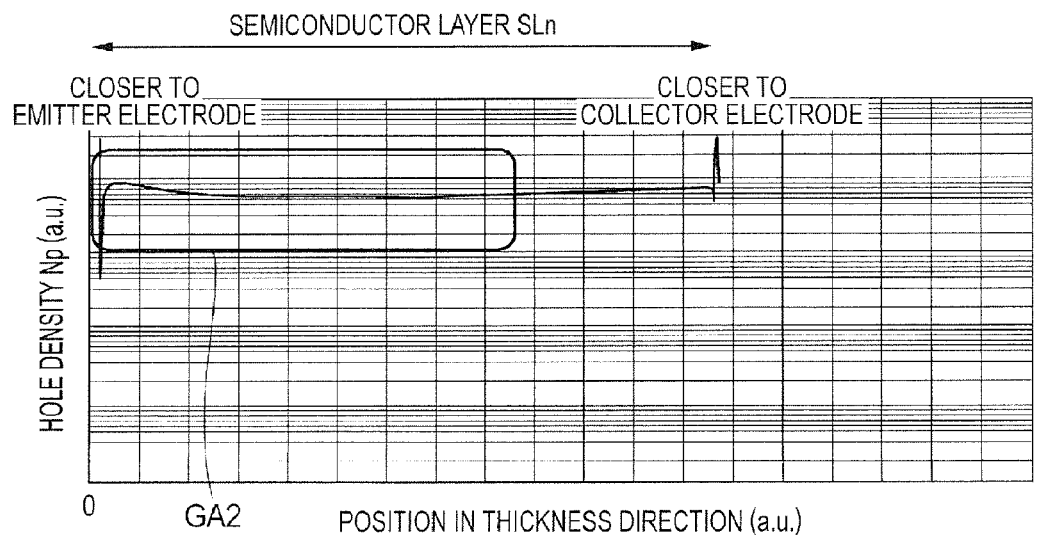
FIG. 43 is a graph showing the hole density distribution in the thickness direction in the semiconductor device in Comparative Example 1 in the ON state.
Figure 44:
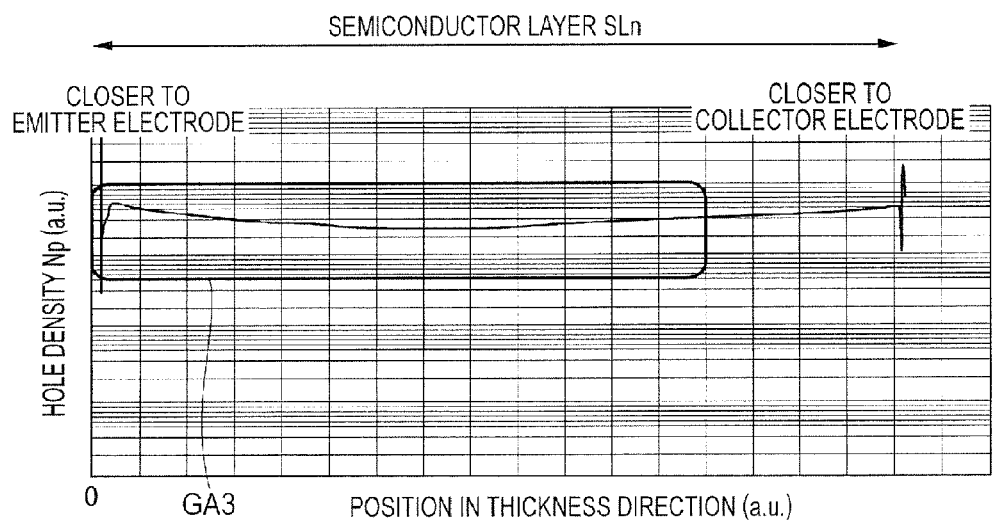
FIG. 44 is a graph showing the hole density distribution in the thickness direction in the semiconductor device in Comparative Example 1 in the ON state.
Figure 45:
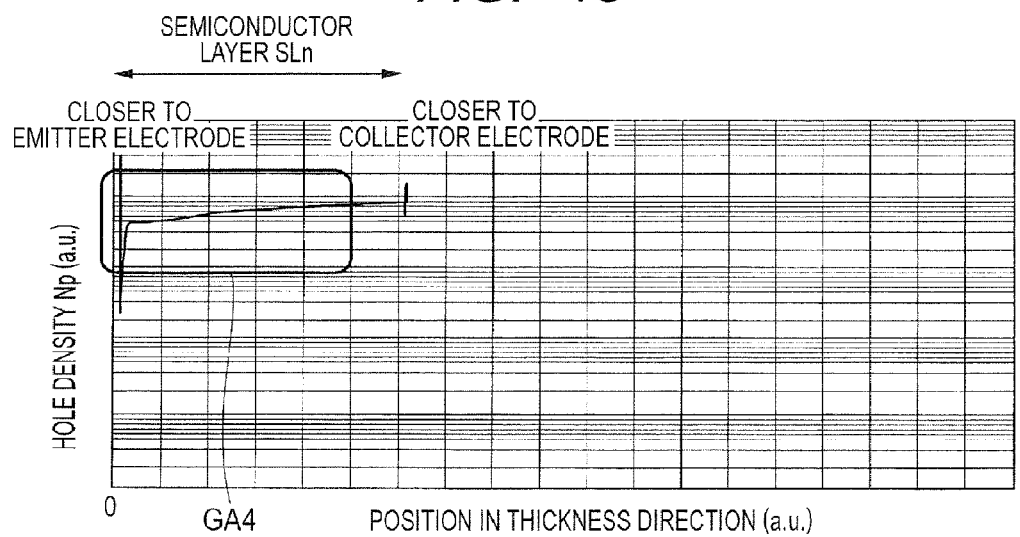
FIG. 45 is a graph showing a hole density distribution in a thickness direction in the semiconductor device in Comparative Example 2 in the ON state.
Figure 46:
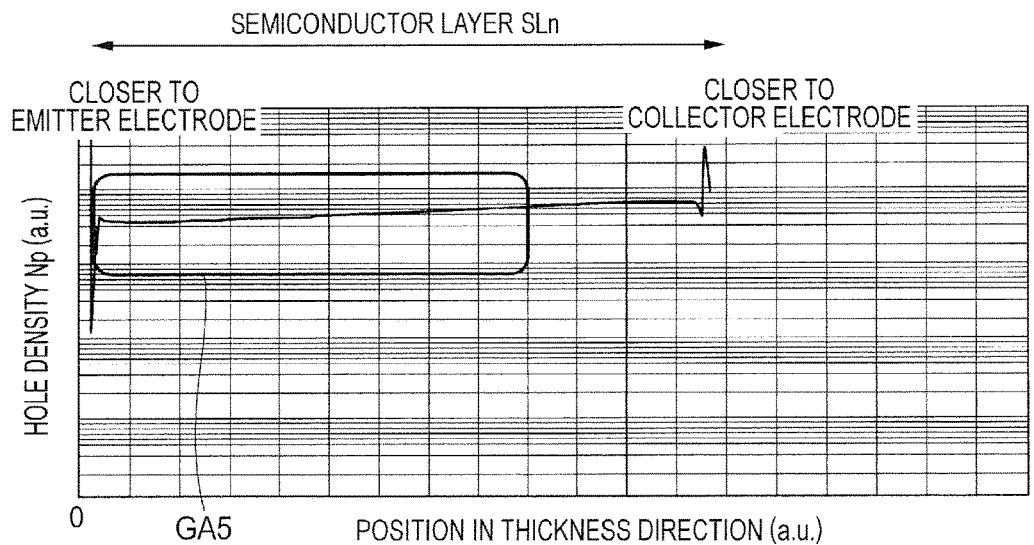
FIG. 46 is a graph showing the hole density distribution in the thickness direction in the semiconductor device in Comparative Example 2 in the ON state.
Figure 47:
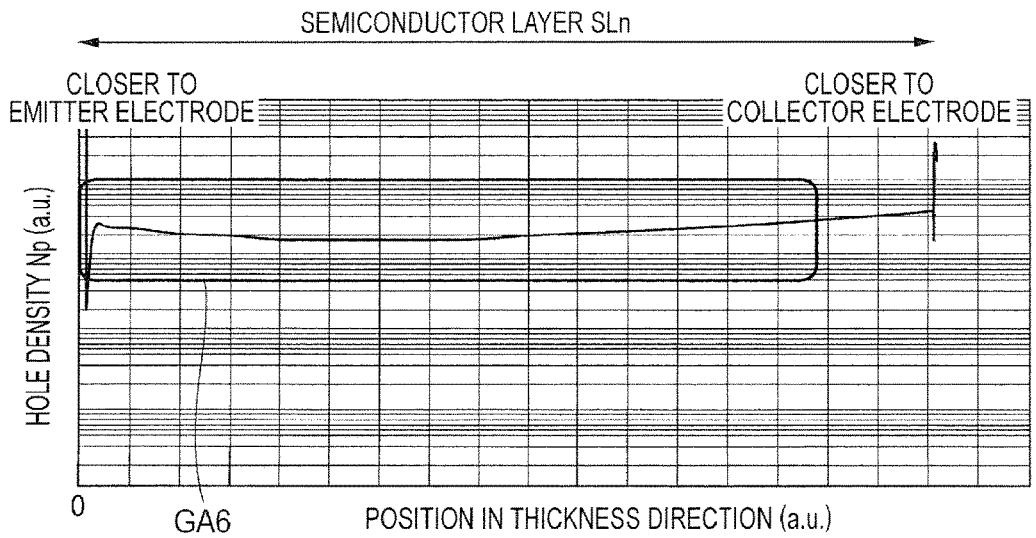
FIG. 47 is a graph showing the hole density distribution in the thickness direction in the semiconductor device in Comparative Example 2 in the ON state.

FIGS. 42 to 44 are graphs each showing a hole density distribution in a thickness direction in the semiconductor device in Comparative Example 1 in the ON state. FIGS. 45 to 47 are graphs each showing a hole density distribution in a thickness direction in the semiconductor device in Comparative Example 2 in the ON state. FIGS. 42 to 44 show a hole density distribution in the thickness direction (Z-axis direction) at the center position of the active cell region LCa in the X-axis direction. FIGS. 45 to 47 show a hole density distribution in the thickness direction (Z-axis direction) at the center position of the hybrid sub-cell cell region LCh1 in the X-axis direction. The ordinate axis in each of FIGS. 42 to 47 shows the hole density Np on a logarithmic scale. Note that a position in the thickness direction is shown on the assumption that a position in the thickness direction at the upper surface Sa is 0 and a direction extending from the upper surface Sa toward the lower surface Sb is a positive direction.

FIGS. 42 and 45 show the case where the thickness of the semiconductor layer SLn was set to 70 μm. FIGS. 43 and 46 show the case where the thickness of the semiconductor layer SLn was set to 135 μm. FIGS. 44 and 47 show the case where the thickness of the semiconductor layer SLn was set to 180 μm. Each of FIGS. 42 to 47 shows a hole density distribution in the semiconductor layer SLn when the IGBT was brought into the ON state by applying a voltage of 15 V as the voltage VGE as the gate-emitter voltage, i.e., when the IGBT is turned ON. Note that, in the graphs of FIGS. 42 to 47, the display of specific numerical values is omitted and, in FIGS. 42 to 47, the abscissa axes and the ordinate axes have equal ranges.

When a comparison is made between a region GA1 in the graph of FIG. 42 and a region GA4 in the graph of FIG. 45 in each of which the thickness of the semiconductor layer SLn was set to 70 μm, the hole density was lower in Comparative Example 2 than in Comparative Example 1. Also, when a comparison is made between a region GA2 in the graph of FIG. 43 and a region GA5 in the graph of FIG. 46 in each of which the thickness of the semiconductor layer SLn was set to 135 μm, the hole density was lower in Comparative Example 2 than in Comparative Example 1. Also, when a comparison is made between a region GA3 in the graph of FIG. 44 and a region GA6 in the graph of FIG. 47 in each of which the thickness of the semiconductor layer SLn was set to 180 μm, the hole density was lower in Comparative Example 2 than in Comparative Example 1.

Therefore, it will be understood that, in the semiconductor device in Comparative Example 2, the IE effect is lower and the hole density is lower than in the semiconductor device in Comparative Example 1 irrespective of the thickness of the semiconductor layer SLn, i.e., the thickness of the n$^-$-type drift region ND. In particular, in the region of the semiconductor layer SLn which is closer to the emitter electrode EE, i.e., the region of the semiconductor layer SLn where the p-channel parasitic MOSFET is formed, a decrement in hole density is larger in Comparative Example 2 than in Comparative Example 1.

This is because, when the IGBT is brought into the ON state and carriers are stored, by the charging up of the p-type floating region PF also, the p-channel parasitic MOSFET is brought into the ON state and holes as the carriers are discharged. Accordingly, in the semiconductor device including the EGE-type IGBT having the p-channel parasitic MOSFET (semiconductor device in Comparative Example 2), the IE effect is lower and the ON voltage is higher than in the semiconductor device including the GG-type IGBT (semiconductor device in Comparative Example 1) having no p-channel parasitic MOSFET.

In addition, as a result of a reduction in hole density as carrier density, the resistance of the n-type drift region ND increases to raise the ON voltage. Therefore, it can be considered that, as the thickness of the semiconductor layer SLn, i.e., the thickness of the n⁻-type drift region ND increases, the ratio of the resistance of the n⁻-type drift region ND to the entire resistance between the collector electrode CE and the emitter electrode EE increases and consequently the increment in ON voltage is larger in Comparative Example 2 than in Comparative Example 1.

Next, a description will be given of a switching loss at a turn-ON time.

Figure 48:
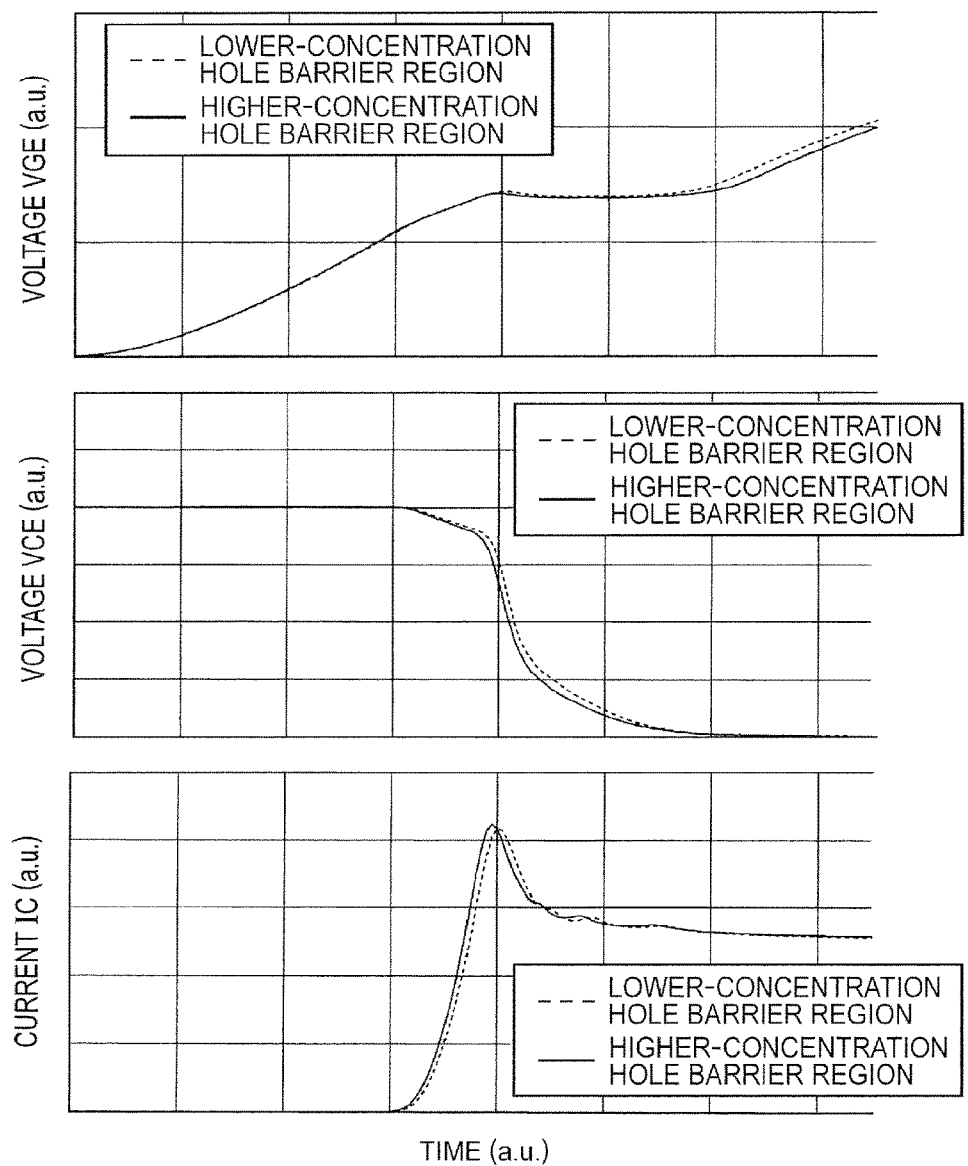
Figure 49:
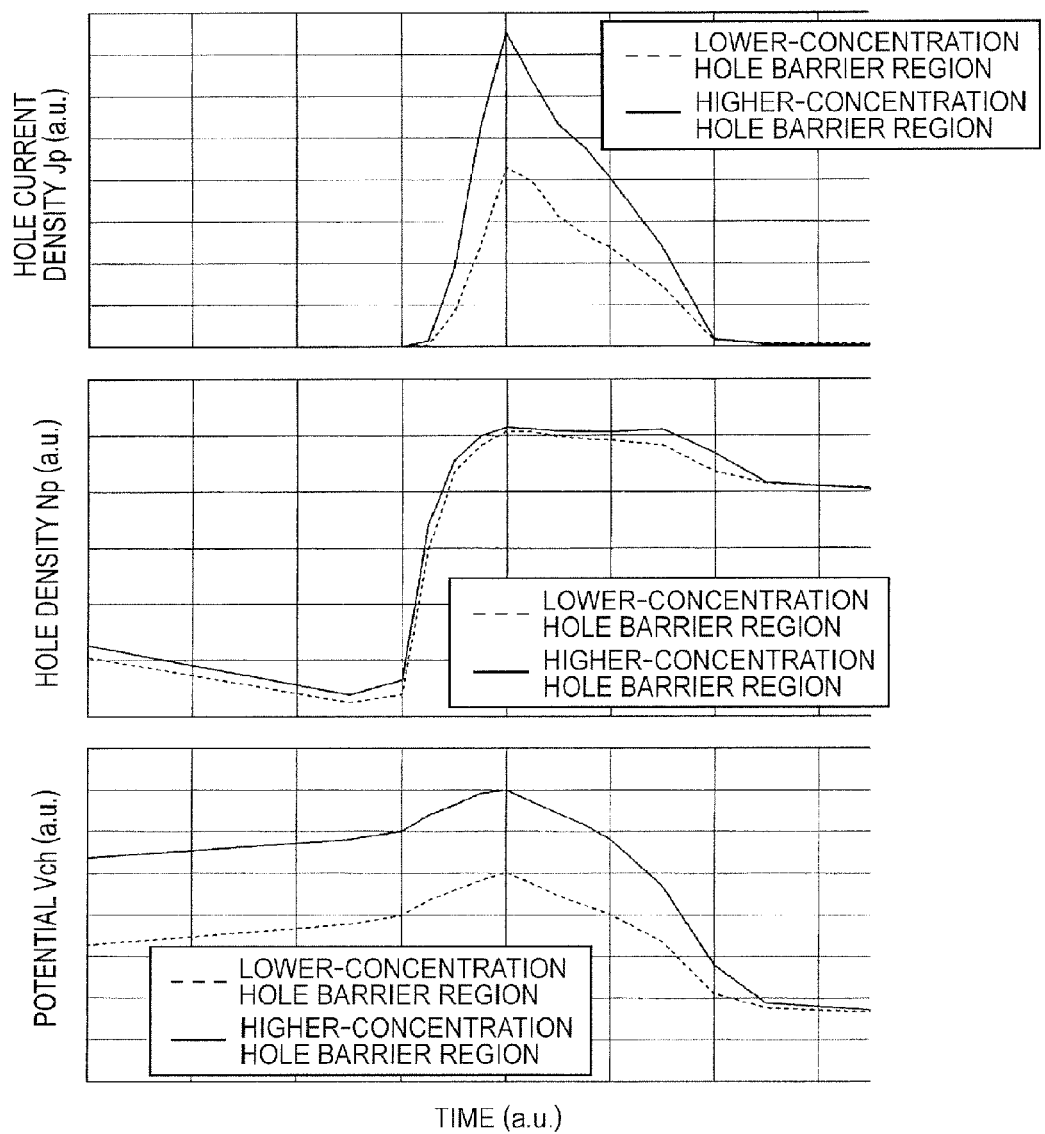

FIGS. 48 and 49 are graphs each showing switching waveforms when the semiconductor device in Comparative Example 2 is turned ON. The results shown in FIGS. 48 and 49 are obtained by calculation performed using the TOAD in accordance with the same method as used to obtain the results shown in FIGS. 36 and 37 except that the semiconductor device in Comparative Example 2 is not turned OFF, but is turned ON.

FIG. 48 shows the time dependences of the voltage VGE as the gate-emitter voltage, the voltage VCE as the collector-emitter voltage, and the current IC as the collector current in the semiconductor device in Comparative Example 2. FIG. 49 shows the time dependences of the hole current density Jp, the hole density Np, and the potential Vch as the potential of the channel region of the P-channel parasitic MOSFET. The abscissa axis in each of FIGS. 48 and 49 shows the same time range.

Note that FIGS. 48 and 49 show the time dependences in the two cases where the impurity concentration in each of the n-type hole barrier regions NHB is low and where the impurity concentration in each of the n-type hole barrier regions NHB is high. Since the influence of the impurity concentration in the n-type hole barrier region NHB will be described later, a description is given here of the case where the impurity concentration in the n-type hole barrier region NHB is low.

As shown in FIG. 35, when the voltage VGE as the switching waveform including the first and second two pulses is applied to the semiconductor device including the IGBT, the switching characteristic of the semiconductor device at a turn-ON time is measured as the switching characteristic at a turn-ON time when the second pulse is applied.

As shown in FIG. 48, at the turn-ON time, as the voltage VGE rises, the voltage VCE drops and the current IC increases. Also, as shown in FIG. 48, as the voltage VGE rises, the voltage VCE drops, and the current IC decreases, the potential Vch rises, the hole current density Jp increases, and the hole density Np increases. From the foregoing, it will be understood that, when the IGBT included in the semiconductor device is turned ON, the potential of the channel region of the p-channel parasitic MOSFET rises to bring the parasitic MOSFET into the ON state and holes as carriers are discharged.

On the other hand, the density distribution of holes as carriers at the turn-ON time is the same as the density distribution of holes as carriers at the turn-OFF time shown in FIG. 38. Accordingly, it will be understood that, from the density distribution of holes as carriers also, holes as carries are discharged via the p-channel parasitic MOSFET at the turn-ON time.

In the semiconductor device including the IGBT, as the IE effect increases, carriers can be stored ahead of time at the turn-ON time. This can reduce a switching loss at the turn-ON time. However, in the semiconductor device including the IGBT having the EGE-type active cell region, holes as carriers are discharged via the p-channel parasitic MOSFET at the turn-ON time. This reduces the IE effect and increases the switching loss at the turn-ON time.

Here, as shown in FIG. 49, the hole density Np that had temporarily increased was slow in decreasing. Accordingly, it will be understood that, after the turn-ON time, even in the ON state, i.e., during a conduction period, holes as carriers continue to be discharged via the p-channel parasitic MOSFET. This means that, even in the ON state, a voltage VCEsat as the ON voltage of the IGBT included in the semiconductor device including the IGBT rises, though to a lesser degree than at either of the turn-OFF time and the turn-ON time, resulting in the degradation of the characteristic thereof.

As described above, the semiconductor device including the IGBT having the EGE-type active cell region (semiconductor device in Comparative Example 2) has a problem in that the ON voltage rises to be higher than in the semiconductor device including the IGBT having the GG-type active cell region (semiconductor device in Comparative Example 1) and a switching loss at the turn-ON time increases to be larger than in the semiconductor device including the IGBT having the GG-Type active cell region. When the ON voltage rises and the switching loss at the turn-ON time increases, a switching loss in the inverter circuit formed of the semiconductor device increases. Therefore, it is important to improve the disadvantage of the semiconductor device including the IGBT having the EGE-type active cell region relative to the semiconductor device including the IGBT having the GG-type active cell region (semiconductor device in Comparative Example 1).

That is, in the semiconductor device including the IGBT having the EGE-type active cell region (semiconductor device in Comparative Example 2), it is desirable to further improve the performance of the semiconductor device such as, e.g., the IE effect.

<Main Characteristic Feature and Effect of Embodiment 1>

The semiconductor device in Embodiment 1 has the EGE-type active cell region. In the semiconductor device in Embodiment 1, the plurality of p⁺-type semiconductor regions PR are arranged along the Y-axis direction as the extending direction of each of the trenches T1, T2, and T3 in plan view to be spaced apart from each other.

Accordingly, in the semiconductor device in Embodiment 1, in the same manner as in the semiconductor device having the EGE-type active cell region in Comparative Example 2, the influence of a displacement current on the potential of the gate electrode GE can be eliminated and a switching speed when the semiconductor device in Embodiment 1 is turned OFF by the L-load switching can be improved to be higher than in the semiconductor device having the GG-type active cell region in Comparative Example 1.

Also, in the semiconductor device in Embodiment 1, the ON voltage can be reduced to be lower than in the semiconductor device in Comparative Example 2 in which the p⁺-type semiconductor regions PR are formed continuously along the Y-axis direction in plan view and the switching loss when the semiconductor device in Embodiment 1 is turned ON by the L-load switching can be reduced to be smaller than in the semiconductor device in Comparative Example 2.

That is, in the semiconductor device in Embodiment 1, the performance of the semiconductor device such as, e.g., the IE effect can be improved to be higher than in the semiconductor device in Comparative Example 2.

In the semiconductor device in Comparative Example 2, as shown in FIG. 28, the $p^+$-type semiconductor regions PR are formed continuously along the Y-axis direction at any position in the Y-axis direction. Consequently, in the semiconductor device in Comparative Example 2, the ON resistance of the p-channel parasitic MOSFET is small at any position in the Y-axis direction and the channel length is short. Accordingly, a large quantity of holes are discharged as carriers via the parasitic MOSFET.

On the other hand, in the semiconductor device in Embodiment 1, as shown in FIG. 6, the plurality of $p^+$-type semiconductor regions PR are arranged along the Y-axis direction to be spaced apart from each other. In the upper-layer portion of the semiconductor layer SLn, the $p^+$-type semiconductor regions PR and the p-type body regions PB are alternately arranged along the Y-axis direction. In addition, the p-type impurity concentration in each of the $p^+$-type semiconductor regions PR is higher than the p-type impurity concentration in each of the p-type body regions PB.

In the regions where the $p^+$-type semiconductor regions PR are not formed, the ON resistance of the p-channel parasitic MOSFET is higher than in the regions where the $p^+$-type semiconductor regions PR are formed and the channel length is longer. Accordingly, a small quantity of holes are discharged as carriers via the parasitic MOSFET. Accordingly, in the semiconductor device in Embodiment 1, the area ratio of the inactive section LCbi where the $p^+$-type semiconductor regions PR are not formed to the active section LCba where the $p^+$-type semiconductor regions PR are formed can be increased to be higher than in the semiconductor device in Comparative Example 2. This allows a reduction in the quantity of holes discharged as carriers via the parasitic MOSFET.

Next, a detailed description will be given of the fact that, in the semiconductor device in Embodiment 1, the ON voltage can be reduced and the switching loss when the semiconductor device in Embodiment 1 is turned ON by the L-load switching can be reduced.

First, a description will be given of the fact that, in the semiconductor device in Embodiment 1, the ON voltage can be reduced.

In the semiconductor device in Embodiment 1, the plurality of $p^+$-type semiconductor regions PR are arranged along the Y-axis direction as the gate width direction of the trench gate electrode TG1 to be spaced apart from each other. It is not that the one $p^+$-type semiconductor region PR is formed continuously. Accordingly, in the semiconductor device in Embodiment 1, the area of each of the $p^+$-type semiconductor regions PR is smaller than in the semiconductor device in Comparative Example 2. As a result, in the semiconductor device in Embodiment 1, the quantity of holes discharged as carries is smaller than in the semiconductor device in Comparative Example 2 to enhance the IE effect and allow a reduction in ON voltage.

In the semiconductor device in Embodiment 1, by suppressing the operation of the p-channel parasitic MOSFET, the ON voltage can be reduced.

Figure 50:
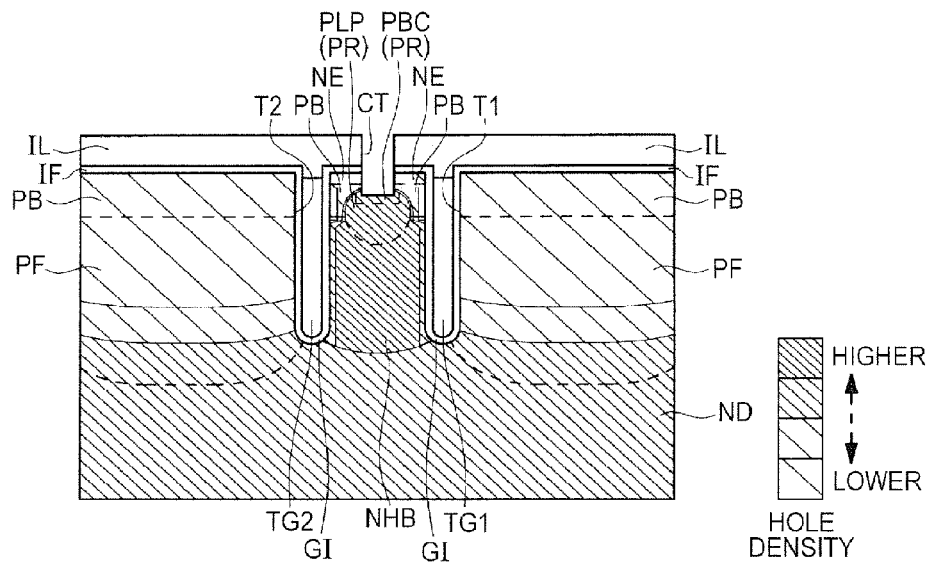
FIG. 50 is a cross-sectional view showing a hole density distribution in the semiconductor device in Comparative Example 1 in the ON state.
Figure 51:
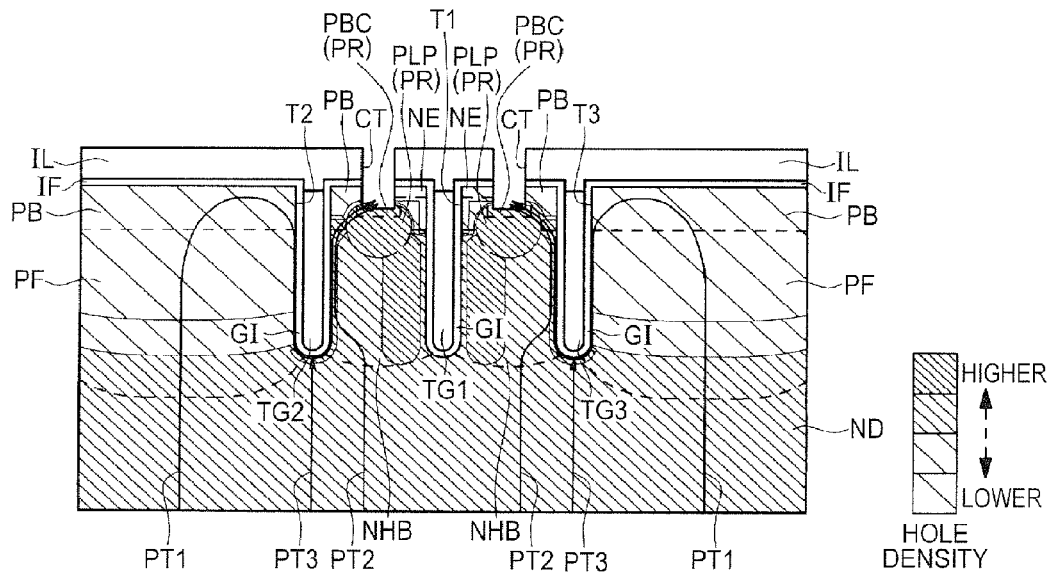
FIG. 51 is a cross-sectional view showing a hole density distribution in the semiconductor device in Comparative Example 2 in the ON state.

FIG. 50 is a cross-sectional view showing the hole density distribution in the semiconductor device in Comparative Example 1 in the ON state. FIG. 51 is a cross-sectional view showing the hole density distribution in the semiconductor device in Comparative Example 2 in the ON state.

As shown in FIG. 50, in the semiconductor device including the IGBT having the GG-type active cell region in Comparative Example 1, no p-channel parasitic MOSFET is formed. Consequently, holes are not discharged as carriers via the parasitic MOSFET.

On the other hand, in the semiconductor device including the IGBT having the EGE-type active cell region in Comparative Example 2, the p-channel parasitic MOSFET is formed. Accordingly, after the IGBT is turned ON, holes as carriers are stored to charge up the p-type floating region PF and thus bring the p-channel parasitic MOSFET into the ON state and a current path along which the holes are discharged as carriers via the parasitic MOSFET is generated. As shown in FIG. 51, when the IGBT having the EGE-type active cell region is in the ON state, the holes as carriers are discharged from the p-channel parasitic MOSFET.

In the hole density distribution shown in FIG. 51, the hole densities are higher in the respective portions of the p-type floating regions PF, the n-type hole barrier regions NHB, and the p-type body regions PB which are closer to the trenches T2 and T3 and lower in the respective portions of the p-type floating regions PF, the n-type hole barrier regions NHB, and the p-type body regions PB which are further away from the trenches T2 and T3, except in the $p^+$-type semiconductor regions PR where the hole densities are originally high.

Consequently, in Comparative Example 2 shown in FIG. 51, a hole current flows through each of the current paths PT1 each extending from the $n^-$-type drift region ND through the p-type floating region PF and also through the respective portions of the p-type floating region PF, the n-type hole barrier region NHB, and the p-type body region PB which are closer to the trenches T2 and T3. Also, in Comparative Example 2 shown in FIG. 51, a hole current flows through each of the current paths PT2 each extending from the $n^-$-type drift region ND through the n-type hole barrier region NHB and also through the respective portions of the n-type hole barrier region NHB and the p-type body region PB which are closer to the trenches T2 and T3.

However, in Embodiment 1, the plurality of $p^+$-type semiconductor regions PR are arranged along the Y-axis direction as the gate width direction of the trench gate electrode TG1 to be spaced apart from each other and are not formed continuously along the Y-axis direction. Accordingly, in the semiconductor device in Embodiment 1, in the portion where the $p^+$-type semiconductor regions PR are not formed, the operation of the p-channel parasitic MOSFET can more reliably be suppressed than in the semiconductor device in Comparative Example 2. This enhances the IE effect and allows a reduction in ON voltage.

Next, a description will be given of the fact that the switching loss can be reduced when the semiconductor device in Embodiment 1 is turned ON by the L-load switching. As described above, by suppressing the operation of the p-channel parasitic MOSFET, the IE effect is enhanced to allow carriers to be stored ahead of time at the turn-ON time. This can reduce the switching loss at the turn-ON time.

In the semiconductor device in Embodiment 1, when the operation of the p-channel parasitic MOSFET is suppressed, the IE effect is enhanced to increase the absolute quantity of carriers as a whole. Consequently, by merely calculating the relationship between the hole current density in the channel region and dependence on the potential of the channel region in the p-channel parasitic MOSFET, it is difficult to precisely evaluate the IE effect in the semiconductor device in Embodiment 1. This is because, in the semiconductor device in Embodiment 1, when the IE effect is enhanced, the quantity of carriers stored in the n⁻-type drift region ND increases to increase the amount of charging up of the p-type floating region PF, increase the potential of the channel region of the p-channel parasitic MOSFET, and increase the quantity of holes discharged as carriers.

Accordingly, to precisely evaluate the IE effect in the semiconductor device in Embodiment 1, it is desirable to estimate a threshold voltage Vth of the p-channel parasitic MOSFET. In addition, since the channel region of the p-channel parasitic MOSFET is the n-type hole barrier region NHB, by increasing the impurity concentration in the n-type hole barrier region NHB, it is possible to increase the threshold voltage Vth of the p-channel parasitic MOSFET.

Accordingly, the following will make a comparison between the switching waveform at the turn-OFF time and the switching waveform at the turn-ON time which have been calculated for the semiconductor device in Comparative Example 2 using the TCAD in each of the cases where the impurity concentration in each of the n-type hole barrier regions NHB is low and where the impurity concentration in each of the n-type hole barrier regions NHB is high. FIGS. 36, 37, 48, and 49 collectively show the cases where the impurity concentration in the hole barrier layer is low and where the impurity concentration in the hole barrier layer is high.

Figure 52:
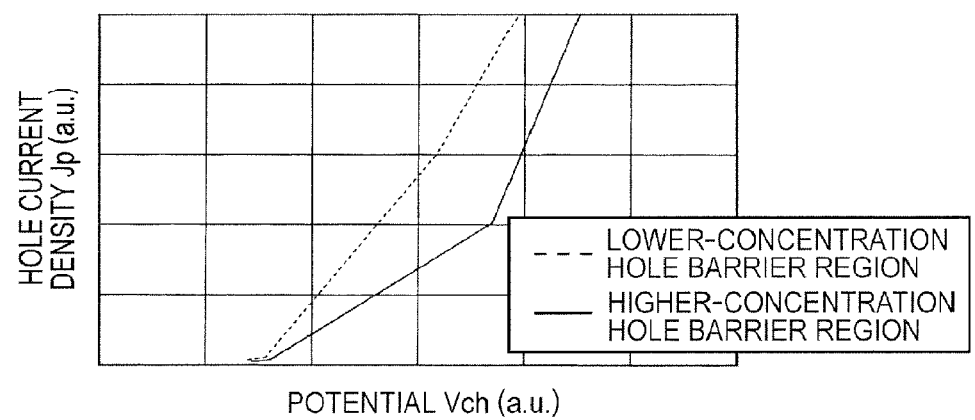
FIG. 52 is a graph showing the potential dependence of a hole current density when the semiconductor device in Comparative Example 2 is turned OFF.
Figure 53:
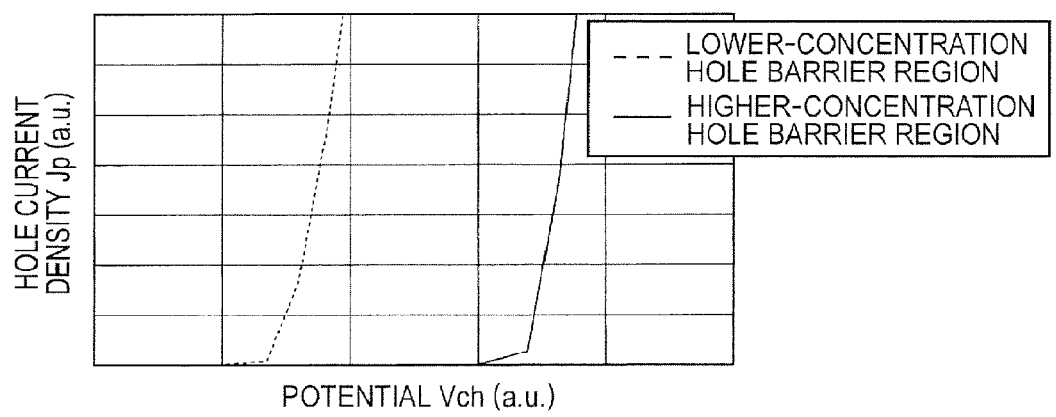

FIGS. 52 and 53 show the potential dependences of the hole current densities at the turn-OFF time which have been determined from the results of calculation obtained in FIGS. 36, 37, 48, and 49. FIG. 52 is a graph showing the potential dependence of the hole current density when the semiconductor device in Comparative Example 2 is turned OFF. FIG. 53 is a graph showing the potential dependence of the hole current density when the semiconductor device in Comparative Example 2 is turned ON. In FIGS. 52 and 53, each of the hole current densities is the hole current density Jp in the channel region of the p-channel parasitic MOSFET and each of the potentials is the potential Vch as the potential of the channel region of the p-channel parasitic MOSFET.

As shown in FIGS. 52 and 53, in the semiconductor device in Comparative Example 2, by increasing the impurity concentration in each of the n-type hole barrier regions NHB, it is possible to raise the threshold voltage Vth of the p-channel parasitic MOSFET. The semiconductor device in Embodiment 1 is similar to the semiconductor device in Comparative Example 2 in having the EGE-type active cell region. Accordingly, by increasing the impurity concentration in each of the n-type hole barrier regions NHB, it is possible to raise the threshold voltage Vth of the p-channel parasitic MOSFET.

Specifically, a channel concentration as a parameter which affects the threshold voltage Vth of the p-channel parasitic MOSFET can be adjusted by adjusting the impurity concentration in the n-type hole barrier region NHB. Also, a channel length as another parameter which affects the threshold voltage Vth of the p-channel parasitic MOSFET can be adjusted by adjusting the depths of the trenches T1, T2, and T3 and the like.

Note that, in Embodiment 1, the conductivity type in each of the semiconductor regions may also be simultaneously changed to the opposite conductivity type (the same applies also to the following embodiments).

Embodiment 2

In Embodiment 2, a description will be given of an example in which a semiconductor device is a module having a plurality of semiconductor chips each including an IGBT having an EGE-type active cell region and the plurality of semiconductor chips are coupled in parallel to each other.

Figure 54:
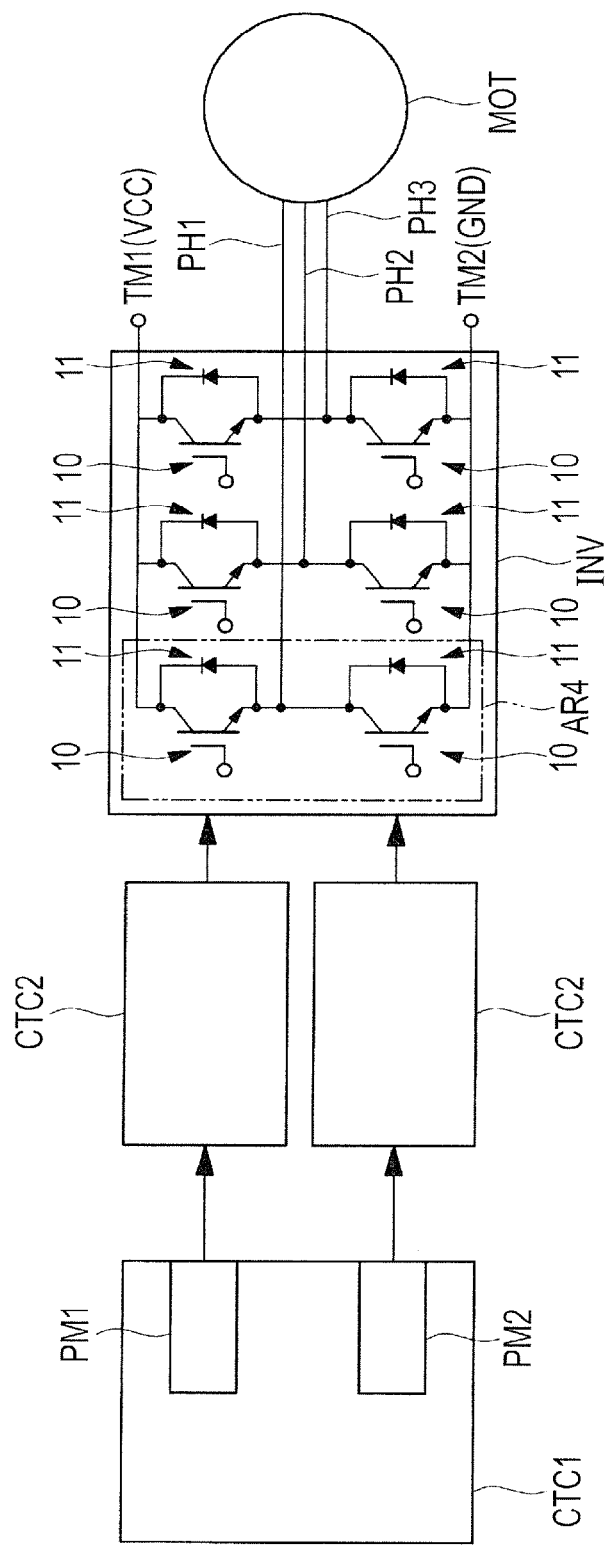
FIG. 54 is a circuit block diagram showing an example of an electronic system in which a semiconductor device in Embodiment 2 is used.
Figure 55:
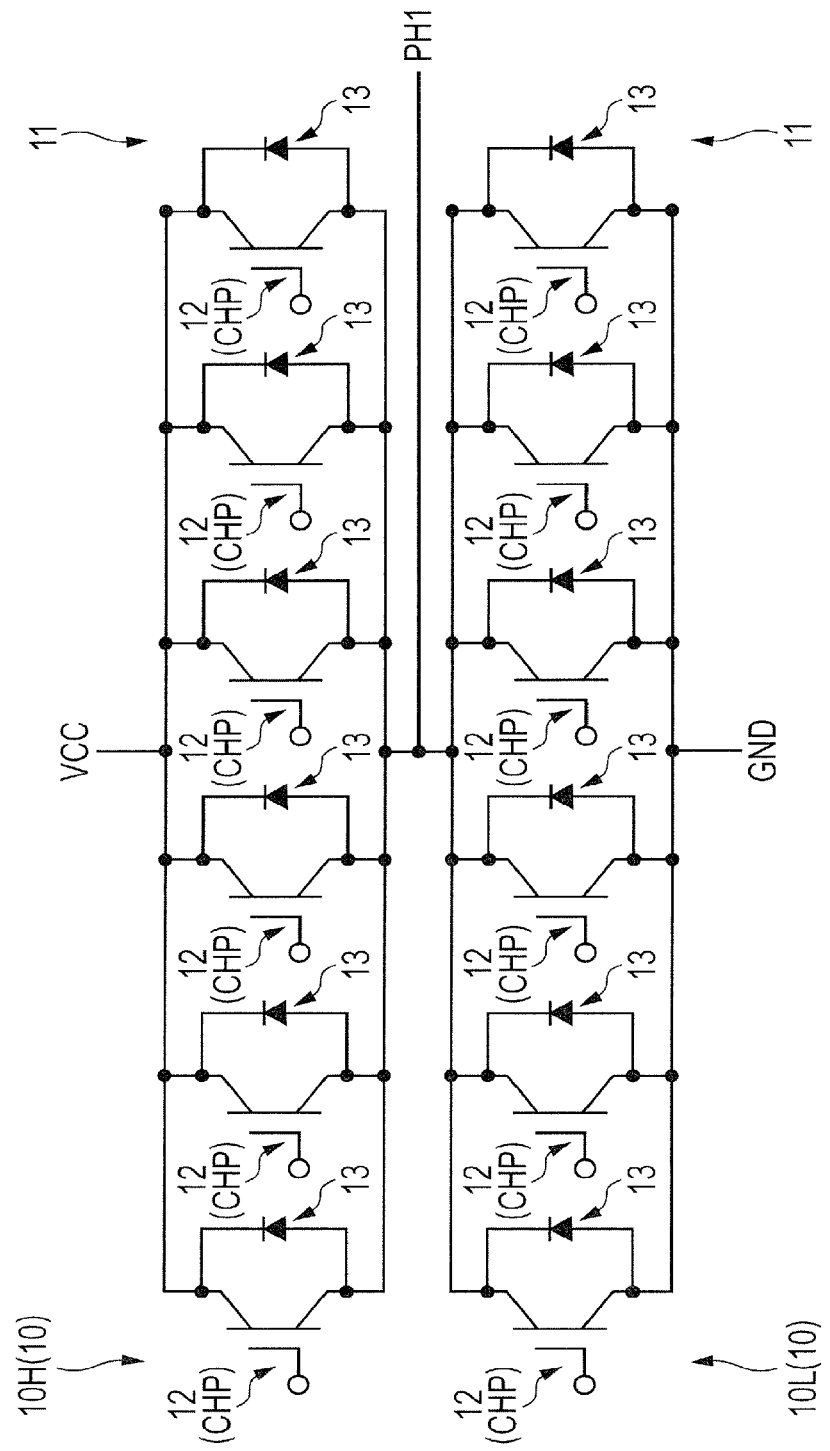
FIG. 55 is an equivalent circuit diagram showing a module as the semiconductor device in Embodiment 2.

FIG. 54 is a circuit block diagram showing an example of an electronic system using the semiconductor device in Embodiment 2. FIG. 55 is an equivalent circuit diagram showing the module as the semiconductor device in Embodiment 2. FIG. 55 shows two IGBT modules 10 corresponding to a U-phase PH1 which are among six IGBT modules 10 included in an inverter INV shown in FIG. 54.

As shown in FIG. 54, the electronic system using the semiconductor device in Embodiment 2 includes a load such as a motor MOT, the inverter INV, a control circuit CTC1, and a control circuit CTC2. Such an electronic system is, e.g., a solar power generation system or a wind force power generation system. As the motor MOT, a 3-phase motor is used herein. The 3-phase motor is configured so as to be driven with voltages in three different phases. The control circuit CTC1 includes a plurality of power modules PM1 and PM2.

In the electronic system shown in FIG. 54, an output of a power generation module (the depiction thereof is omitted) in, e.g., the solar power generation system or wind force power generation system is coupled to input terminals TM1 and TM2 of the inverter INV. The do voltage, i.e., do power of the power generation module is supplied to the inverter INV.

The control circuit CTC1 is configured of, e.g., an ECU (Electronic Control Unit) and has an embedded control semiconductor chip such as an MCU (Micro Controller Unit). The control circuit CTC1 includes the plurality of power modules PM1 and PM2. Each of the power modules PM1 and PM2 is configured of, e.g., an ECU and has an embedded control semiconductor chip such as an MCU.

The plurality of power modules PM1 and PM2 included in the control circuit CTC1 are coupled to the control circuit CTC2. The inverter INV is controlled by the control circuit CTC2. The control circuit CTC2 includes, e.g., a gate driver and a photocoupler, though the depiction thereof is omitted. The gate driver (the depiction thereof is omitted) included in the control circuit CTC2 is coupled to the inverter INV. At this time, the gate driver (the depiction thereof is omitted) included in the control circuit CTC2 is coupled to the gate electrode of the IGBT included in the inverter INV.

To the inverter INV, the motor MOT is coupled. The dc voltage, i.e., dc power supplied from, e.g., the power module (the depiction thereof is omitted) in the solar power generation system or wind force power generation system is converted to an ac voltage, i.e., ac power in the inverter INV and supplied to the motor MOT. The motor MOT is driven with the ac voltage, i.e., ac power supplied from the inverter INV.

In the example shown in FIG. 54, the motor MOT is the three-phase motor including the U-phase PH1, a V-phase PH2, and a W-phase PH3. Accordingly, the inverter INV also corresponds to three phases including the U-phase PH1, the V-phase PH2, and the W-phase Ph3. The inverter INV corresponding to such three phases has the total of six pairs of the IGBT modules 10 and diode modules 11.

The semiconductor device in Embodiment 2 is equivalent to the IGBT module 10. The IGBT module 10 includes a plurality of IGBT chips 12. Each of the IGBT chips 12 is equivalent to the semiconductor chip CHP (see FIG. 1).

Each of the plurality of IGBT chips 12 included in the IGBT module 10 includes the semiconductor substrate SS, the semiconductor layer SLn, the semiconductor layer SLp, the trenches T1, T2, and T3, the gate insulating film GI, and the trench gate electrodes TG1, TG2, and TG3, similarly to the semiconductor device in Comparative Example 2 shown in FIGS. 26 to 28. Also, each of the plurality of IGBT chips 12 included in the IGBT module 10 includes the p-type body region PB, the n'-type emitter regions NE, the p-type floating region PF, the $p^+$-type semiconductor regions PR, the emitter electrode EE, the collector electrode CE, and the gate electrode GE, similarly to the semiconductor device in Comparative Example 2 shown in FIGS. 26 to 28. The $p^+$-type semiconductor regions PR are formed continuously along the Y-axis direction as the extending direction of the trench T1.

Note that, when the motor MOT is a 2-phase motor, the inverter INV has the total of four pairs of the IGBT modules 10 and the diode modules 11.

Of the inverter INV, the part located between the input potential of the motor MOT and the power supply potential VCC is referred to as a HIGH-side part and the part located between the input potential of the motor MOT and the ground potential GNT is referred to as a LOW-side part. In the example shown in FIG. 54, as the HIGH-side IGBT modules 10, three of the IGBT modules 10 are used and, as the LOW-side IGBT modules 10, three of the IGBT modules 10 are used. Also, as the HIGH-side diode modules 11, three of the diode modules 11 are used and, as the LOW-side diode modules 11, three of the diode modules 11 are used.

Of the two IGBT modules 10 shown in an area AR4 in FIG. 54 and corresponding to, e.g., the U-phase, a HIGH-side IGBT module 10H includes the plurality of, e.g., six IGBT chips 12 each made of the semiconductor chip CHP. On the other hand, of the two IGBT modules 10 corresponding to, e.g., the U-phase, a LOW-side IGBT module 10L includes the plurality of, e.g., six IGBT chips 12 each made of the semiconductor chip CHP. In either of the HIGH-side part and the LOW-side part, the respective emitter electrodes EE of the plurality of IGBT chips 12 are electrically coupled to each other and the respective collector electrodes CE of the plurality of IGBT chips 12 are electrically coupled to each other.

In the semiconductor device in Embodiment 2, the IGBT included in each of the semiconductor chips CHP may also be the same as the IGBT included in the semiconductor device in Comparative Example 2 described using FIGS. 26 to 28. According, the following will describe the case where the IGBT included in the semiconductor chip CHP is the same as the IGBT included in the semiconductor device in Comparative Example 2 described using FIGS. 26 to 28.

In the example shown in FIG. 54, in each of the three phases including the U-phase PH1, the V-phase PH2, and the W-phase PH3, between the power supply potential VCC supplied to the inverter INV via the input terminals TM1 and TM2 and the input potential of the motor MOT, i.e., in the HIGH-side part, the IGBT module 10 and the diode module 11 are coupled in antiparallel to each other. On the other hand, in each of the three phases including the U-phase PH1, the V-phase PH2, and the W-phase PH3, between the input potential of the motor MOT and the ground potential GND, i.e., in the LOW-side part, the IGBT module 10 and the diode module 11 are coupled in antiparallel to each other.

To each of the gate electrodes of the plurality of IGBT chips 12 included in each of the six IGBT modules 10, the control circuit CTC2 is coupled to control each of the plurality of IGBT chips 12 included in the six IGBT modules 10. Note that, in each of the six diode modules 11, a plurality of diodes 13 are included and each of the IGBT chips 12 and each of the diodes 13 are coupled in antiparallel to each other.

The current flowing in each of the IGBT modules 10 is controlled using the control circuit CTC2 to drive and rotate the motor MOT. That is, by controlling the turning ON/OFF of each of the IGBT modules 10 using the control circuit CTC2, the motor MOT can be driven. When the motor MOT is thus driven, it is necessary to turn ON/OFF the IGBT module 10, but the motor MOT includes an inductance. Accordingly, when the IGBT module 10 is turned OFF, due to the inductance included in the motor MOT, a reverse current in a direction reverse to the direction in which the current flows in the IGBT module 10 is generated. Since the IGBT module 10 does not have the function of allowing the reverse current to flow therein, by providing the diode module 11 in antiparallel to the IGBT module 10, the reverse current is caused to flow back to release the energy stored in the inductance.

<Semiconductor Device in Comparative Example 3>

Next, a description will be given of a semiconductor device in Comparative Example 3. The semiconductor device in Comparative Example 3 is a module including a plurality of semiconductor chips each including an IGBT having a GG-type active cell region. The plurality of semiconductor chips are coupled in parallel to each other.

An electronic system using the semiconductor device in Comparative Example 3 also includes a load such as the motor MOT, the inverter INV, the control circuit CTC1, and the control circuit CTC2, similarly to the electronic system (see FIG. 54) using the semiconductor device in Embodiment 2. The inverter INV has the total of six pairs of the IGBT modules 10 and the diode modules 11. The semiconductor device in Comparative Example 3 is equivalent to the IGBT module 10.

In the semiconductor device in Comparative Example 3 also, in the same manner as in the semiconductor device in Embodiment 2 (see FIGS. 54 and 55), the HIGH-side IGBT module 10H includes the six IGBT chips 12 each made of the semiconductor chip CHP and the LOW-side IGBT module 10L includes the six IGBT chips 12 each made of the semiconductor chip CHP.

On the other hand, in the semiconductor device in Comparative Example 3, unlike in the semiconductor device in Embodiment 2, the IGBT included in each of the semiconductor chips CHP is an IGBT having a GG-type active cell region, i.e., the IGBT included in the semiconductor device in Comparative Example 1 described using FIG. 25.

<Problem of Semiconductor Device in Comparative Example 3 and Main Characteristic Feature and Effect of Embodiment 2>

Next, a description will be given of the problem of the semiconductor device in Comparative Example 3 and the main characteristic feature and effect of Embodiment 2.

In the module as the semiconductor device in Comparative Example 3, the plurality of IGBT chips 12 each having the GG-type active cell region are coupled in parallel to each other. A consideration will be given of the case where, when such a module as the semiconductor device in Comparative Example 3 operates, a difference is produced between the positions where the individual IGBT chips are placed in a circuit or between the electric characteristics of the individual IGBT chips. In such a case, fluctuations may occur in the output of the module or a current may be concentrated on any of the IGBT chips 12 to cause the breakage thereof.

For example, a consideration will be given of the case where, a difference is produced between the floating inductances generated from circuit wires in the individual IGBT chips, between the electric characteristics such as the threshold voltages Vth of the individual IGBT chips, or between capacitances related to the gate electrodes, i.e., gate capacitances in the individual IGBT chips. In such a case, when hard switching such as L-load switching is performed, it may be possible that a gap is formed between ON/OFF timings for the individual IGBT chips and the individual IGBT chips 12 do not uniformly operate. Due to such imbalanced operations, fluctuations may occur in the output of the IGBT module 10 or a current may be concentrated on any of the IGBT chips 12 to cause the breakage thereof.

Specifically, when the plurality of IGBT chips 12 included in the IGBT module 10 used in the inverter INV in, e.g., the wind force power generation system are turned OFF, due to such imbalanced operations, fluctuations may occur in the output of the IGBT module 10 or a current may be concentrated on any of the IGBT chips 12 to cause the breakage thereof.

When the plurality of IGBT chips 12 coupled in parallel to each other thus operate in the IGBT module 10, it is desirable that the individual IGBT chips 12 uniformly operate. However, it is actually difficult to uniformly operate the individual IGBT chips 12. For example, in the case where the IGBT chips 12 are used in the inverters INV which are among power conversion devices, when the respective output terminals of the inverters INV are short-circuited, it is desirable that each of the IGBT chips 12 is not broken during the period between the sensing of the occurrence of, e.g., an overcurrent or the like and the cutoff thereof. However, in an actual situation, when the plurality of IGBT chips 12 coupled in parallel to each other do not uniformly operate, fluctuations may occur in the output of the IGBT module 10 or a current may be concentrated on any of the IGBT chips 12 to cause the breakage thereof.

In the IGBT module 10 as Comparative Example 3, to uniformly operate the plurality of IGBT chips 12, it is desirable to ensure uniformity to each of conditions which are the positions where the individual IGBT chips are placed in a circuit, coupling structures to the control circuit CTC2 which controls the gate electrodes of the individual IGBT chips 12, currents in the individual IGBT chips 12, the stabilities of switching operations with respect to the individual IGBT chips 12, and temperatures during the operations of the individual IGBT chips 12. To achieve this, it is necessary to design each of the IGBT chips 12 such that the individual IGBT chips 12 uniformly operate or arrange the individual IGBT chips 12 such that the individual IGBT chips 12 uniformly operate. However, it is difficult to design the IGBT chips 12 such that the individual IGBT chips 12 operate completely uniformly and arrange the IGBT chips 12 such that the individual IGBT chips 12 operate completely uniformly. The difficulty increases as the capacitance of each of the IGBT chips 12 increases, i.e., as the two-dimensional area of the IGBT chip 12 increases.

In Comparative Example 3, it is also necessary to uniformly operate the large number of active cell regions LCa (see FIG. 25) located in the IGBT chips 12. However, it is impossible to completely uniformly operate the individual active cell regions LCa. Accordingly, even when there is a certain degree of non-uniformity between the operations of the individual IGBT chips 12, it is also necessary to prevent the IGBT module 10 from being broken.

As the breakdown voltage of each of the IGBT chips 12 is higher, the ON voltage of the IGBT chip 12 rises. Accordingly, to enhance the IE effect, the p-type floating regions PR are provided on both sides of each of the active cell regions LCa. However, as a result of the charging up of the p-type floating regions PF or fluctuations in a collector potential in an L-load switching operation, a displacement current flows (in a positive (forward)/negative (backward) direction) into the gate electrode GE via the p-type floating region PF to thus fluctuate a gate potential. Then, when the IGBT module having the plurality of IGBT chips coupled in parallel to each other operates, the individual IGBT modules do not uniformly operate. Here, when the displacement current is a displacement current I, the collector potential is a collector potential VC, a time is a time t, and a capacitance is a capacitance C0, the displacement current I is given by the following expression (1).

$$I=(d(VC)/dt)\cdot C0 \qquad (1)$$

On the other hand, even when the p-type floating regions PF are not provided on both sides of each of the active cell regions LCa, a displacement current flows into the gate electrode GE via a feedback capacitance made of the capacitance Cgd (see FIGS. 29 and 30). Accordingly, the capacitance Cgd needs to be reduced.

Figure 56:
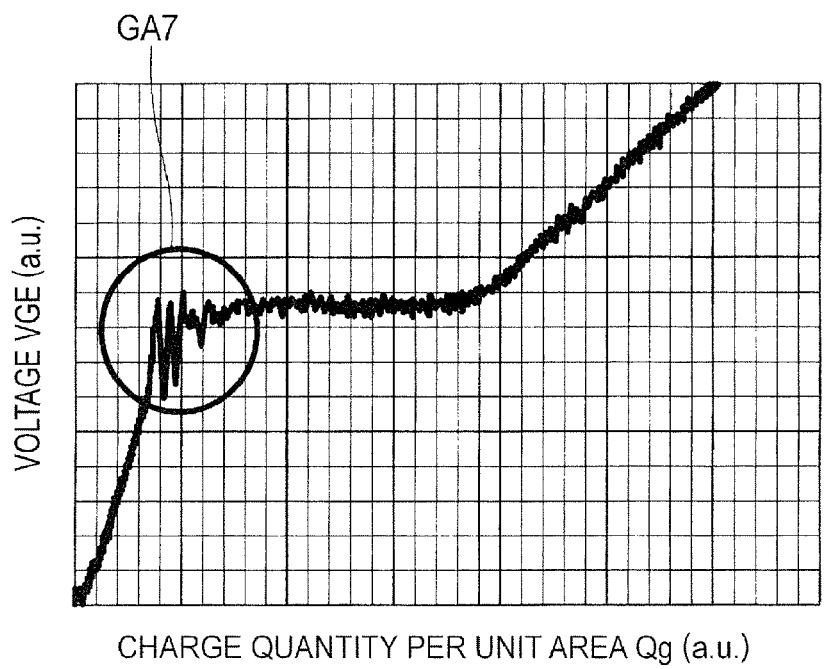
FIG. 56 is a graph showing the gate charge quantity dependence of a gate-emitter voltage in a semiconductor device in Comparative Example 3.
Figure 57:
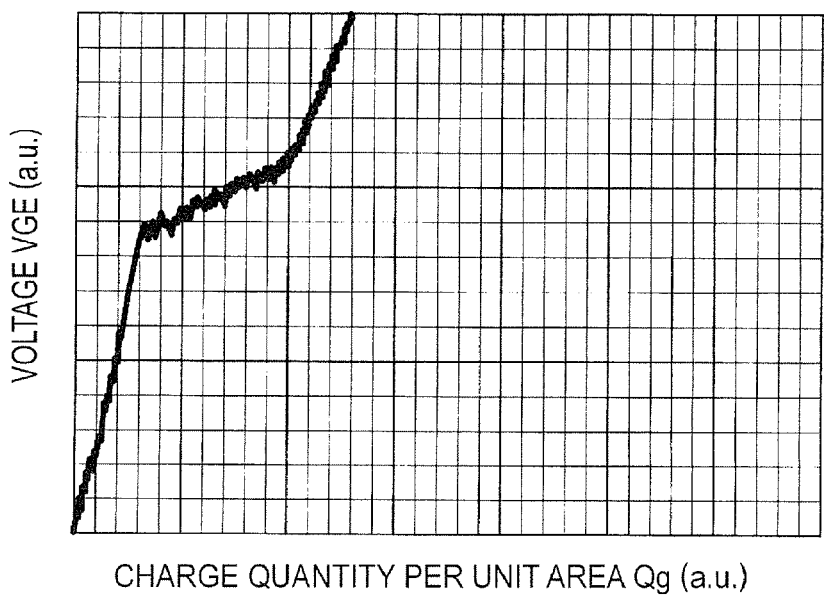
FIG. 57 is a graph showing the gate charge quantity dependence of a gate-emitter electrode in the semiconductor device in Embodiment 2.

FIG. 56 is a graph showing the gate charge quantity dependence of a gate-emitter voltage in the semiconductor device in Comparative Example 3. FIG. 57 is a graph showing the gate charge quantity dependence of a gate-emitter voltage in the semiconductor device in Embodiment 2. The abscissa axis in each of FIGS. 56 and 57 shows a charge quantity Qg per unit area. The ordinate axis in each of FIGS. 56 and 57 shows the voltage VGE as the gate-emitter voltage. FIGS. 56 and 57 show measured data. Note that, in the graphs of FIGS. 56 and 57, the display of specific numerical values is omitted and, in FIGS. 56 to 57, the abscissa axes and the ordinate axes have equal ranges.

In the semiconductor device in Comparative Example 3 having the GG-type active cell region, the displacement current flows into the gate electrode GE to abruptly raise the voltage VGE at the turn-ON time and increase, e.g., the time rate of change of the voltage VGE or the time rate of change of the current flowing in the active cell region LCa. Consequently, noise is likely to occur in the voltage VGE. The occurrence of the noise also causes non-uniform operations of the individual IGBT chips 12. Accordingly, as shown in a region GA7 in FIG. 56, in the semiconductor device having the GG-type active cell region in Comparative Example 3, the voltage VGE as the gate-emitter voltage fluctuates.

Also, in the semiconductor device in Comparative Example 3, the amount of the displacement current flowing into the gate electrode GE cannot be controlled by adjusting the resistance Rg (see FIG. 30) as a gate resistance externally coupled to the control circuit CTC2 of each of the IGBT chips 12.

On the other hand, in the semiconductor device having the EGE-type active cell region in Embodiment 2, it is possible to prevent the displacement current from flowing into the gate electrode GE. Consequently, noise is less likely to occur in the voltage VGE. Accordingly, as shown in FIG. 57, in the semiconductor device having the EGE-type active cell region in Embodiment 2, the voltage VGE as the gate-emitter voltage does not fluctuate.

Figure 58:
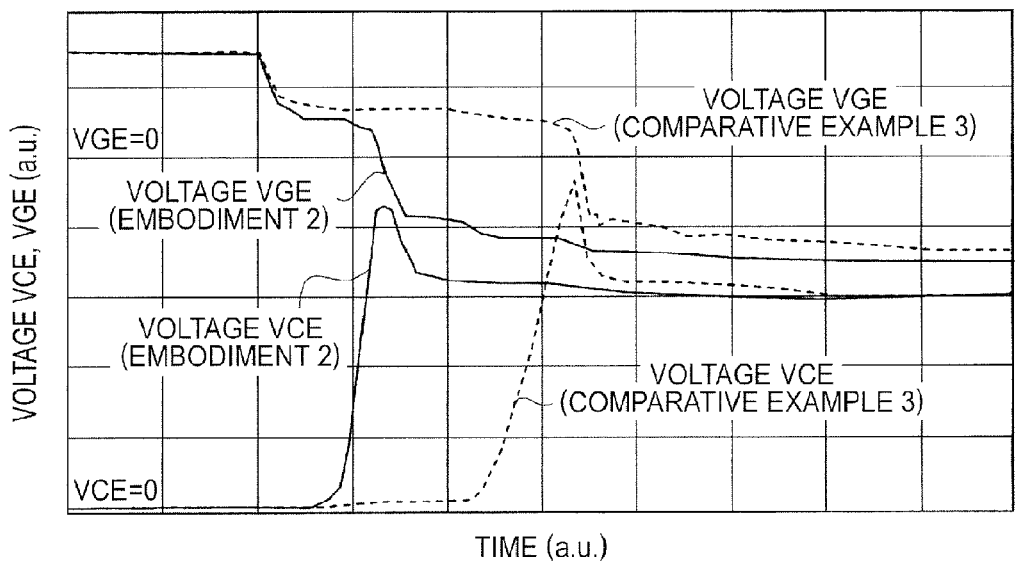
FIG. 58 is a graph showing switching waveforms when the semiconductor device in Comparative Example 3 and the semiconductor device in Embodiment 2 are turned OFF by L-load switching.
Figure 59:
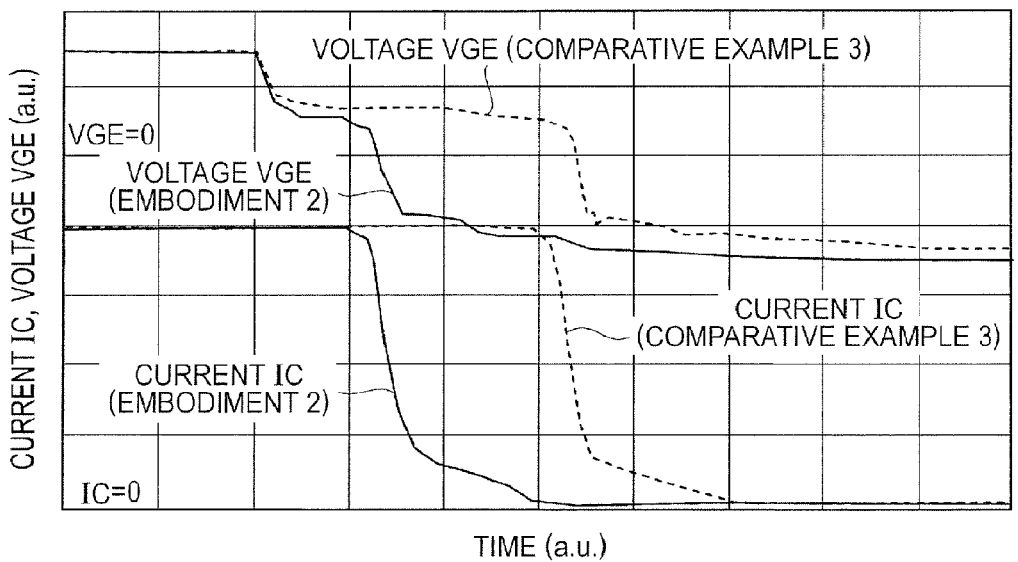
FIG. 59 is a graph showing switching waveforms when the semiconductor device in Comparative Example 3 and the semiconductor device in Embodiment 2 are turned OFF by L-load switching.

FIGS. 58 and 59 are graphs showing switching waveforms when the semiconductor device in Comparative Example 3 and the semiconductor device in Embodiment 2 are turned OFF by the L-load switching. The abscissa axis in each of FIGS. 58 and 59 shows a time. The ordinate axis in FIG. 58 shows the voltage VCE as a collector-emitter voltage. The ordinate axis in FIG. 59 shows the current IC as a collector-emitter current. FIGS. 58 and 59 show measured data. Note that, in the graphs of FIGS. 56 and 57, the display of specific numerical values is omitted but, in FIGS. 58 and 59, the abscissa axes and the ordinate axes have equal ranges. FIGS. 58 and 59 also show the voltages VGE as gate-emitter voltages in Comparative Example 3 and Embodiment 2.

In the semiconductor device in Comparative Example 3, under the influence of the displacement current flowing into the gate electrode GE, when the semiconductor device in Comparative Example 3 is turned OFF by the L-load switching, even after the quantity of charges in the capacitance Cgd is discharged therefrom, the gate potential may be held constant. Due to the different positions where the individual IGBT chips 12 are placed in the circuit and, e.g., the different parasitic floating inductances of the individual IGBT chips 12, the displacement current tends to be different from one IGBT chip to another. Also, due to the different gate potentials of the individual IGBT chips 12 which are represented by the sums of the resistances Rg as the gate resistances and the displacement currents, the displacement current tends to be different from one IGBT chip to another. In such a case, when the plurality of IGBT chips electrically coupled in parallel to each other are operated, it is difficult to uniformly operate the individual IGBT chips 12.

The displacement current and the gate potential also tend to be different among the plurality of active cell regions LCa (see FIG. 25) electrically coupled in parallel to each other in the same IGBT chip 12. In such a case, when the plurality of IGBT chips 12 electrically coupled in parallel to each other are operated, it is more difficult to uniformly operate the individual IGBT chips 12.

On the other hand, in the semiconductor device in Embodiment 2, it is possible to prevent the displacement current from flowing into the gate electrode GE and eliminate the influence exerted by the displacement current on the operation of each of the IGBT chips 12. Consequently, when the plurality of IGBT chips 12 electrically coupled in parallel to each other are operated, it is possible to uniformly operate the individual IGBT chips 12.

In the semiconductor device in Comparative Example 3, the capacitance of each of the IGBT chips 12 is large so that a switching operation with respect to the signal supplied to the gate electrode GE becomes slow. This increases the influence of the positions at which the individual IGBT chips 12 are placed in the circuit such as, e.g., the inductances of wires so that the individual IGBT chips 12 are less likely to operate uniformly. As the capacitance of each of the IGBT chips 12 increases, the time required for the switching operation increases to increase the time required by each of the IGBT chips 12 to generate heat. As a result, the individual IGBT chips 12 are likely to generate different amounts of heat or have different temperatures.

When the individual IGBT chips 12 generate different amounts of heat or have different temperatures, the individual IGBT chips 12 have different ON voltages or the different threshold voltages Vth. Consequently, a current may flow in a concentrated manner in any of the plurality of IGBT chips 12 to cause fluctuations in the voltage VGE as the gate-emitter voltage or the breakage of the IGBT chip. Even though a characteristic fluctuates at the same rate from one of the manufactured IGBT chips 12 to another, when the capacitances of the IGBT chip 12 are large, the amount of fluctuation of the characteristic from one IGBT chip to another increases to increase the amount of fluctuation of the capacitance from one IGBT chip to another as compared with the case where the capacitance of the IGBT chip is small.

The IGBT chips included in the semiconductor device in Comparative Example 3 are for use in a high power conversion device so that the capacitances thereof are large. Accordingly, the capacitance fluctuates in a large amount from one IGBT chip to another.

On the other hand, the module as the semiconductor device in Embodiment 2 includes the plurality of IGBT chips 12 having the EGE-type active cell regions and coupled in parallel to each other. The IGBT chips 12 provided in the semiconductor device in Embodiment 2 are also for use in a high power conversion device, similarly to the IGBT chips 12 included in the semiconductor device in Comparative Example 3. However, in the semiconductor device in Embodiment 2, the capacitances of the IGBT chips 12 can be reduced to be smaller than in the semiconductor device in Comparative Example 3.

Consequently, when the plurality of IGBT chips 12 electrically coupled in parallel to each other are operated, it is possible to reduce the influence of the positions at which the individual IGBT chips 12 are located in the circuit and uniformly operate the individual IGBT chips 12. In addition, it is possible to allow each of the IGBT chips 12 to generate the same amount of heat or have the same temperature, prevent or inhibit the voltage VGE as the gate-emitter voltage from fluctuating, and prevent or inhibit the IGBT chips 12 from being broken. That is, it is possible to prevent or inhibit the output of the module from fluctuating or prevent or inhibit a current from being concentrated on any of the IGBT chips 12 to cause the breakage thereof. Accordingly, the performance of the semiconductor device in Embodiment 2 can be improved to be higher than that of the semiconductor device in Comparative Example 3.

Preferably, it is desirable to minimize the capacitance of each of the IGBT chips 12. For example, it is desirable that the quantity of gate charges per unit area (Qg) which is required to raise the IGBT chip 12 until the IGBT chip 12 is turned ON is not more than 600 nC/cm$^2$ or an input capacitance (Cies) per unit area is not more than 110 pF/mm$^2$. As a result, in the case of using the semiconductor device in Embodiment 2 as the IGBT module 10 including the plurality of IGBT chips 12 electrically coupled in parallel to each other, when a switching operation is performed, it is possible to allow each of the IGBT chips 12 to generate the same amount of heat or have the same temperature. Therefore, it is possible to prevent or inhibit the voltage VGE as the gate-emitter voltage from fluctuating and prevent or inhibit the IGBT chips 12 from being broken.

An RBSOA (Reverse Bias Safe Operating Area) resistance when the plurality of IGBT chips coupled in parallel to each other are operated is lower than an RBSOA resistance when one of the IGBT chips is operated. This may be considerably because, when the plurality of IGBT chips 12 coupled in parallel to each other are operated, if any of the IGBT chips 12 shows a slight sign of not performing a uniform operation, a current flows in a concentrated manner in the IGBT chip 12. Therefore, it is desirable to improve the RBSOA resistance of each of the IGBT chips.

In the semiconductor device in Embodiment 2, in the hybrid cell region LCh as the active cell region included in the IGBT chip 12, holes can be discharged via the p-channel parasitic MOSFET. This can easily improve the RBSOA resistance. In addition, it is also possible to prevent or inhibit a current from flowing in a concentrated manner in any of the plurality of hybrid cell regions LCh included in the IGBT chip 12 such as located in, e.g., the outermost peripheral portion of the IGBT chip 12. Thus, it is possible to uniformly operate the hybrid cell regions LCh as the plurality of active cell regions included in the IGBT chip 12 and coupled in parallel to each other.

The three IGBT chips 12 in each of Comparative Example 3 and Embodiment 2 were subjected to a load short circuit test. At this time, gate potentials, collector potentials, and collector currents were determined by performing circuit simulation using a SPICE (Simulation Program with Integrated Circuit Emphasis), the result of which is shown herein.

Figure 60:
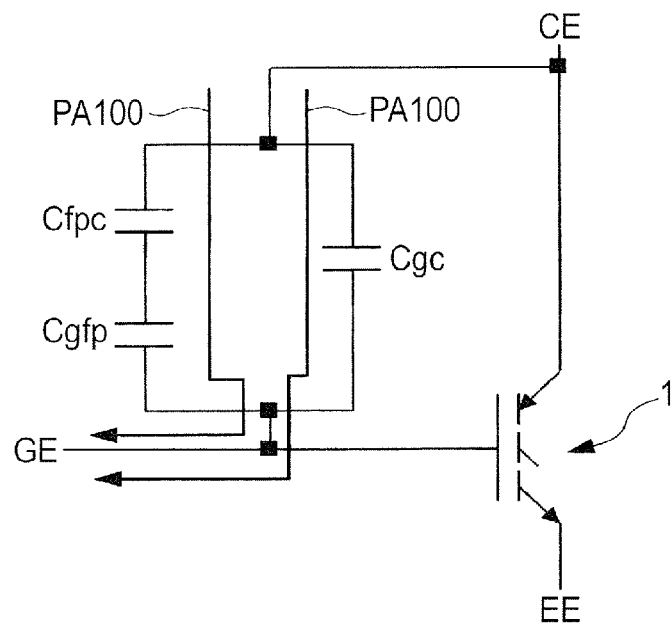
FIG. 60 is an equivalent circuit diagram showing a pseudo device model of each of the IGBT chips included in the semiconductor device in Comparative Example 3.
Figure 61:
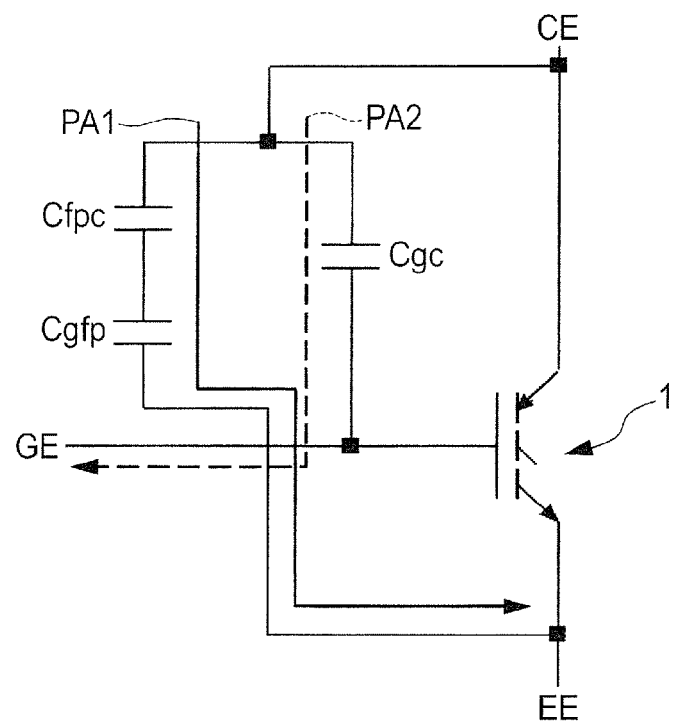
FIG. 61 is an equivalent circuit diagram showing a pseudo device model of each of the IGBT chips included in the semiconductor device in Embodiment 2.
Figure 62:
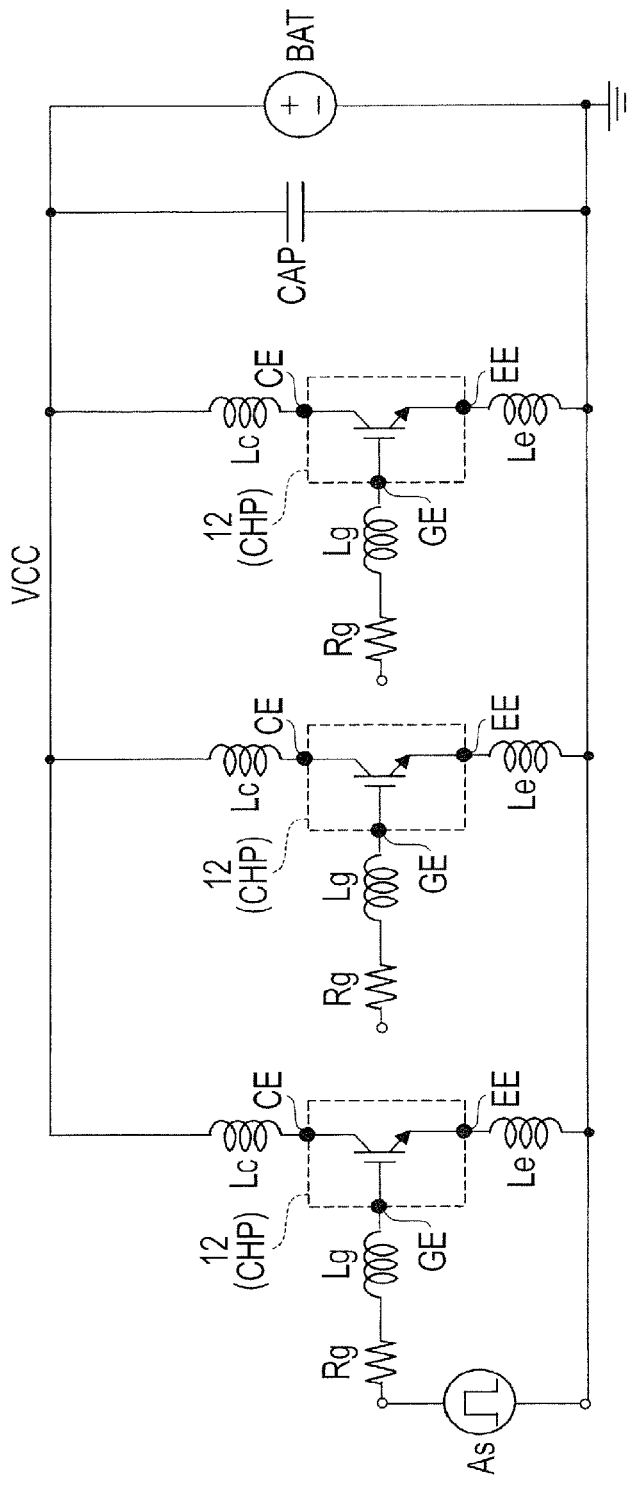
FIG. 62 is a circuit diagram for circuit simulation in each of the semiconductor devices in Comparative Example 3 and Embodiment 2.
Figure 63:
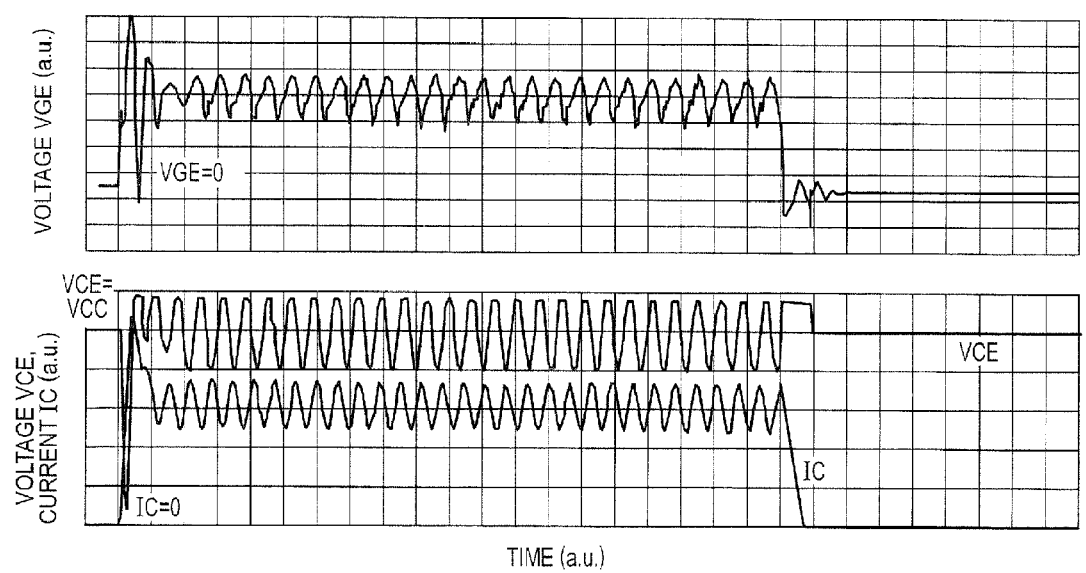
FIG. 63 is a graph showing the result of the circuit simulation in the semiconductor device in Comparative Example 3.
Figure 64:
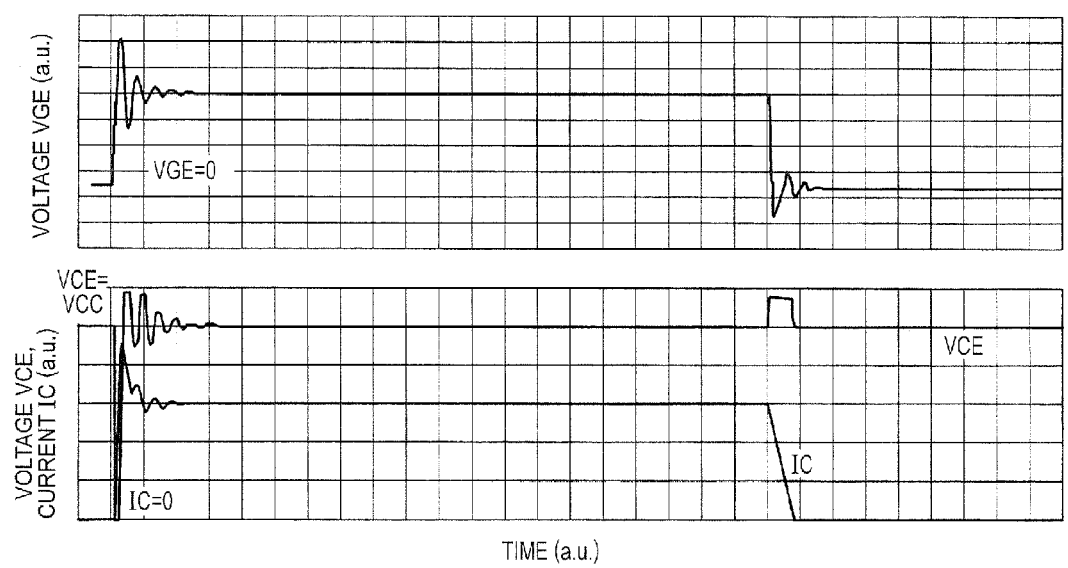
FIG. 64 is a graph showing the result of the circuit simulation in the semiconductor device in Embodiment 2.

FIG. 60 is an equivalent circuit diagram showing a pseudo device model of each of the IGBT chips included in the semiconductor device in Comparative Example 3. FIG. 61 is an equivalent circuit diagram showing a pseudo device model of each of the IGBT chips included in the semiconductor device in Embodiment 2. FIG. 62 is a circuit diagram for circuit simulation in each of the semiconductor devices in Comparative Example 3 and Embodiment 2. FIG. 63 is a graph showing the result of the circuit simulation in the semiconductor device in Comparative Example 3. FIG. 64 is a graph showing the result of the circuit simulation in the semiconductor device in Embodiment 2. Note that, in the graphs of FIGS. 63 and 64, the display of specific numerical values is omitted and, in FIGS. 63 to 64, the abscissa axes and the ordinate axes have equal ranges.

In the circuit for circuit simulation shown in FIG. 62, a dc power supply BAT having the power supply potential VCC, the capacitor CAP, and the three IGBT chips 12 are coupled in parallel to each other. In each of the IGBT chips 12, between the collector electrode CE and the power supply potential VCC, a floating inductor having an inductance Lc is coupled and, between the emitter electrode EE and the ground potential, a floating inductor having an inductance Le is coupled. In each of the IGBT chips 12, to the gate electrode GE, an ac signal source AS is coupled via a floating inductor having an inductance Lg and the resistance Rg.

In the load short circuit test, it is desirable to reduce the influence exerted on the gate potential, i.e., the voltage VGE as the gate-emitter voltage. However, in the semiconductor device in Comparative Example 3 having the GG-type active cell region, under hard switching conditions such that the voltage of the dc power supply BAT is directly cut off or applied, the time rate of change of a collector potential, i.e., the voltage VCE as the collector-emitter voltage increases upon L-load (or no-load) switching to increase the displacement current generated in the gate electrode GE. For example, when the voltage VCE is several thousands of volts or the current IC as a collector current is several thousands of amperes, fluctuations in collector potential or fluctuations in collector current significantly affect the gate potential.

In the semiconductor device in Comparative Example 3 including the IGBT chips each having the GG-type active cell region, as shown in FIG. 25, the p-type floating region PF and each of the trench gate electrodes TG1 and TG2 coupled to the gate electrode GE (see FIG. 1) are adjacent to each other via the gate insulating film GI. Consequently, as shown in FIG. 60, the displacement current path PA100 is coupled to the gate electrode GE. Accordingly, as shown in FIG. 63, the gate potential (voltage VGE), the collector potential (voltage VCE), and the collector current (current IC) fluctuate.

On the other hand, in the semiconductor device in Embodiment 2 including the IGBT chips each having the EGE-type active cell region, as shown in FIG. 4, the p-type floating region PF and the trench gate electrode TG1 coupled to the gate electrode GE are cut off by each of the trench gate electrodes TG2 and TG3 coupled to the emitter electrode EE and are not adjacent to each other. Consequently, as shown in FIG. 61, the displacement current flows along a displacement current path PA1 coupled to the emitter electrode EE, but the displacement current scarcely flows along a displacement current path PA2 coupled to the gate electrode GE. Accordingly, as shown in FIG. 64, the gate potential (voltage VGE), the collector potential (voltage VCE), and the collector current (current IC) do not fluctuate.

That is, in the semiconductor device in Embodiment 2, it is possible to prevent the displacement current from flowing into the gate electrode GE. Accordingly, in the load short circuit test, even under hard switching conditions, it is possible to prevent the displacement current from affecting the gate potential.

<Modification of Semiconductor Device in Embodiment 2>

Each of the IGBT chips included in the semiconductor device in Embodiment 2 is a semiconductor device as an IGBT chip having an EGE-type active cell region. In each of the hybrid cell regions LCh as the active cell region, the $p^+$-type semiconductor regions PR are formed continuously along the Y-axis direction. Since it is sufficient for each of the IGBT chips included in the semiconductor device in Embodiment 2 to be a semiconductor device as the IGBT chip having the EGE-type active cell region, in each of the hybrid cell regions LCh as the active cell region, a plurality of the $p^+$-type semiconductor regions PR may also be arranged along the Y-axis direction to be spaced apart from each other. Such an example will be described as a modification of the semiconductor device in Embodiment 2.

In each of the IGBT chips included in the semiconductor device in the present modification, in the same manner as in each of the IGBT chips as the semiconductor device in Embodiment 1, the plurality of $p^+$-type semiconductor regions PR are arranged in the Y-axis direction to be spaced apart from each other. In addition, in each of the hybrid sub-cell regions LCh1 and LCh2, the plurality of $n^+$-type emitter regions NE are placed at the same positions as those of the $p^+$-type semiconductor regions PR in the Y-axis direction.

Accordingly, the semiconductor device in the present modification has the same effect as the effect exerted by the semiconductor device in Embodiment 1 on the semiconductor device in Comparative Example 2. In the semiconductor device in the present modification, the ON voltage can be reduced to be lower than in the semiconductor device in Embodiment 2 and the switching loss when the semiconductor device in the present modification is turned ON by L-load switching can be reduced to be smaller than in the semiconductor device in Embodiment 2.

Embodiment 3

In Embodiment 3, a description will be given of an example in which, in a semiconductor device including an IGBT having an EGE-type active cell region, the width of the active cell region is small and a coupling electrode overlaps a trench gate electrode in plan view.

In the semiconductor device in Embodiment 3, the IGBT included in the semiconductor chip CHP (see FIG. 1) may be the same as the IGBT included in the semiconductor device in Comparative Example 2 described using FIGS. 26 to 28. Accordingly, the following will describe the case where the IGBT included in the semiconductor chip CHP is the same as the IGBT included in the semiconductor device in Comparative Example 2.

<Configuration of Semiconductor Device>

First, a description will be given of a configuration of the semiconductor device in Embodiment 3.

A structure of the semiconductor device in Embodiment 3 is the same as the structure of the semiconductor device in Comparative Example 2 described using FIGS. 26 to 28 except that, in plan view, the coupling electrode CP overlaps the trench gate electrodes TG2 and TG3. Accordingly, the following will mainly describe a point different from the structure of the semiconductor device in Comparative Example 2.

Figure 65:
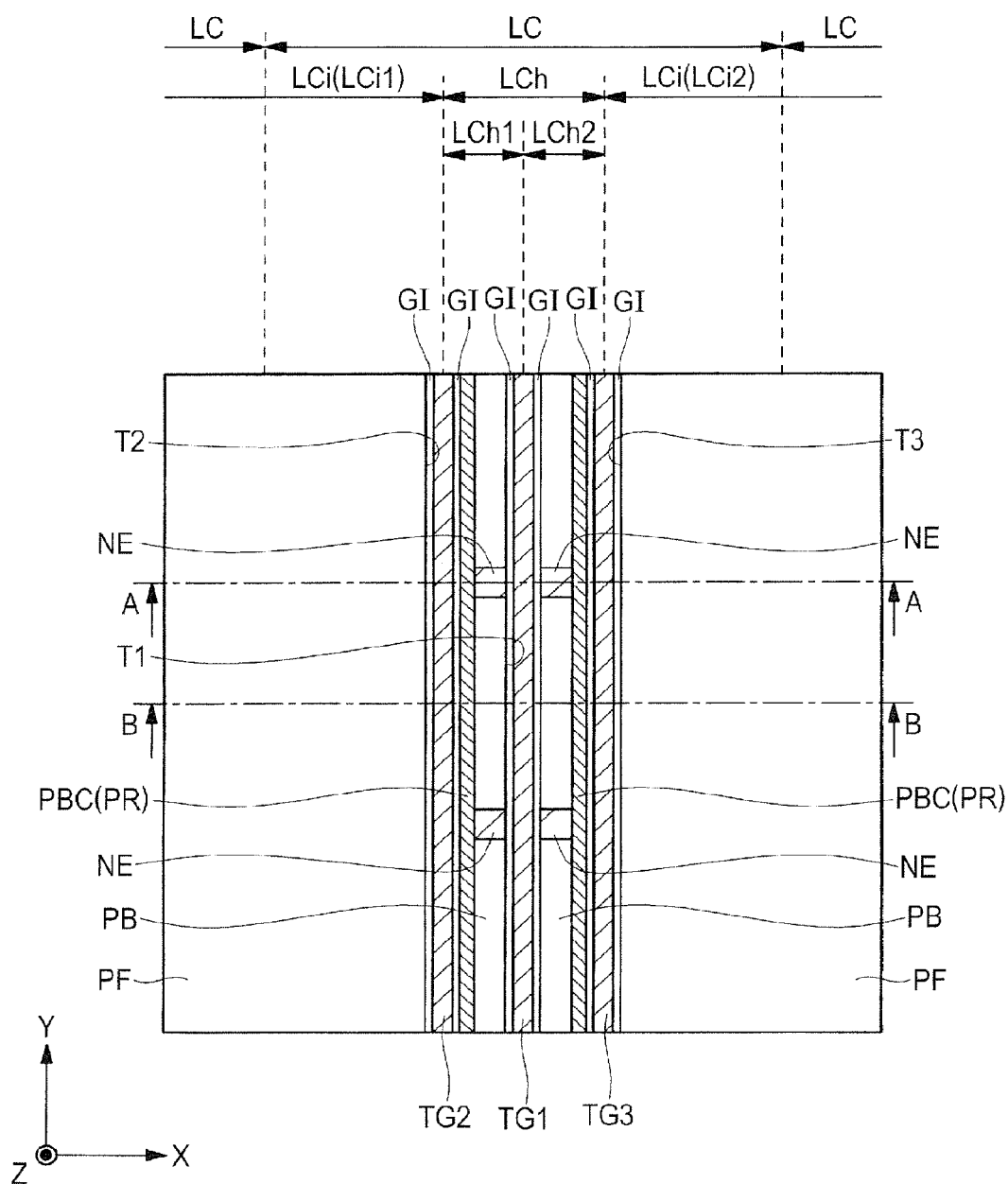
FIG. 65 is a main-portion plan view of a semiconductor device in Embodiment 3.
Figure 66:
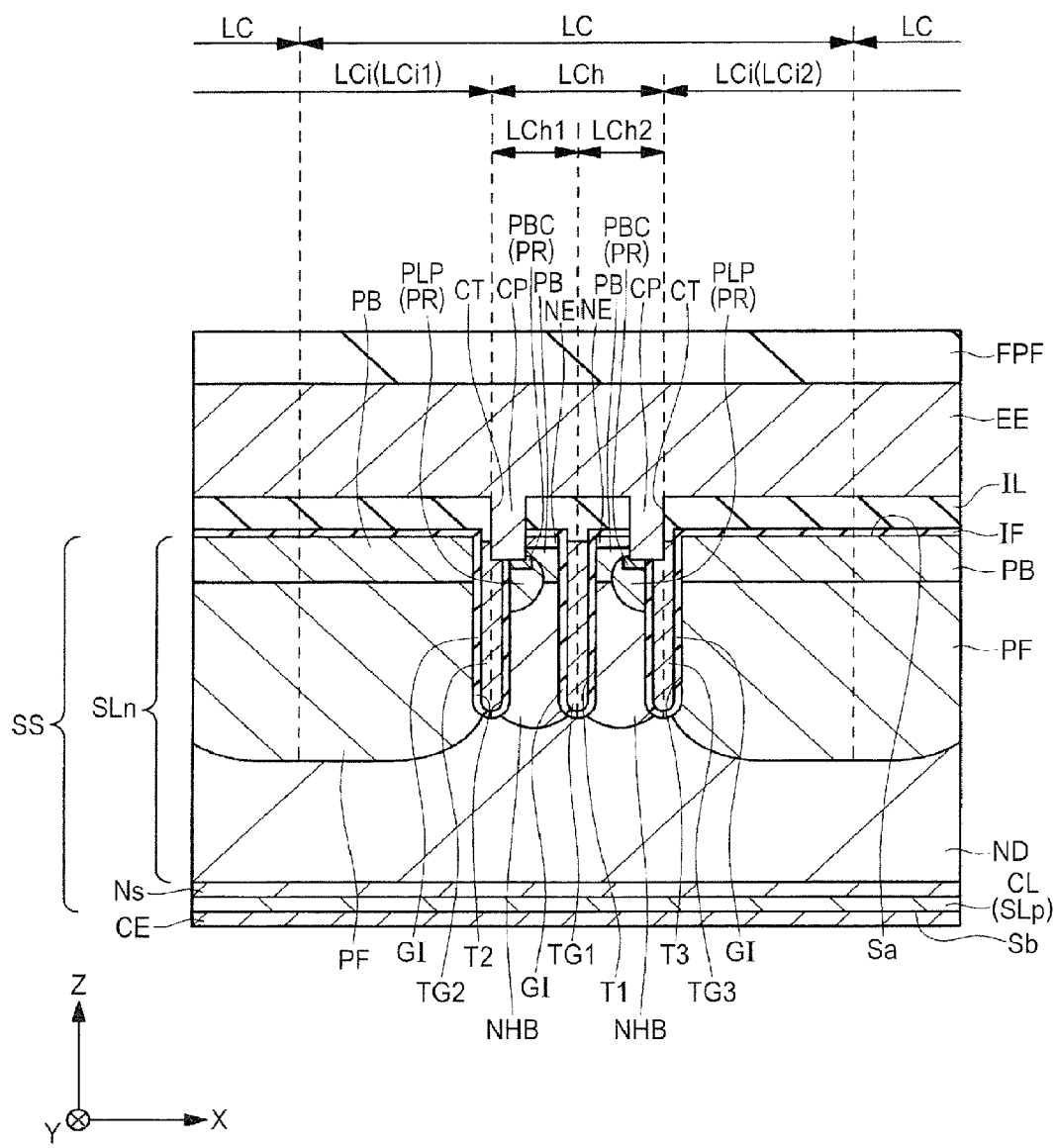
FIG. 66 is a main-portion cross-sectional view of the semiconductor device in Embodiment 3.

FIG. 65 is a main-portion plan view of the semiconductor device in Embodiment 3. FIG. 66 is a cross-sectional view along the line A-A in FIG. 65. Note that the cross-sectional view along the line B-B in FIG. 65 is the same as the cross-sectional view shown in FIG. 66 except that the n$^+$-type emitter regions NE are not provided.

In the semiconductor device in Embodiment 3, in the same manner as in the semiconductor device in Comparative Example 2, the plurality of n'-type emitter regions NE are formed in each of the hybrid sub-cell regions LCh1 and LCh2.

Also, in Embodiment 3, in the same manner as in Comparative Example 2, in the hybrid sub-cell region LCh1, the p$^+$-type semiconductor regions PR are formed continuously along the Y-axis direction as the extending direction of each of the trenches T1, T2, and T3. Also, in the hybrid sub-cell region LCh1, in the p-type body region PB, the contact trenches CT as openings are formed continuously along the Y-axis direction. The contact trenches CT reach the p$^+$-type body contact region PBC placed in the hybrid sub-cell region LCh1.

Also, in Embodiment 3, in the same manner as in Comparative Example 2, the p$^+$-type semiconductor regions PR are formed continuously along the Y-axis direction in the hybrid sub-cell region LCh2. Also, in the hybrid sub-cell region LCH2, in the p-type body region PB, the contact trenches CT as the openings are formed continuously along the Y-axis direction. The contact trenches CT reach the p$^+$-type body contact region PBC placed in the hybrid sub-cell region LCh2.

On the other hand, in the semiconductor device in Embodiment 3, unlike in the semiconductor device in Comparative Example 2, the contact trench CT overlaps the trench T2 in plan view in the hybrid sub-cell region LCh1 and the contact trench CT overlaps the trench T3 in plan view in the hybrid sub-cell region LCh2.

Alternatively, in the hybrid sub-cell region LCh2, the type semiconductor region PR may also be in contact with the gate insulating film GI formed over the inner wall of the trench T2 and, in the hybrid sub-cell region LCh2, the p$^+$-type semiconductor region PR may also be in contact with the gate insulating film GI formed over the inner wall of the trench T3.

<Method of Manufacturing Semiconductor Device>

A method of manufacturing the semiconductor device in Embodiment 3 is the same as the method of manufacturing the semiconductor device in Embodiment 1 described using FIGS. 7 to 24 except that the coupling electrode CP overlaps the trench gate electrodes TG2 and TG3 in plan view.

That is, in the manufacturing process of the semiconductor device in Embodiment 3, the contact trench CT is formed in the hybrid sub-cell region LCh1 so as to overlap the trench T2 in plan view, while the contact trench CT is formed in the hybrid sub-cell region LCh2 so as to overlap the trench T3 in plan view.

Note that, in the manufacturing process of the semiconductor device in Embodiment 3, unlike in Embodiment 1, in each of the hybrid sub-cell regions LCh1 and LCh2, the contact trenches CT are formed continuously along the Y-axis direction (see FIG. 65) in plan view and the p$^+$-type semiconductor regions PR are formed continuously along the Y-axis direction in plan view.

<About Problem of Semiconductor Device in Comparative Example 2>

To improve the performance of an IGBT, it is desirable to reduce the ON voltage and reduce the switching loss and, to reduce the ON voltage and reduce the switching loss, it is desirable to enhance the IE effect.

That is, in the semiconductor device (semiconductor device in Comparative Example 2) including the IGBT having the EGE-type active cell region, it is desirable to further improve the performance of the semiconductor device such as, e.g., the IE effect.

To enhance the IE effect in the IGBT, it is effective to enhance the efficiency of electron injection from the emitter electrode EE. Also, to enhance the efficiency of electron injection from the emitter electrode EE, it is effective to reduce a hole current.

Here, in the portion between the trenches T1 and T2 which extends from the bottom portions of the trenches T1 and T2 to the p-type body region PB, the hole current is dominated by a diffusion current. Also, in the semiconductor device in Comparative Example 2, the portion of the semiconductor layer SLn which is located between the trench T1 and T2 has a width in the Y-axis direction that is wider than in the semiconductor device in Embodiment 3. Accordingly, in the semiconductor device in Comparative Example 2, it may be possible that a hole discharge resistance is lower, holes are less likely to be stored in the portion of the n-type drift region NE which is closer to the emitter electrode EE, the efficiency of electron injection from the emitter electrode EE is lower, and the IE effect is lower than in the semiconductor device in Embodiment 3. Note that what applies to the portion between the trenches T1 and T2 similarly applies to the portion between the trenches T1 and T3.

<Main Characteristic Feature and Effect of Embodiment 3>

On the other hand, in the semiconductor device in Embodiment 3, the coupling electrode CP provided in the hybrid sub-cell region LCh1 overlaps the trench gate electrode TG2 and the coupling electrode CP provided in the hybrid sub-cell region LCh2 overlaps the trench gate electrode TG3.

In the semiconductor device in Embodiment 3, the widths of the portions of the semiconductor layer SLn which are located between the trenches T1 and T2 and between the trenches T1 and T3 are smaller. Accordingly, in the semiconductor device in Embodiment 3, the hole discharge resistance is higher, holes are more likely to be stored in the portion of the n$^-$-type drift region ND which is closer to the emitter electrode EE, the efficiency of electron injection from the emitter electrode EE is higher, and the IE effect is higher than in the semiconductor device in Comparative Example 2. Therefore, the performance of the semiconductor device in Embodiment 3 can be improved to be higher than in the semiconductor device in Comparative Example 2.

<Modification of Semiconductor Device in Embodiment 3>

Each of the IGBT chips included in the semiconductor device in Embodiment 3 is a semiconductor device as an IGBT chip having an EGE-type active cell region. In the hybrid cell region LCh as each the active cell regions, the $p^+$-type semiconductor regions PR are formed continuously along the Y-axis direction as the extending direction of each of the trenches T1, T2, and T3.

Since it is sufficient for each of the IGBT chips included in the semiconductor device in Embodiment 3 to be a semiconductor device as the IGBT chip having the EGE-type active cell region, in each of the hybrid cell regions LCh as the active cell region, the plurality of $p^+$-type semiconductor regions PR may also be arranged in the Y-axis direction to be spaced apart from each other. Such an example will be described as a modification of the semiconductor device in Embodiment 3.

Figure 67:
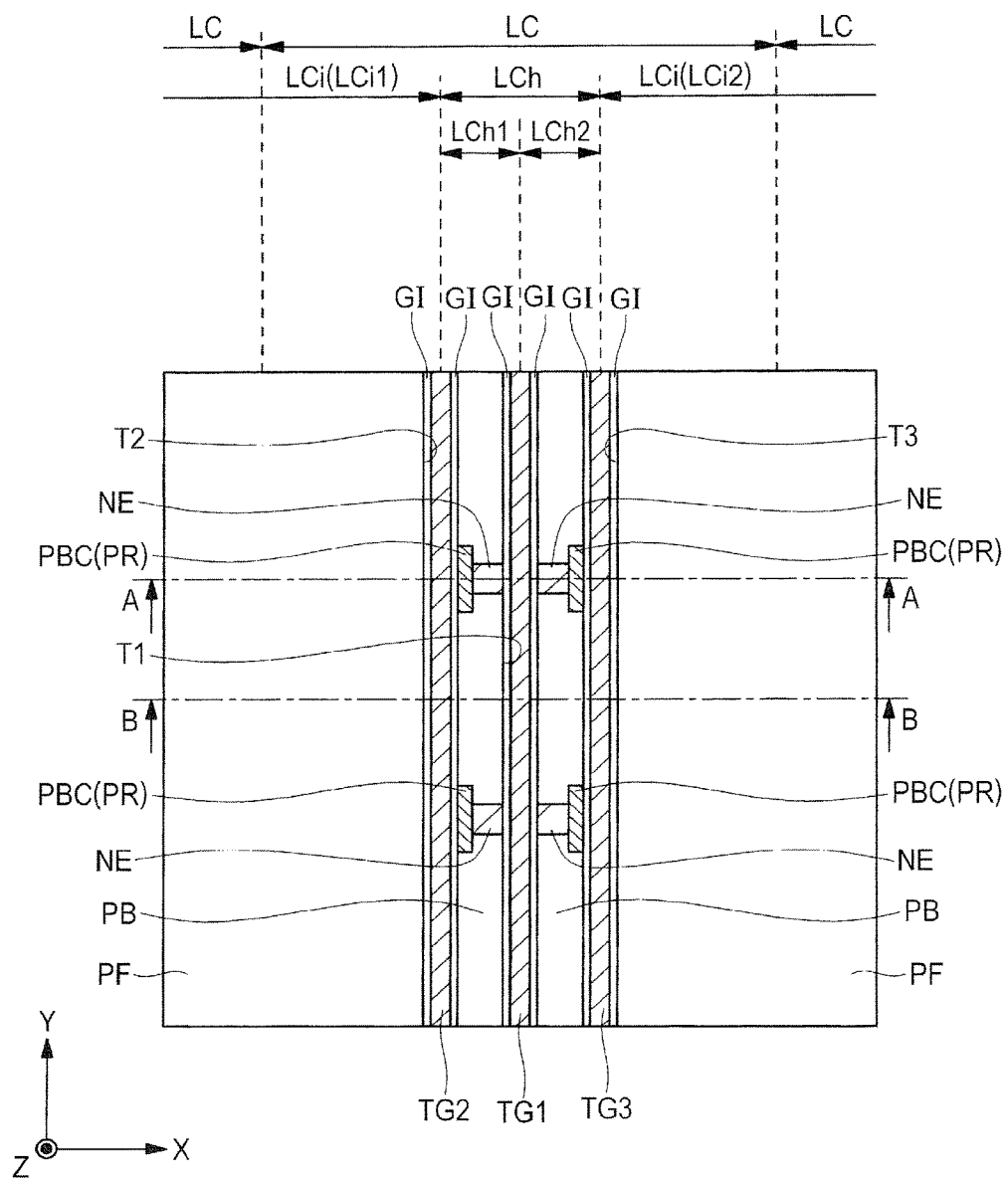
FIG. 67 is a main-portion plan view of a semiconductor device in a modification of Embodiment 3.
Figure 68:
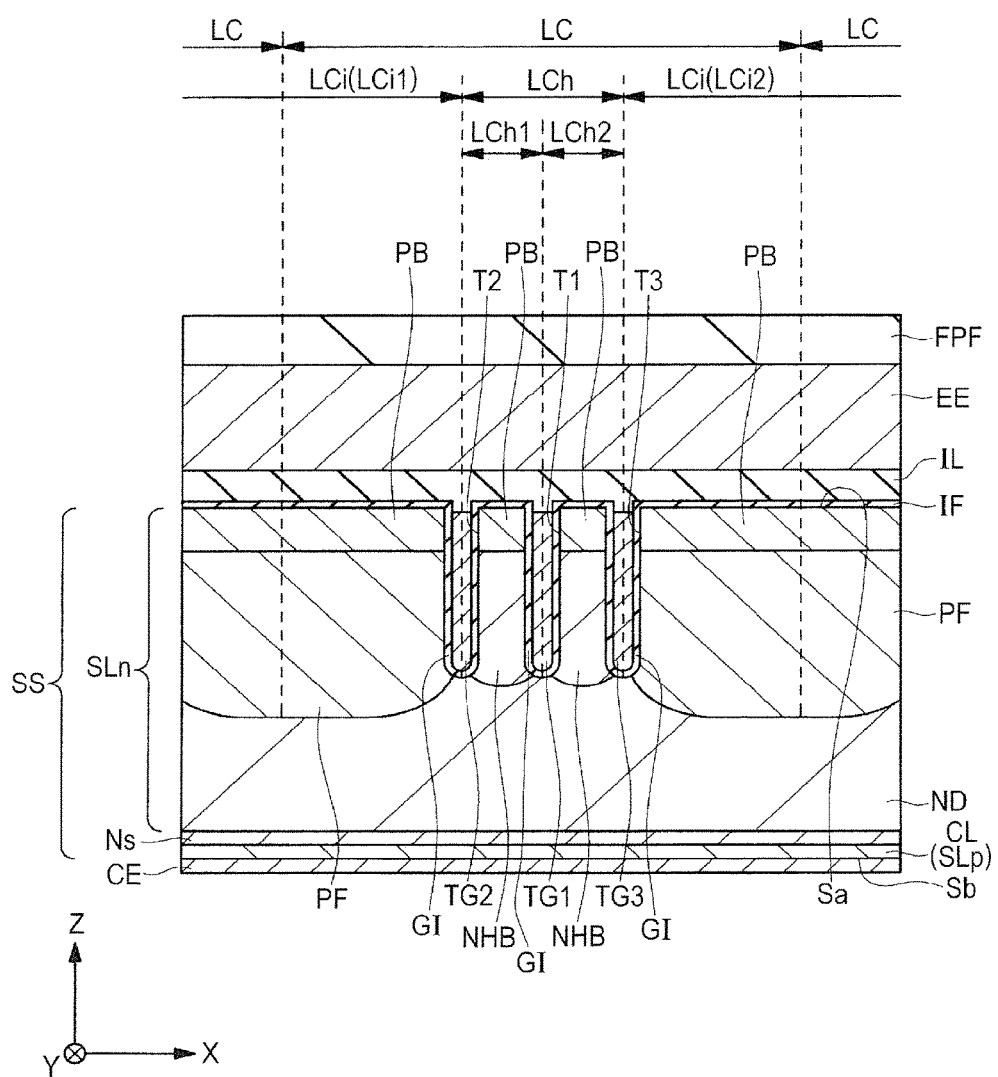
FIG. 68 is a main-portion cross-sectional view of the semiconductor device in the modification of Embodiment 3.

FIG. 67 is a main-portion plan view of the semiconductor device in the modification of Embodiment 3. FIG. 68 is a main-portion cross-sectional view of the semiconductor device in the modification of Embodiment 3. FIG. 68 is a cross-sectional view along the line B-B in FIG. 67. Note that the cross-sectional view along the line A-A in FIG. 67 is the same as the cross-sectional view shown in FIG. 66.

In each of the IGBT chips included in the semiconductor device in the present modification, in the same manner as in each of the IGBT chips as the semiconductor device in Embodiment 1, the plurality of $p^+$-type semiconductor regions PR are arranged in the Y-axis direction to be spaced apart from each other. Also, in the present modification, in the same manner as in Embodiment 1, in each of the hybrid sub-cell regions LCh1 and LCh2, the plurality of $n^+$-type emitter regions NE are placed at the same positions as those of the $p^+$-type semiconductor regions PR in the Y-axis direction.

Accordingly, in the present modification, in the hybrid sub-cell region LCh1, each of the plurality of contact trenches CT overlaps the trench T2 in plan view and, in the hybrid sub-cell region LCh2, each of the plurality of contact trenches CT overlaps the trench T3 in plan view.

Alternatively, in the hybrid sub-cell region LCh1, each of the plurality of $p^+$-type semiconductor regions PR may also be in contact with the gate insulating film GI formed over the inner wall of the trench T2 and, in the hybrid sub-cell region LCh2, each of the plurality of pt-type semiconductor regions PR may be in contact with the gate insulating film GI formed over the inner wall of the trench T3.

Accordingly, the semiconductor device in the present modification has the same effect as the effect exerted by the semiconductor device in Embodiment 1 on the semiconductor device in Comparative Example 2. In the semiconductor device in the present modification, the ON voltage can be reduced to be lower than in the semiconductor device in Embodiment 3 and the switching loss when the semiconductor device in the present modification is turned ON by L-load switching can be reduced to be smaller than that in the semiconductor device in Embodiment 3.

Embodiment 4

In Embodiment 4, a description will be given of an example in which a semiconductor device includes an IGBT having an EE-type (emitter-emitter-type) inactive cell region (non-active cell region) in addition to an EGE-type active cell region. Note that the possession of the EE-type inactive cell region by the IGBT means that each of two trench gate electrodes arranged in the inactive cell region to be spaced apart from each other is electrically coupled to the emitter electrode.

In the semiconductor device in Embodiment 4, the EGE-type active cell region of the IGBT included in the semiconductor chip CHP (see FIG. 1) may also be the same as the EGE-type active cell region of the IGBT included in the semiconductor device in Comparative Example 2 described using FIGS. 26 to 28. Accordingly, the following will describe the case where the EGE-type active cell region of the IGBT included in the semiconductor chip CHP is the same as the EGE-type active cell region of the IGBT included in the semiconductor device in Comparative Example 2.

Figure 69:
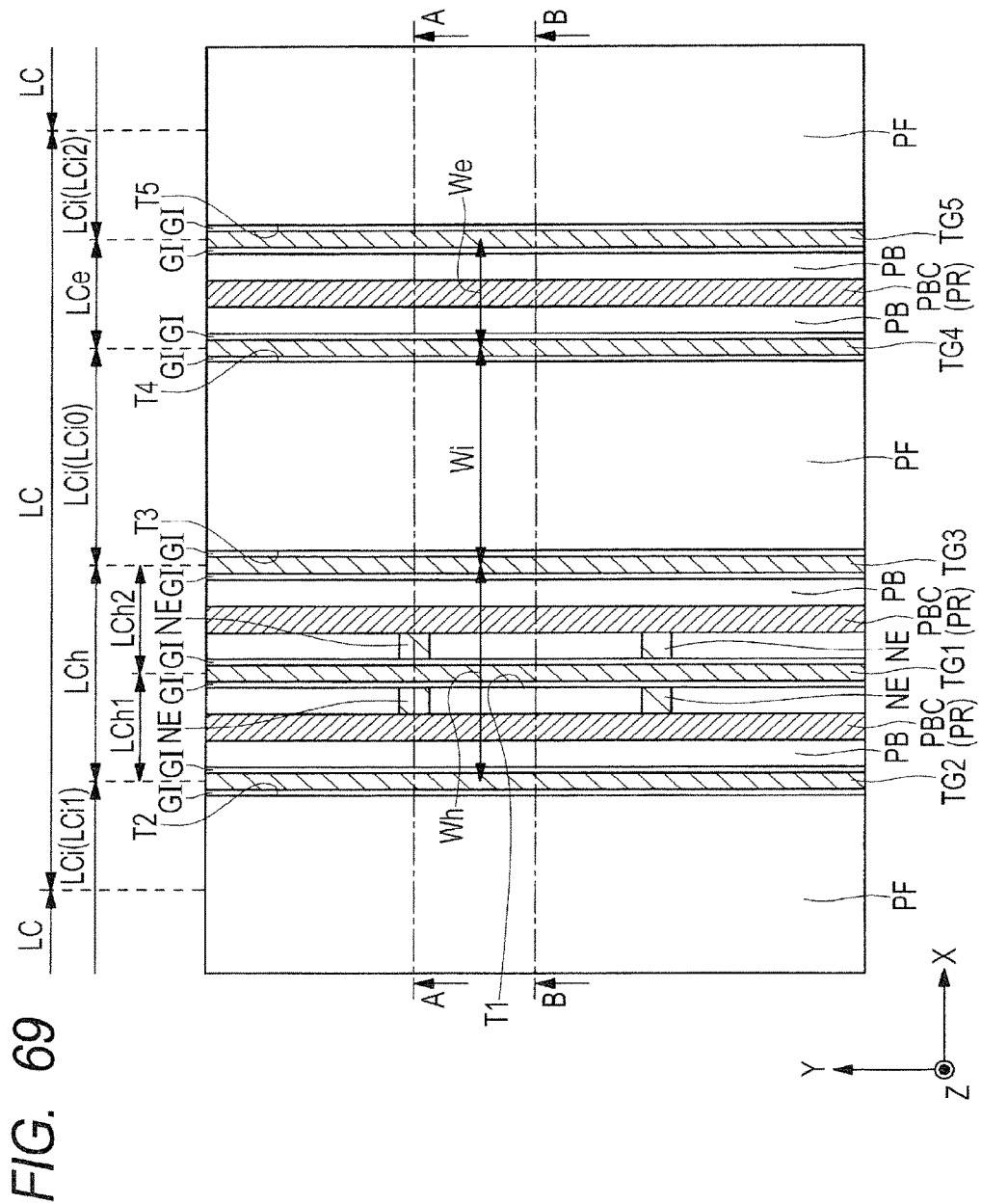
FIG. 69 is a main-portion plan view of a semiconductor device in Embodiment 4.
Figure 70:
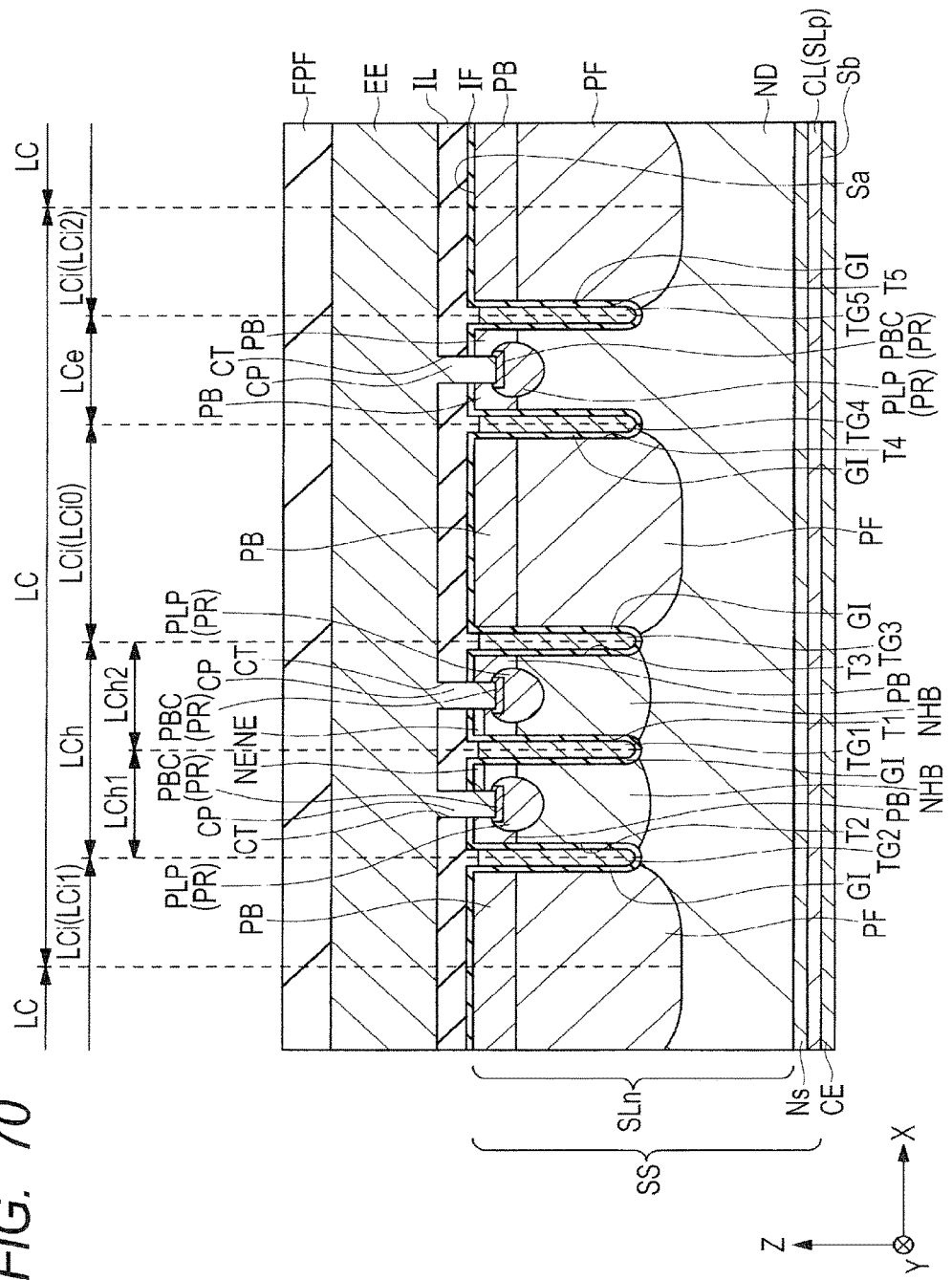
FIG. 70 is a main-portion cross-sectional view of the semiconductor device in Embodiment 4.

FIG. 69 is a main-portion plan view of the semiconductor device in Embodiment 4. FIG. 70 is a main-portion cross-sectional view of the semiconductor device in Embodiment 4. FIG. 70 is a cross-sectional view along the line A-A in FIG. 69. Note that a cross-sectional view along the line B-B in FIG. 69 is the same as the cross-sectional view shown in FIG. 70 except that the $n^+$-type emitter regions NE are not provided.

In the semiconductor device in Embodiment 4, in the same manner as in the semiconductor device in Comparative Example 2, each of the unit cell regions LC has the hybrid cell region LCh as the active cell region and the two inactive cell regions LCi. Also, in the semiconductor device in Embodiment 4, in the same manner as in the semiconductor device in Comparative Example 2, in each of the hybrid sub-cell regions LCh1 and LCh2, the plurality of $n^+$-type emitter regions NE are formed.

In Embodiment 4, in the same manner as in Comparative Example 2, in the hybrid sub-cell region LCh1, the $p^+$-type semiconductor regions PR are formed continuously along the Y-axis direction as the extending direction of each of the trenches T1, T2, and T3. Also, in the hybrid sub-cell region LCh1, in the p-type body region PB, the contact trenches CT as an opening are formed continuously along the Y-axis direction. The contact trenches CT reach the $p^+$-type body contact region PBC located in the hybrid sub-cell region LCh1.

Also, in Embodiment 4, in the same manner as in Comparative Example 2, in the hybrid sub-cell region LCh2, the $p^+$-type semiconductor regions PR are formed continuously along the Y-axis direction. Also, in the hybrid sub-cell region LCh2, in the p-type body region PB, the contact trenches CT as the openings are formed continuously along the Y-axis direction. The contact trenches CT reach the $p^+$-type body contact region PBC located in the hybrid sub-cell region LCh2.

On the other hand, in Embodiment 4, unlike in Comparative Example 2, each of the unit cell regions LC further has an inactive cell region LCe as the EE-type inactive cell region and the third inactive cell region LCi. The inactive cell region LCe is located opposite to the hybrid cell region LCh in the X-axis direction relative to the inactive cell region LCi interposed therebetween. The third inactive cell region LCi is located opposite to the other inactive cell regions LCi in the X-axis direction relative to the inactive cell region LCe interposed therebetween.

Each of the inactive cell region LCe and the third inactive cell region LCi extends in the Y-axis direction in plan view. The inactive cell region LCe has a width We smaller than the width Wh of the hybrid cell region LCh. Preferably, the width We of the inactive cell region LCe is smaller than the width Wi of the inactive cell region LCi.

The two unit cell regions LC adjacent to each other in the X-axis direction share the one inactive cell region LCi. Accordingly, each of the unit cell regions LC has the positive half portion LCi1 of the inactive cell region LCi located on the negative side of the hybrid cell region LCh in the X-axis direction to be adjacent thereto. The unit cell region LC also has the negative half portion LCi2 of the inactive cell region LCi (the third inactive cell region LCi) located on the positive side of the inactive cell region LCe in the X-axis direction to be adjacent thereto.

The inactive cell region LCi located between the inactive cell regions LCe and LCh is referred to as an inactive cell region LCi0. The p-type floating region PF in the inactive cell region LCi0 is formed in the portion of the semiconductor layer SLn which is located between the trenches T3 and T4.

The inactive cell region LCe has trench gate electrodes TG4 and TG5. The trench gate electrode TG4 is located between the inactive cell regions LCe and LCi0. The trench gate electrode TG5 is located between the inactive cell region LCe and the portion LCi2 of the inactive cell region LCi. The trench gate electrodes TG4 and TG5 are electrically coupled to the emitter electrode EE.

In the inactive cell region LCe, unlike in the hybrid cell region LCH, the $n^+$-type emitter regions NE are not formed.

In the third inactive cell region LCi, the p-type floating region PF is provided in the same manner as in another of the inactive cell regions LCi. The p-type floating region PF provided in the third inactive cell region LCi is formed in the portion of the semiconductor layer SLn which is located opposite to the trench T4 relative to the trench T5 interposed therebetween. Preferably, the p-type floating region PF provided in the third inactive cell region LCi is in contact with the gate insulating film GI formed over the inner wall of the trench T5.

The end portion of the lower surface Sb of the p-type floating region PF provided in the third inactive cell region LCi which is closer to the lower surface Sb is located closer to the lower surface Sb than the respective end portions of the trenches T4 and T4 respectively formed with the trench gate electrodes TG4 and TG5 which are closer to the lower surface Sb. In such a case, even when the width Wi of the inactive cell region LCi in the X-axis direction is larger than the width We of the inactive cell region LCe in the X-axis direction, a sufficient breakdown voltage can be ensured.

Note that, in the example shown in FIGS. 69 and 70, the width We of the inactive cell region LCe in the X-axis direction is set smaller than the width Wi of the inactive cell region LCi in the X-axis direction. In such a case, the IE effect can be enhanced.

Next, a description will be given of a configuration of each of the unit cell regions LC in the semiconductor chip as the semiconductor device in Embodiment 4.

The trench T4 is located opposite to the trench T1 relative to the trench T3 interposed therebetween to extend in the Y-axis direction in plan view from the upper surface Sa of the semiconductor substrate SS and reach a middle point in the semiconductor layer SLn. Over the inner wall of the trench T4, the gate insulating film GI is formed. In the trench T4, the trench gate electrode TG4 is formed over the gate insulating film GI so as to be embedded in the trench T4. The trench gate electrode TG4 is electrically coupled to the emitter electrode EE.

The trench T5 is located opposite to the trench T3 relative to the trench T4 interposed therebetween to extend in the Y-axis direction in plan view from the upper surface Sa of the semiconductor substrate SS and reach a middle point in the semiconductor layer SLn. Over the inner wall of the trench T5, the gate insulating film GI is formed. In the trench T5, the trench gate electrode TG5 is formed over the gate insulating film GI so as to be embedded in the trench T5. The trench gate electrode TG5 is electrically coupled to the emitter electrode EE.

In the inactive cell region LCe, the p-type body region PB is formed in the portion of the semiconductor layer SLn which is located between the trenches T4 and T5 to be in contact with the gate insulating film GI formed over the inner wall of the trench T4 and with the gate insulating film GI formed over the inner wall of the trench T5.

In the inactive cell region LCe, the $p^+$-type semiconductor region PR including the $p^+$-type body contact region PBC and the $p^+$-type latch-up preventing region PLP is formed in the portion of the semiconductor layer SLn which is located between the trenches T4 and T5 to be in contact with the p-type body region PB. The $p^+$-type semiconductor region PR is electrically coupled to the emitter region EE. In the inactive cell region LCe, the p-type impurity concentration in the $p^+$-type semiconductor region PR is higher than the p-type impurity concentration in the p-type body region PB.

The interlayer insulating film IL is formed in the inactive cell region LCe so as to cover the p-type body region PB. In the inactive cell region LCe, in the interlayer insulating film IL and the semiconductor layer SLn, the contact trenches CT as openings are formed to extend through the interlayer insulating film IL and reach a middle point in the semiconductor layer SLn. In the inactive cell region LCe, the contact trenches CT extend in the Y-axis direction in plan view. In the inactive cell region LCe, the $p^+$-type semiconductor region PR is formed in the portion of the p-type body region PB which is exposed in each of the contact trenches CT. In the inactive cell region LCe, the coupling electrodes CP embedded in the contact trenches CT are formed. In the inactive cell region LCe, each of the coupling electrodes CP is in contact with the $p^+$-type semiconductor region PR. Consequently, the $p^-$-type semiconductor region PR formed in the inactive cell region LCe is electrically coupled to the emitter electrode EE via the coupling electrode CP.

Note that, as described above, in the inactive cell region LCe, the $n^+$-type emitter regions NE are not formed. Accordingly, the inactive cell region LCe does not operate as the IGBT.

In Embodiment 4, in the inactive cell region LCe, the n-type hole barrier region NHB as the n-type semiconductor region is not formed under the p-type body region PB.

<Method of Manufacturing Semiconductor Device>

A method of manufacturing the semiconductor device in Embodiment 4 is the same as the method of manufacturing the semiconductor device in Embodiment 1 described using FIGS. 7 to 24 in that, in addition to the hybrid cell region LCh, the inactive cell region LCe is formed. Also, the step of forming the inactive cell region LCe can be the same as the step of forming the hybrid sub-cell region LCh1 except that the trenches T4 and T5 are formed similarly to the trenches T2 and T1 and the n-type hole barrier regions NHB and the $n^+$-type emitter regions NE are not formed.

Note that, in the manufacturing process of the semiconductor device in Embodiment 4, unlike in Embodiment 1, the contact trench CT is formed continuously along the Y-axis direction (see FIG. 69) in plan view in each of the hybrid sub-cell regions LCh1 and LCh2 and the $p^+$-type semiconductor region PR is formed continuously along the Y-axis direction in plan view.

<Problem of Semiconductor Device in Comparative Example 2>

To enhance the performance of an IGBT, it is desirable that the holes as carriers stored in the n⁻-type drift region ND in the hybrid cell region LCh when the IGBT is in the ON state are efficiently discharged when the semiconductor device is turned OFF by L-load switching.

That is, in the semiconductor device including the IGBT having the EGE-type active cell region (semiconductor device in Comparative Example 2), it is desirable to further improve the performance of the semiconductor device such as, e.g., hole discharge efficiency when the semiconductor device is turned OFF.

In the IGBT having the hybrid cell region LCh, to efficiently discharge holes in the hybrid cell region LCh at a turn-OFF time, it is desirable to reduce the threshold voltage Vth of a p-channel parasitic MOSFET.

However, when the n-type hole barrier regions NHB are formed in the hybrid cell region LCh in the semiconductor device in Comparative Example 2, the n-type impurity concentration in each of the n-type hole barrier regions NHB is higher than the re-type impurity concentration in the n⁺-type drift region ND. Therefore, the threshold voltage Vth of the p-channel parasitic MOSFET cannot be reduced. As a result, it is impossible to efficiently discharge the holes as carriers stored in the n⁺-type drift region ND in the hybrid cell region LCh when the IGBT is in the OFF state and is impossible to increase the speed of a turn-OFF operation.

<Main Characteristic Feature and Effect of Embodiment 4>

In the semiconductor device in Embodiment 4, the unit cell region LC includes the inactive cell region LCe in addition to the hybrid cell region LCh. In the hybrid cell region LCh, the n-type hole barrier regions NHB are formed while, in the inactive cell region LCe, the n-type hole barrier regions NHB are not formed.

Accordingly, in the semiconductor device in Embodiment 4, even when the threshold voltage Vth of the p-channel parasitic MOSFET formed in the hybrid cell region LCh is high due to the n-type hole barrier regions NHB, the threshold voltage Vth of the p-channel parasitic MOSFET in the inactive cell region LCi can be reduced. Consequently, in the inactive cell region LCe, the holes as carriers stored in the n-type drift region ND in the hybrid cell region LCh when the IGBT is in the ON state can efficiently be discharged when the IGBT is turned OFF. This can increase the speed of the turn-OFF operation.

Thus, the performance of the semiconductor device in Embodiment 4 such as, e.g., the hole discharge efficiency at a turn-OFF time can be improved to be higher than in the semiconductor device in Comparative Example 2.

Also, in the semiconductor device in Embodiment 4, in the hybrid cell region LCh, the n⁺-type emitter regions NE are formed and the parasitic bipolar transistor made of an npn bipolar transistor is formed. However, in the semiconductor device in Embodiment 4, in the inactive cell region LCe, the n⁺-type emitter regions NE are not formed and the parasitic bipolar transistor made of the npn bipolar transistor is not formed. Consequently, in the semiconductor device in Embodiment 4, in the inactive cell region LCe, a latch-up is less likely to occur. Therefore, a breakdown resistance such as the RBSOA resistance can be improved to be higher than in the semiconductor device in Comparative Example 2.

<Modification of Semiconductor Device in Embodiment 4>

The IGBT chip included in the semiconductor device in Embodiment 4 is a semiconductor device as an IGBT chip having EGE-type active cell regions. In the hybrid cell region LCh as each of the active cell regions, the p⁺-type semiconductor regions PR are formed continuously along the Y-axis direction as the extending direction of each of the trenches T1 and T2.

Since it is sufficient for the IGBT chip included in the semiconductor device in Embodiment 4 to be a semiconductor device as the IGBT chip having the EGE-type active cell regions, in the hybrid cell region LCh as each of the active cell regions, the plurality of p⁺-type semiconductor regions PR may be arranged in the Y-axis direction to be spaced apart from each other. Such an example will be described as a modification of the semiconductor device in Embodiment 4.

Figure 71:
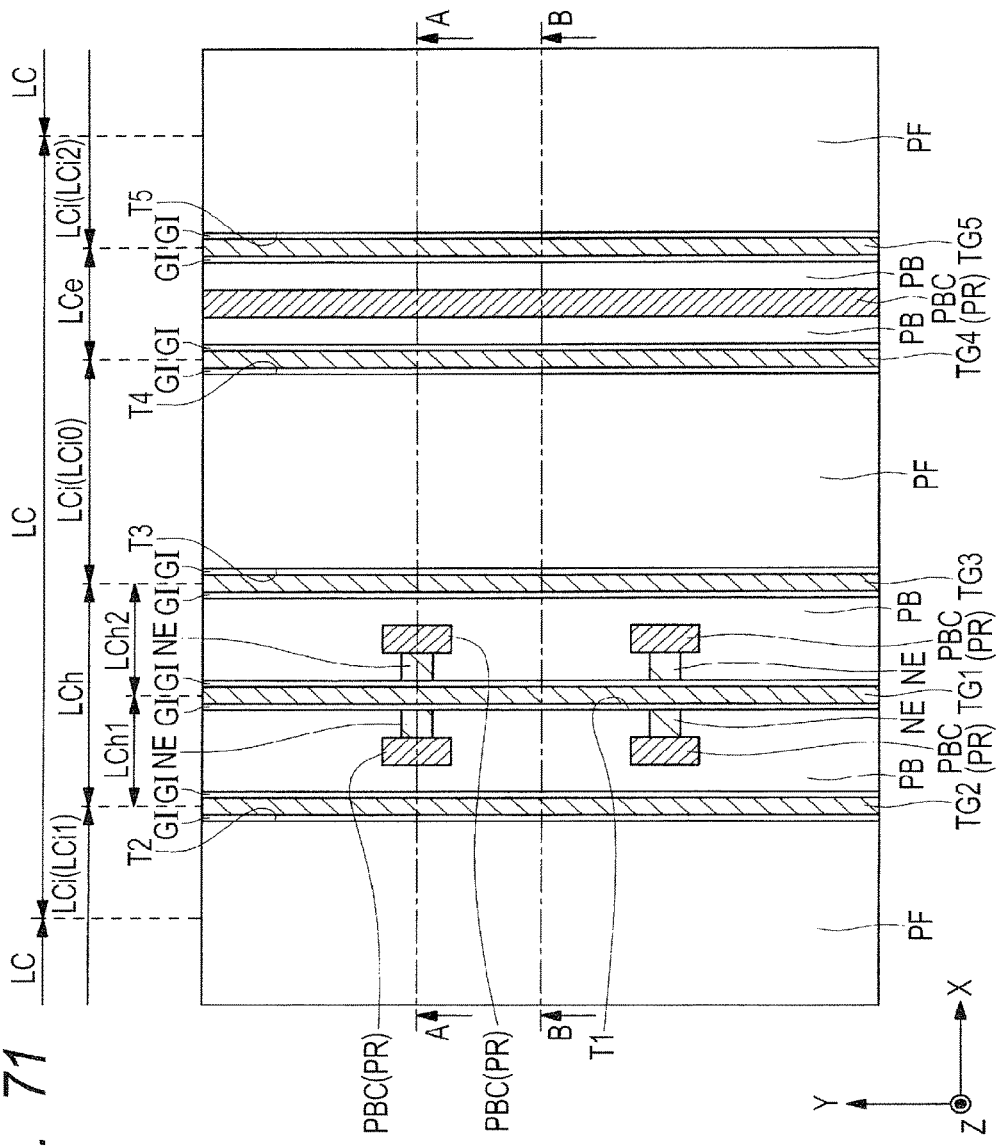
FIG. 71 is a main-portion plan view of a semiconductor device in a modification of Embodiment 4.
Figure 72:
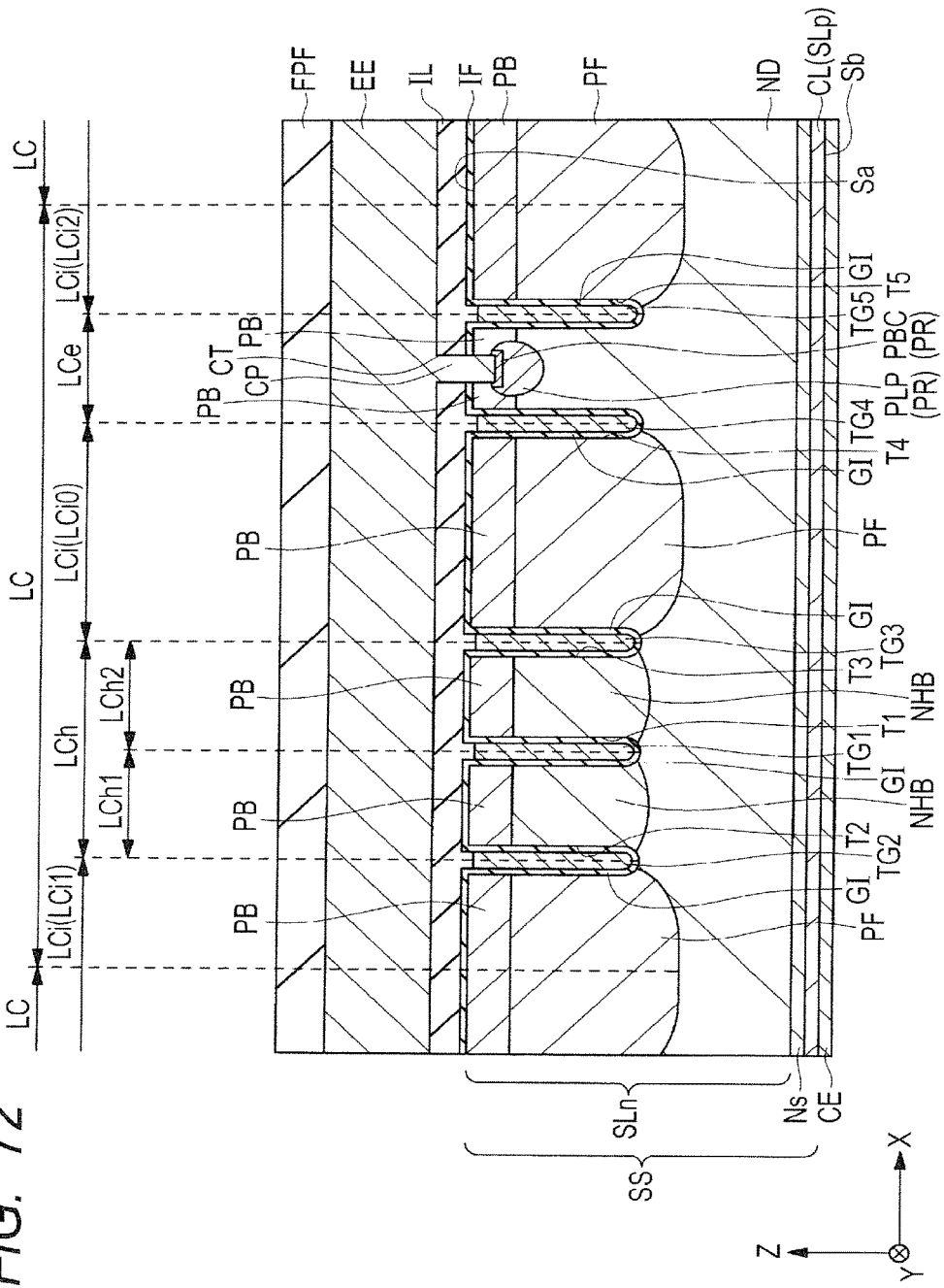
FIG. 72 is a main-portion cross-sectional view of the semiconductor device in the modification of Embodiment 4.

FIG. 71 is a main-portion plan view of the semiconductor device in the modification of Embodiment 4. FIG. 72 is a main-portion cross-sectional view of the semiconductor device in the modification of Embodiment 4. FIG. 72 is a cross-sectional view along the line B-B in FIG. 71. Note that the cross-sectional view along the line A-A in FIG. 71 is the same as the cross-sectional view shown in FIG. 70.

In the IGBT chip included in the semiconductor device in the present modification, in the same manner as in the semiconductor device in Embodiment 1, the plurality of p⁺-type semiconductor regions PS are arranged in the Y-axis direction to be spaced apart from each other. Also, in the present modification, in the same manner as in Embodiment 1, in each of the hybrid cell formation regions LCh1 and LCh2, the plurality of n⁺-type emitter regions NE are located at the same positions in the Y-axis direction as those of the p⁺-type semiconductor regions PS.

Accordingly, the semiconductor device in the present modification has the same effect as the effect exerted by the semiconductor device in Embodiment 1 on the semiconductor device in Comparative Example 2. In the semiconductor device in the present modification, the ON voltage can be reduced to be lower than in the semiconductor device in Embodiment 4 and the switching loss when the semiconductor device is turned ON by L-load switching can be reduced to be smaller than in the semiconductor device in Embodiment 4.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising:

(a) providing a semiconductor substrate having a first main surface and a second main surface opposite to the first main surface;

(b) forming a first semiconductor layer having a first conductivity type in the semiconductor substrate;

(c) forming a second semiconductor layer having a second conductivity type different from the first conductivity type in a portion of the semiconductor substrate which is located closer to the second main surface than the first semiconductor layer;

(d) forming a first trench portion, extending in a first direction in plan view, from the first main surface to reach a middle point in the first semiconductor layer, and forming a second trench portion located on a side of the first trench portion, extending in the first direction in plan view, from the first main surface to reach a middle point in the first semiconductor layer;

(e) forming a first insulating film over an inner wall of the first trench portion, and forming a second insulating film over an inner wall of the second trench portion;

(f) forming a first trench gate electrode over the first insulating film such that the first trench gate electrode is embedded in the first trench portion, and forming a second trench gate electrode over the second insulating film such that the second trench gate electrode is embedded in the second trench portion;

(g) forming a first semiconductor region having the second conductivity type in a portion of the first semiconductor layer which is located between the first and second trench portions to bring the first semiconductor region into contact with the first and second insulating films;

(h) forming a plurality of third semiconductor regions, each having the first conductivity type, in a portion of the first semiconductor layer located between the first and second trench portions such that the third semiconductor regions contact the first semiconductor region and first insulating film;

(i) forming a fourth semiconductor region having the second conductivity type in a portion of the first semiconductor layer which is located opposite to the first trench portion relative to the second trench portion interposed therebetween;

(j) forming a plurality of fifth semiconductor regions, each having the second conductivity type, in the portion of the first semiconductor layer located between the first and second trench portions such that the fifth semiconductor regions contact the first semiconductor region;

(k) forming an emitter electrode electrically coupled to the third semiconductor regions, the fifth semiconductor regions, and the second trench gate electrode;

(l) forming a collector electrode electrically coupled to the second semiconductor layer; and (m) forming a gate electrode electrically coupled to the first trench gate electrode, wherein an impurity concentration of the second conductivity type in each of the fifth semiconductor regions is higher than an impurity concentration of the second conductivity type in the first semiconductor region, and wherein the third and fifth semiconductor regions are arranged along the first direction in plan view to be spaced apart from each other.

2. The method of manufacturing the semiconductor device according to claim 1, further comprising:

(n) forming a fourth insulating film covering the first semiconductor region;

(o) forming a plurality of first openings each extending through the fourth insulating film to reach a middle point in the first semiconductor region; and (p) forming a plurality of first coupling electrodes embedded in the individual first openings, wherein, in (o), the first openings are formed to be arranged along the first direction in plan view to be spaced apart from each other, wherein, in (j), the fifth semiconductor regions are formed in respective portions of the first semiconductor region which are exposed in the individual first openings, and wherein, in (k), the emitter electrode is formed to be electrically coupled to the third semiconductor regions and the fifth semiconductor regions via the first coupling electrodes.

3. The method of manufacturing the semiconductor device according to claim 1, further comprising:

(q) forming a sixth semiconductor region having the first conductivity type in the portion of the first semiconductor layer which is located between the first and second trench portions, wherein an impurity concentration of the first conductivity type in the sixth semiconductor region is higher than an impurity concentration of the first conductivity type in a portion of the first semiconductor layer which is located closer to the second main surface than the sixth semiconductor region and lower than an impurity concentration of the first conductivity type in the third semiconductor regions.

4. A semiconductor device, comprising:

a semiconductor substrate having a first main surface and a second main surface opposite to the first main surface;

a first semiconductor layer having a first conductivity type and formed in the semiconductor substrate;

a second semiconductor layer having a second conductivity type different from the first conductivity type and formed in a portion of the semiconductor substrate which is located closer to the second main surface than the first semiconductor layer;

a first trench portion, extending in a first direction in plan view, from the first main surface to reach a middle point in the first semiconductor layer;

a second trench portion located on a side of the first trench portion, extending in the first direction in plan view, from the first main surface to reach a middle point in the first semiconductor layer;

a first insulating film formed over an inner wall of the first trench portion;

a second insulating film formed over an inner wall of the second trench portion;

a first trench gate electrode formed over the first insulating film so as to be embedded in the first trench portion;

a second trench gate electrode formed over the second insulating film so as to be embedded in the second trench portion;

a first semiconductor region having the second conductivity type and formed in a portion of the first semiconductor layer located between the first and second trench portions so as to be in contact with the first and second insulating films;

a plurality of second semiconductor regions, each having the first conductivity type, formed in a portion of the first semiconductor layer located between the first and second trench portions so as to be in contact with the first semiconductor region and first insulating film;

a third semiconductor region having the second conductivity type and formed in a portion of the first semiconductor layer located opposite to the first trench portion relative to the second trench portion interposed therebetween;

a plurality of fourth semiconductor regions, each having the second conductivity type, formed in the portion of the first semiconductor layer located between the first and second trench portions so as to be in contact with the first semiconductor region;

an emitter electrode electrically coupled to the second semiconductor regions, the fourth semiconductor regions, and the second trench gate electrode;

a collector electrode electrically coupled to the second semiconductor layer; and a gate electrode electrically coupled to the first trench gate electrode, wherein an impurity concentration of the second conductivity type in each of the fourth semiconductor regions is higher than an impurity concentration of the second conductivity type in the first semiconductor region, and wherein the second and fourth semiconductor regions are arranged along the first direction in plan view to be spaced apart from each other.

5. The semiconductor device according to claim 4, further comprising:

a fifth semiconductor region having the first conductivity type and formed in a portion of the first semiconductor layer which is located between the first and second trench portions, wherein an impurity concentration of the first conductivity type in the fifth semiconductor region is higher than an impurity concentration of the first conductivity type in a portion of the first semiconductor layer, which is located closer to the second main surface than the fifth semiconductor region, and lower than an impurity concentration of the first conductivity type in the second semiconductor regions.

6. The semiconductor device according to claim 4, further comprising:

a plurality of semiconductor chips, wherein each of the semiconductor chips includes the semiconductor substrate, the first and second semiconductor layers, the first and second trench portions, the first and second insulating films, the first and second trench gate electrodes, the first semiconductor region, the second semiconductor regions, the third semiconductor region, the fourth semiconductor regions, the emitter electrode, the collector electrode, and the gate electrode, wherein the respective emitter electrodes of the semiconductor chips are electrically coupled to each other, and wherein the respective collector electrodes of the semiconductor chips are electrically coupled to each other.

7. The semiconductor device according to claim 4, further comprising:

a fourth insulating film covering the first semiconductor region;

a plurality of first openings each extending through the fourth insulating film to reach a middle point in the first semiconductor region; and a plurality of first coupling electrodes embedded in the individual first openings, wherein the first openings are arranged along the first direction in plan view to be spaced apart from each other, wherein the fourth semiconductor regions are formed in respective portions of the first semiconductor region which are exposed in the individual first openings, wherein the emitter electrode is electrically coupled to the second semiconductor regions and the fourth semiconductor regions via the first coupling electrodes.

8. The semiconductor device according to claim 7, wherein each of the first openings overlaps the second trench portion in plan view.

9. The semiconductor device according to claim 4, wherein each of the fourth semiconductor regions is in contact with the second insulating film.

10. The semiconductor device according to claim 4, further comprising:

wherein each of the second semiconductor regions is located at a same position in the first direction as that of each of the fourth semiconductor regions.

11. The semiconductor device according to claim 4, wherein the collector electrode is formed over the second main surface of the semiconductor substrate.

* * * * *